US012306677B2

(12) United States Patent
Goh et al.

(10) Patent No.: US 12,306,677 B2
(45) Date of Patent: May 20, 2025

(54) INFORMATION HANDLING SYSTEM WITH RAPID ASSEMBLY AND DISASSEMBLY TO AID RECYCLING

(71) Applicant: Dell Products L.P., Round Rock, TX (US)

(72) Inventors: Peng Lip Goh, Singapore (SG); Weijong Sheu, Austin, TX (US); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 229 days.

(21) Appl. No.: 17/968,389

(22) Filed: Oct. 18, 2022

(65) Prior Publication Data
US 2024/0126348 A1    Apr. 18, 2024

(51) Int. Cl.
*G06F 1/16* (2006.01)
*H05K 5/03* (2006.01)

(52) U.S. Cl.
CPC .......... *G06F 1/1669* (2013.01); *G06F 1/1616* (2013.01); *H05K 5/03* (2013.01)

(58) Field of Classification Search
CPC .... G06F 1/1669; G06F 1/1616; G06F 1/1601; G06F 1/1605; G06F 1/1635; G06F 1/1637; G06F 1/1662; G06F 1/1686; G06F 1/169; G06F 3/03543; G06F 3/03547; G06F 1/1656; G06F 1/203; G06F 3/0202; H05K 5/03; H04N 23/57; H04N 23/51
See application file for complete search history.

(56) References Cited

U.S. PATENT DOCUMENTS

| | | | |
|---|---|---|---|
| 4,865,285 A | 9/1989 | Gaggianese |
| 5,268,816 A | 12/1993 | Abell, Jr. et al. |
| 5,587,878 A | 12/1996 | Tsai |
| 6,301,098 B1 | 10/2001 | Kim |
| 6,493,233 B1 | 12/2002 | De Lorenzo |

(Continued)

FOREIGN PATENT DOCUMENTS

| | | |
|---|---|---|
| JP | 2009105478 A | 5/2009 |
| KR | 20210006251 A | 1/2021 |

OTHER PUBLICATIONS

U.S. Appl. No. 17/325,503, filed May 20, 2021, entitled "Camera and Mount," by inventors Celia Law et al.

(Continued)

*Primary Examiner* — Aneeta Yodichkas
*Assistant Examiner* — Jose K Abraham
(74) *Attorney, Agent, or Firm* — Zagorin Cave LLP; Robert W. Holland

(57) ABSTRACT

An information handling system provides improved repair, reuse and recycling by assembly components into an aluminum extruded main housing having front and rear openings to accept a tray in the housing interior supporting a keyboard and touchpad exposed at an upper side and a supporting motherboard and thermal module on a bottom side. An aluminum extruded lid housing rotationally couples to the main housing with a three element magnetic device that inserts through the tray to hold the tray in position. The major components of the information handling system assemble without screws or adhesive to aid efficient repair, reuse and recycling of the information handling system and components.

13 Claims, 74 Drawing Sheets

(56) References Cited

U.S. PATENT DOCUMENTS

| | | |
|---|---|---|
| 6,498,718 B1 | 12/2002 | Kim et al. |
| 6,532,152 B1 | 3/2003 | White |
| 6,560,119 B1 | 5/2003 | Katsuyama |
| 6,644,617 B2 | 11/2003 | Pitlor |
| 6,842,652 B2 | 1/2005 | Yeung |
| 6,876,379 B1 | 4/2005 | Fisher |
| 6,922,333 B2 | 7/2005 | Weng |
| 6,929,291 B2 | 8/2005 | Chen |
| 7,002,793 B2 | 2/2006 | Imsand |
| 7,349,222 B2 | 3/2008 | Kim |
| 7,479,945 B2 | 1/2009 | Lu |
| 7,852,621 B2 | 12/2010 | Lin |
| 8,279,032 B1 | 10/2012 | Fullerton |
| 8,341,832 B2 | 1/2013 | Theobald |
| 8,514,042 B2 | 8/2013 | Lauder |
| 8,514,046 B1 | 8/2013 | Fullerton |
| 8,665,044 B2 * | 3/2014 | Lauder ............... G06F 1/1677 |
| | | 361/679.01 |
| 8,701,568 B2 | 4/2014 | Miller et al. |
| 8,902,573 B2 | 12/2014 | Mizoguchi |
| 8,971,026 B2 * | 3/2015 | Matsuoka ............ H05K 5/0217 |
| | | 361/679.09 |
| 9,086,852 B2 | 7/2015 | Johnson |
| 9,146,582 B2 | 9/2015 | Liang et al. |
| 9,244,535 B2 | 1/2016 | Bates et al. |
| 9,329,630 B2 | 5/2016 | Lauder |
| 9,354,663 B2 | 5/2016 | Lin et al. |
| 9,489,054 B1 | 11/2016 | Sumsion et al. |
| 9,502,819 B2 | 11/2016 | Szeto |
| 9,880,586 B2 | 1/2018 | Ent et al. |
| 9,891,760 B2 * | 2/2018 | Tenuta ................ G06F 3/04166 |
| 9,923,290 B2 | 3/2018 | Gao et al. |
| 10,126,783 B2 | 11/2018 | Farahani et al. |
| 10,285,288 B1 | 5/2019 | Su |
| 10,490,933 B2 | 11/2019 | Rohrbach et al. |
| 10,495,255 B2 | 12/2019 | Brashnyk et al. |
| 10,627,868 B2 | 4/2020 | Fujimoto |
| 10,652,437 B2 | 5/2020 | Becker et al. |
| 10,831,093 B1 | 11/2020 | Lablans |
| 11,016,533 B1 | 5/2021 | Takahashi et al. |
| 11,086,366 B2 | 8/2021 | Huston et al. |
| 11,246,233 B2 | 2/2022 | Venkatesh et al. |
| 11,500,419 B1 | 11/2022 | Lee et al. |
| 2002/0064036 A1 | 5/2002 | Yano |
| 2003/0076303 A1 | 4/2003 | Huppi |
| 2003/0085138 A1 | 5/2003 | DeVolpi |
| 2004/0034994 A1 | 2/2004 | Chang |
| 2004/0036389 A1 | 2/2004 | Tsai |
| 2004/0190239 A1 | 9/2004 | Weng et al. |
| 2004/0264126 A1 | 12/2004 | Wells |
| 2005/0083644 A1 * | 4/2005 | Song ................... G06F 1/1679 |
| | | 361/679.06 |
| 2005/0210722 A1 * | 9/2005 | Graef .................. G09F 9/33 |
| | | 345/82 |
| 2005/0276025 A1 | 12/2005 | Beall et al. |
| 2006/0159158 A1 | 7/2006 | Moore et al. |
| 2006/0237604 A1 | 10/2006 | Tan |
| 2006/0274042 A1 | 12/2006 | Krah et al. |
| 2007/0201194 A1 | 8/2007 | Chen |
| 2008/0012952 A1 | 1/2008 | Lee |
| 2008/0063218 A1 * | 3/2008 | Weber ................. H04R 5/00 |
| | | 381/87 |
| 2008/0084391 A1 | 4/2008 | Cheng |
| 2008/0259537 A1 | 10/2008 | Arisaka |
| 2008/0310094 A1 | 12/2008 | Burns |
| 2009/0027583 A1 | 1/2009 | McBroom |
| 2009/0268386 A1 | 10/2009 | Lin |
| 2009/0294172 A1 | 12/2009 | Nakanishi et al. |
| 2009/0303071 A1 | 12/2009 | Anderson |
| 2010/0058557 A1 | 3/2010 | Wang |
| 2010/0091442 A1 * | 4/2010 | Theobald ............ G06F 1/1658 |
| | | 361/679.55 |
| 2010/0277858 A1 | 11/2010 | Zhou |
| 2011/0012835 A1 | 1/2011 | Hotelling et al. |
| 2011/0143769 A1 | 6/2011 | Jones et al. |
| 2011/0221676 A1 | 9/2011 | Liu |
| 2011/0230178 A1 | 9/2011 | Jones et al. |
| 2011/0267757 A1 | 11/2011 | Probst et al. |
| 2012/0106059 A1 | 5/2012 | Probst et al. |
| 2012/0106060 A1 | 5/2012 | Pro9bst et al. |
| 2012/0106061 A1 | 5/2012 | Probst et al. |
| 2012/0106062 A1 | 5/2012 | Probst et al. |
| 2012/0106077 A1 * | 5/2012 | Tracy .................. G06F 1/1616 |
| | | 361/679.55 |
| 2012/0106078 A1 | 5/2012 | Probst et al. |
| 2013/0069878 A1 | 3/2013 | Li |
| 2013/0105204 A1 | 5/2013 | Hwang et al. |
| 2013/0118878 A1 | 5/2013 | Purcocks |
| 2013/0257733 A1 | 10/2013 | Moore et al. |
| 2013/0321237 A1 * | 12/2013 | Woodhull ........... H04M 1/0254 |
| | | 156/60 |
| 2013/0329450 A1 * | 12/2013 | Degner ............... G06F 1/1616 |
| | | 361/679.55 |
| 2014/0005606 A1 | 1/2014 | Cheng |
| 2014/0016257 A1 | 1/2014 | Matsuoka |
| 2014/0126140 A1 * | 5/2014 | Wang .................. G06F 1/187 |
| | | 361/679.37 |
| 2014/0184904 A1 | 7/2014 | Lam |
| 2014/0192470 A1 | 7/2014 | Ho |
| 2017/0006701 A1 | 5/2017 | Casasanta, III |
| 2017/0220490 A1 | 8/2017 | Tan et al. |
| 2017/0262019 A1 * | 9/2017 | Aurongzeb .......... G06F 1/1686 |
| 2017/0263179 A1 | 9/2017 | Aurongzeb |
| 2018/0032104 A1 | 2/2018 | Schatz et al. |
| 2018/0032203 A1 | 2/2018 | Sepulveda |
| 2018/0039306 A1 * | 2/2018 | Zadesky ............. H04M 1/0202 |
| 2018/0052491 A1 | 2/2018 | Kapinos |
| 2019/0097470 A1 | 3/2019 | Fukaya |
| 2019/0296482 A1 | 9/2019 | Bdeir |
| 2019/0354196 A1 | 11/2019 | Wang |
| 2020/0008299 A1 | 1/2020 | Tran et al. |
| 2020/0183461 A1 | 6/2020 | Huang |
| 2020/0363840 A1 * | 11/2020 | Hurst ................... G06F 1/1654 |
| 2021/0019390 A1 | 1/2021 | Hasegawa |
| 2021/0041915 A1 | 2/2021 | Moser |
| 2021/0072799 A1 | 3/2021 | Huston |
| 2021/0383028 A1 | 12/2021 | Sun |
| 2022/0147111 A1 | 5/2022 | Zou |
| 2023/0005976 A1 | 1/2023 | Takeuchi |
| 2023/0113973 A1 | 4/2023 | Anandakrishnan |
| 2024/0126337 A1 | 4/2024 | Goh |
| 2024/0126348 A1 | 4/2024 | Goh |

OTHER PUBLICATIONS

U.S. Appl. No. 17/325,501, filed May 20, 2021, entitled "Camera and Lens Cap," by inventors Celia Law et al.

U.S. Appl. No. 17/325,508, filed May 20, 2021, entitled "Cylindrical Camera Thermal Shield," by inventors Peng Lip Goh et al.

U.S. Appl. No. 17/325,518, filed May 20, 2021, entitled "Cylindrical Camera and Integrated Support," by Inventors Peng Lip Goh et al.

U.S. Appl. No. 17/325,494, filed May 20, 2021, entitled "Camera Stand with Integrated Tilt Hinge," by Inventors Peng Lip Goh et al.

U.S. Appl. No. 17/577,955, filed Jan. 18, 2022, entitled "Camera with Dock Having Automated Alignment," by inventors Jace W. Files et al.

* cited by examiner

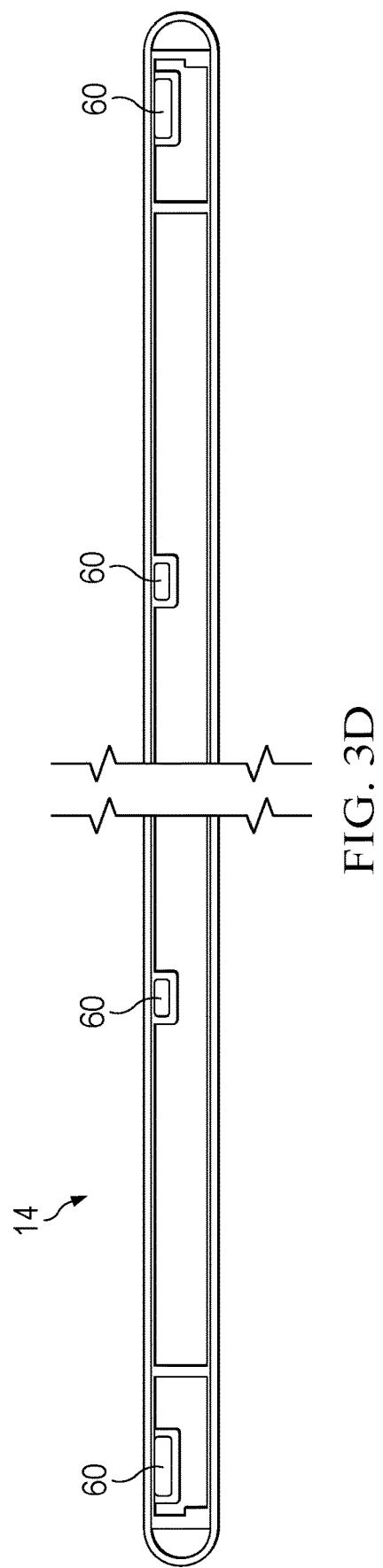

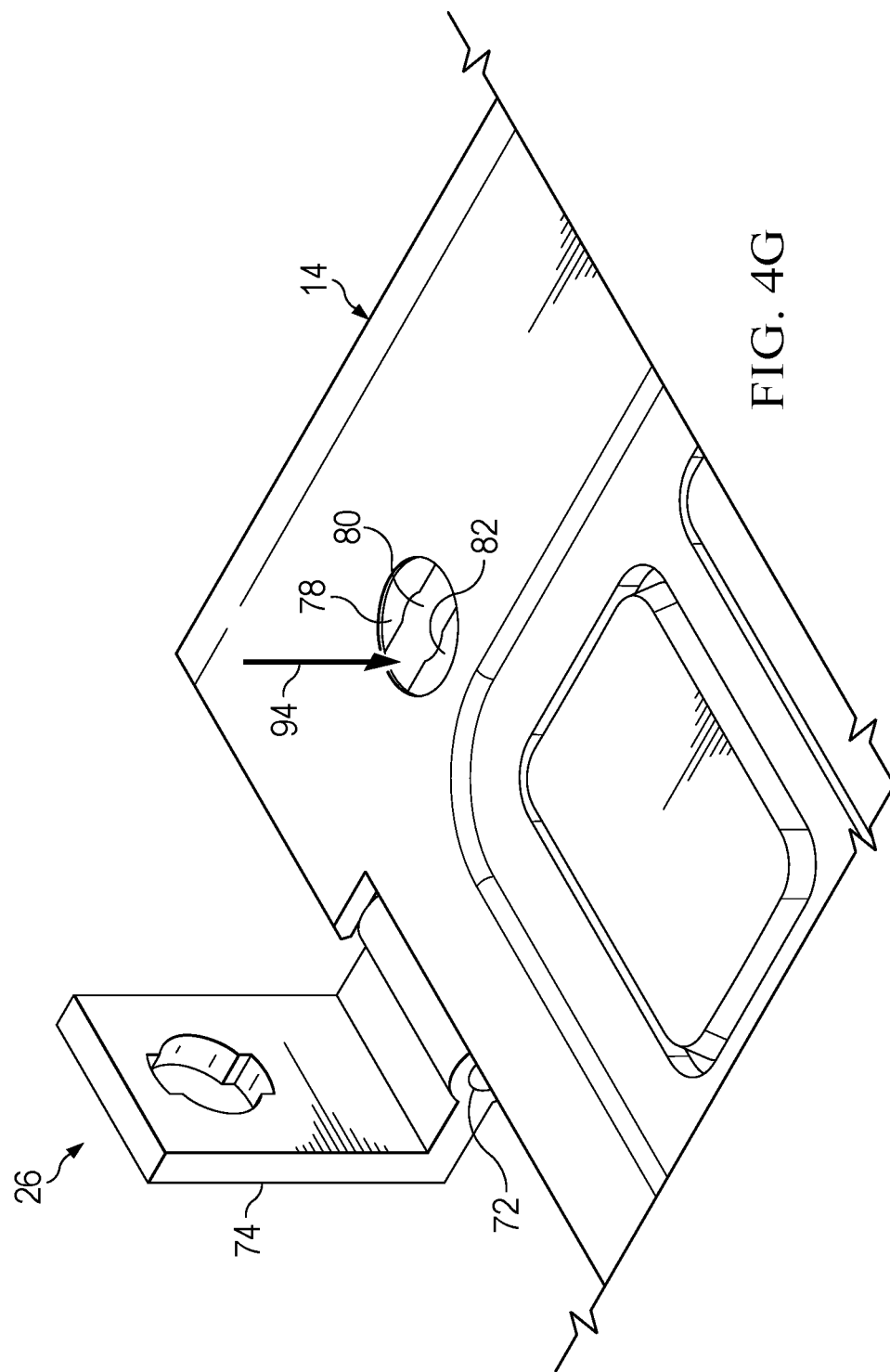

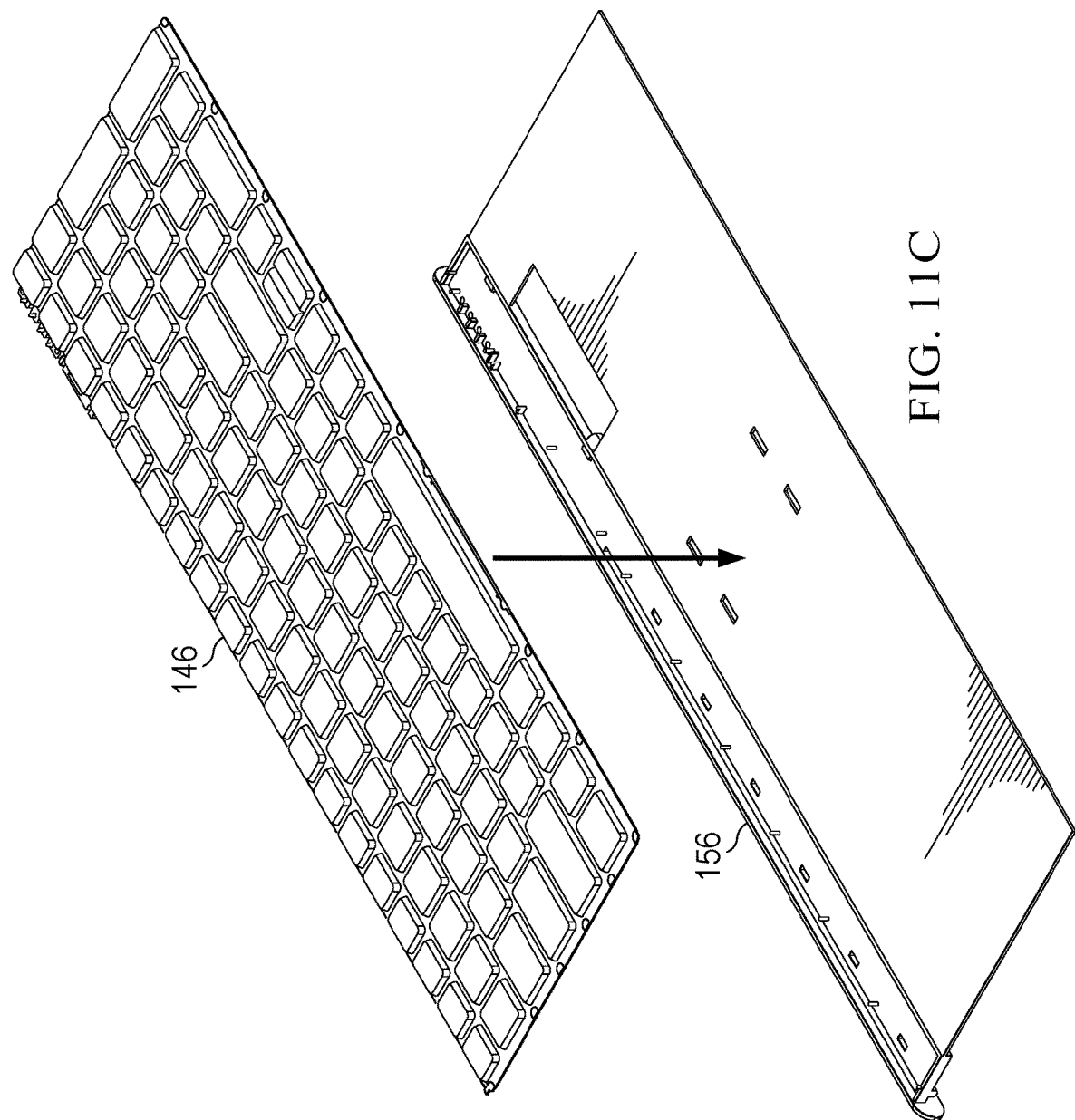

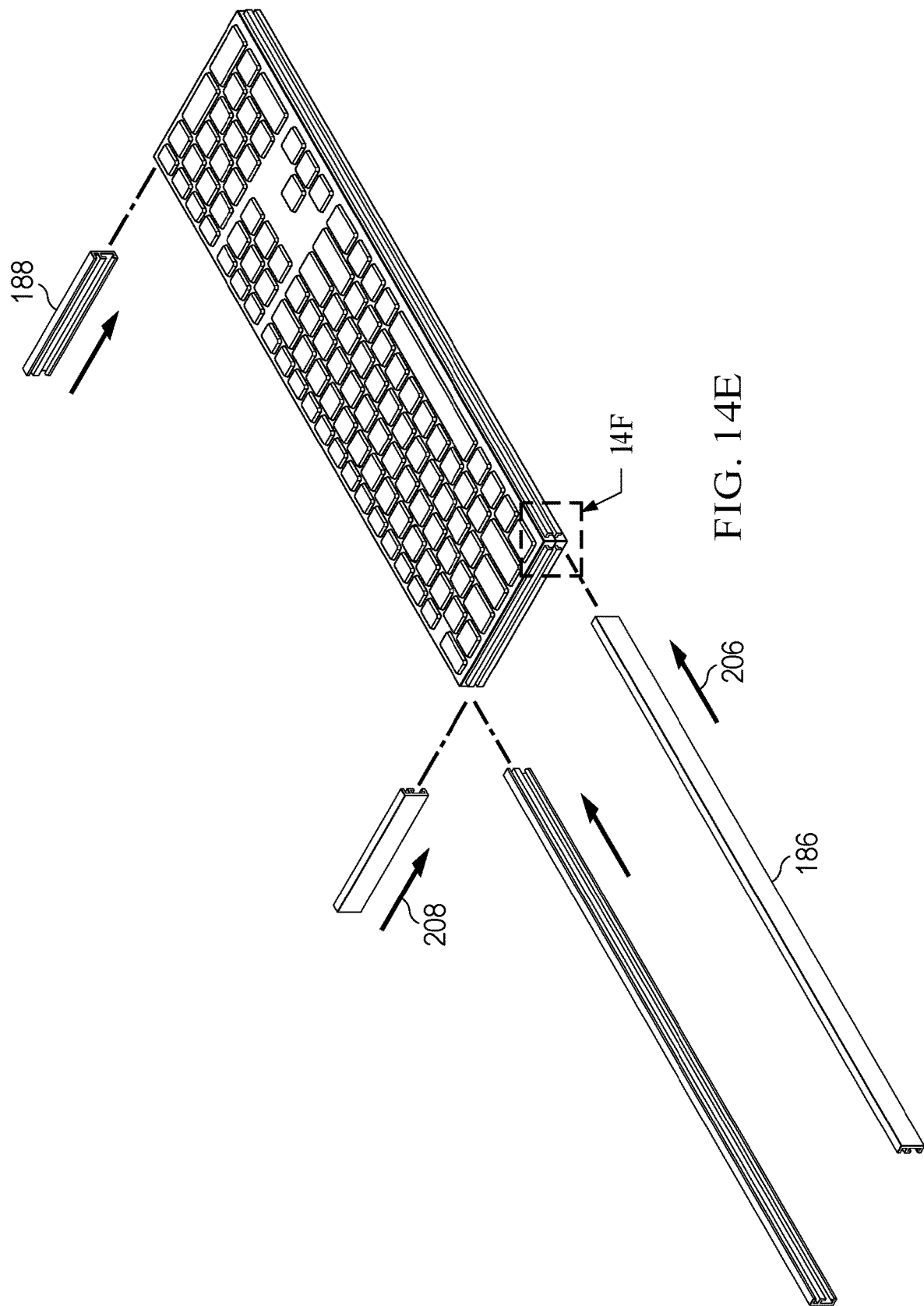

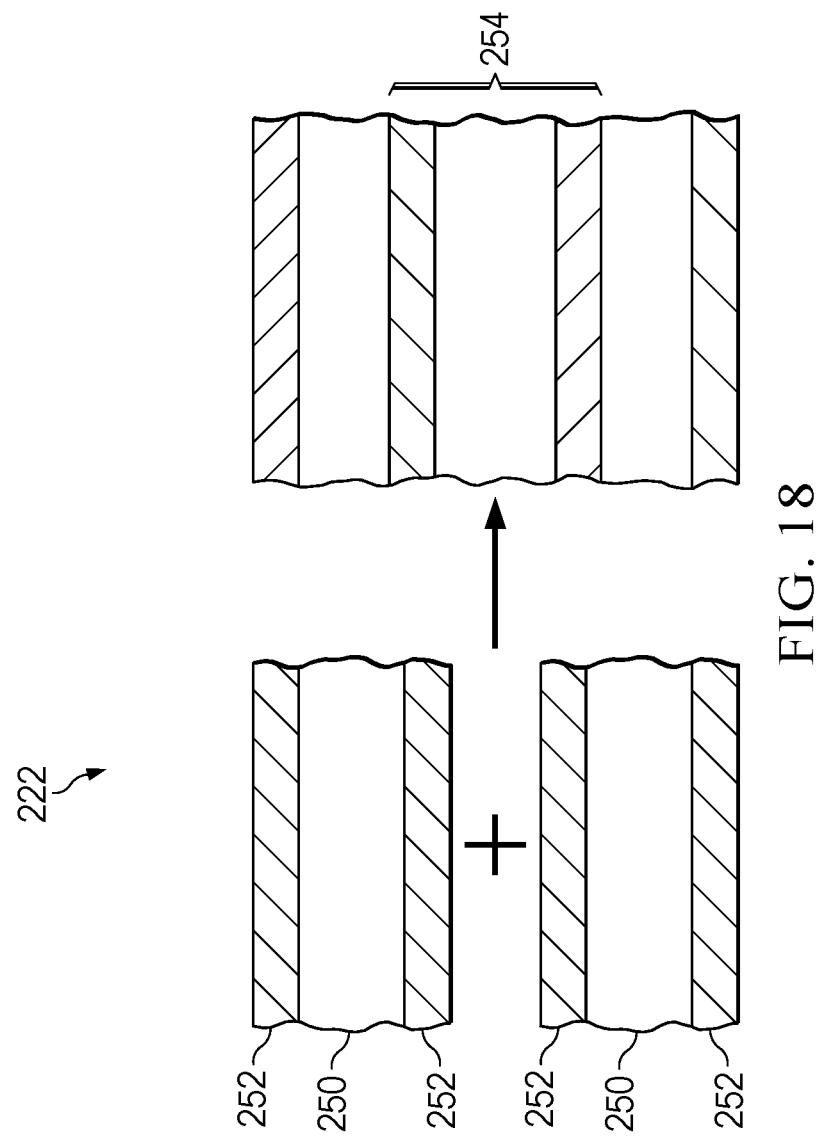

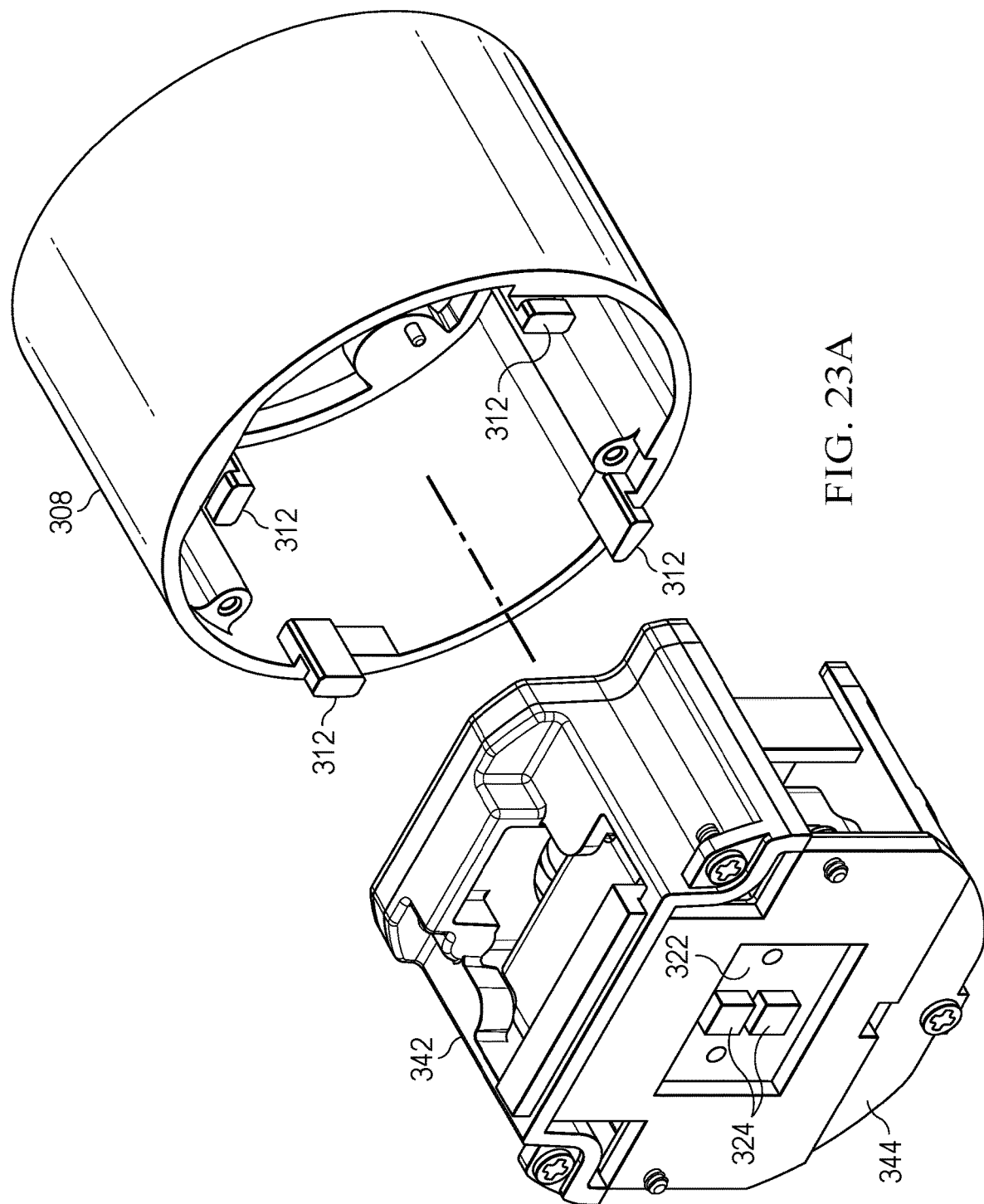

ID: 12,306,677 B2

INFORMATION HANDLING SYSTEM WITH RAPID ASSEMBLY AND DISASSEMBLY TO AID RECYCLING

CROSS REFERENCE TO RELATED APPLICATIONS

This application is related to the application entitled "Camera Sensor and Lens Housing Structure for Enhanced Manufacture Assembly and Repair," naming Peng Lip Goh and Deeder M. Aurongzeb as inventors, application Ser. No. 17/968,367, filed Oct. 18, 2022, which application is incorporated herein by reference.

This application is related to the application entitled "Information Handling System Display Rapid Panel Assembly and Repair," naming Peng Lip Goh and Deeder M. Aurongzeb as inventors, application Ser. No. 17/968,369, filed Oct. 18, 2022, which application is incorporated herein by reference.

This application is related to the application entitled "Camera Housing Structure for Enhanced Manufacture Assembly and Repair," naming Peng Lip Goh and Deeder M. Aurongzeb as inventors, application Ser. No. 17/968,373, filed Oct. 18, 2022, which application is incorporated herein by reference.

This application is related to the application entitled "Information Handling System Mouse with Rapid Assembly and Disassembly to Aid Recycling," naming Peng Lip Goh and Deeder M. Aurongzeb as inventors, filed Oct. 18, 2022, application Ser. No. 17/968,378, which application is incorporated herein by reference.

This application is related to the application entitled "Information Handling System Keyboard with Rapid Assembly and Disassembly to Aid Recycling," naming Peng Lip Goh and Deeder M. Aurongzeb as inventors, application Ser. No. 17/968,381, filed Oct. 18, 2022, which application is incorporated herein by reference.

This application is related to the application entitled "Information Handling System Keyboard with Rapid Assembly and Disassembly to Aid Recycling," naming Peng Lip Goh, Weijong Sheu, and Deeder M. Aurongzeb as inventors, application Ser. No. 17/968,384, filed Oct. 18, 2022, which application is incorporated herein by reference.

This application is related to the application entitled "Information Handling System and Peripheral Printed Circuit Board Having Non-Homogeneous Substrate Material," naming Peng Lip Goh and Deeder M. Aurongzeb as inventors, application Ser. No. 17/968,395, filed Oct. 18, 2022 which application is incorporated herein by reference.

This application is related to the application entitled "Information Handling System Coupling Device for Improved Assembly, Disassembly and Repair," naming Peng Lip Goh, Weijong Sheu, and Deeder M. Aurongzeb as inventors, application Ser. No. 17/968,428, filed Oct. 18, 2022, which application is incorporated herein by reference.

This application is related to the application entitled "Information Handling System and Peripheral Printed Circuit Board Having Non-Homogeneous Substrate Material and Integrated Thermal Solution," naming Peng Lip Goh and Deeder M. Aurongzeb as inventors, application Ser. No. 17/968,438, filed Oct. 18, 2022, which application is incorporated herein by reference.

BACKGROUND OF THE INVENTION

Field of the Invention

The present invention relates in general to the field of information handling system keyboards, and more particularly to an information handling system keyboard with rapid disassembly to aid recycling.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Generally, information handling systems process information with processing components disposed in a housing. End users interact with stationary information handling systems, such as desktop and tower configurations, through peripheral input/output (I/O) devices, such a peripheral display, peripheral keyboard, peripheral mouse and peripheral camera. Typically, stationary information handling systems ship with basic mouse and keyboard devices, although many end users often purchase other I/O devices with preferred configurations, such as varied shapes of keyboard key layouts, varied shapes of mouse outer surfaces and varied display panel image presentation dimensions. Portable information handling systems generally integrate I/O devices within a portable housing, such as display panel integrated in a portable housing lid portion that rotates relative to keyboard integrated in a portable housing main portion. Portable information handling system clamshell configurations rotate from a closed position that provides convenient storage to an open position that holds the display in the lid housing portion raised for viewing over the keyboard in the main housing portion. In addition, portable information handling systems can interface with peripheral devices to offer larger and more convenient input devices and display screen sizes.

A typical information handling system is built from a number of different components that are typically assembled with a multitude of screws and adhesives. For instance, a typical clamshell type portable information handling system has formed main housing with a number of screw sockets to which the motherboard, the cooling fan, the solid state storage device and the battery are secured. A keyboard is then coupled to a cover housing portion that fits over the main housing portion, with both the keyboard and the cover housing portion secured by screws. In some instances, if a keyboard integrated in a portable housing fails, nearly the entire housing is disassembled to replace the keyboard. Performing such a repair can involve a substantial amount of time just removing, saving, sorting and reinserting the screws that hold the housing together. A similar approach is also typically followed in the assembly of a display panel integrated in a lid housing portion. For instance, the display panel is often secured by screws and adhesives and then covered at the perimeter by a bezel or similar component.

One difficulty with conventional information handling system assembly is that the complexity of the assembled system makes repair, reuse and recycling of system components difficult and time consuming. Often, the manual labor involved in separating the components exceeds the economic benefit of repair, reuse and recycling so that the entire system is dispatched to waste. In fact, in many instances a good amount of an information handling system includes recyclable plastics and metals, however, the component assembly makes separation of these recyclable portions cost prohibitive. For example, a typical housing might have a metal outer form with injection molded plastic structures coupled by screws so that the housing on a component level cannot efficiently be recycled as either metal or plastic material.

Similar difficulties arise with a number of peripheral devices that assemble components using screws and adhesives. As an example, a peripheral keyboard typically has a keyboard module with a membrane adhered to an internal structure and biasing device, such as a rubber dome layer. Over time, the exterior of the keyboard can wear with use to have an unsightly appearance, however, the internal components including the membrane tend to have remaining useable life. When the keyboard is difficult to breakdown to reusable components, such as the membrane and the printed circuit board within the keyboard, end users will often discard the entire keyboard even though components within the keyboard have remaining usable life. As another example, a peripheral mouse typically includes a printed circuit board within a housing that detects movement of the mouse across a support surface and communicates the movement by USB wired or BLUETOOTH wireless interfaces. The components of the mouse tend to have a substantial usable life that is not fully exploited because disassembly of the mouse to reuse and recycle the components is not cost effective when the mouse is assembled using screws and adhesives. Another example is peripheral cameras, which tend to build an image sensor and support infrastructure in a single housing secured by screws and adhesives. Repair of an integrated assembly is difficult since a technician has to determine what part has failed and then separate the failed part to assemble a replacement part.

One improvement for recycling of information handling systems involves the use of bio-based printed circuit board substrates. Some available bio-based printed circuit board substrates are fully biodegradable, which helps to manage landfill waste when an information handling system or peripheral is discarded. In contrast, conventional prepreg substrates do not degrade, resulting in long term disposal difficulties. Unfortunately, bio-based printed circuit board substrates have not achieved acceptance due to less-favorable electric characteristics that can affect high signaling speed communications. Further, the bio-based printed circuit board substrates tend to have a less robust structure that can not withstand the types of impacts that conventional prepreg substrates can handle.

SUMMARY OF THE INVENTION

Therefore, a need has arisen for a system and method which improves repair, reuse and recycling of information handling systems and peripherals.

In accordance with the present invention, a system and method are provided which substantially reduce the disadvantages and problems associated with previous methods and systems to assemble information handling systems and peripherals to aid repair, reuse and recycling. Major components of the information handling system and peripherals organize as homogeneous recyclable modules of common materials and functions and assemble without the use of screws and adhesives. At end of life or in response to a system failure, the major components break down with essentially toolless disassembly for ready repair, replacement, reuse and/or recycling.

More specifically, an information handling system is built in a housing having an extruded aluminum main housing portion that contains a keyboard, touchpad and processing components, and having an extruded aluminum lid housing portion with an open face through which a display panel presents visual images. The aluminum extrusion produces an elongated tube form with openings at each end that are closed with a cover after assembly of the components within the housing portion. A main housing tray supports a keyboard and touchpad at an upper surface and couples a motherboard and thermal module at a lower surface. Once the keyboard, touchpad, motherboard and thermal module are coupled in place, the tray slides into the housing and is held in place by a coupling device that inserts through an opening of the housing and through an opening of the tray to couple with a hinge. The lid housing portion couples to the hinge to rotate between open and closed positions. Various peripheral devices include similar modular approaches. For example, a peripheral display couples a display panel to a stand with magnets and interface contactless connectors so that the display panel pulls off the stand to separate. Peripheral keyboards include one with an extruded aluminum housing that accepts a keyboard module on a tray that slides into an opening of the housing, and an alternative that layers keyboard components and couples the layers into an assembly with extruded aluminum rails slid onto each side of the keyboard. A peripheral mouse captures a printed circuit board between upper and lower housing portions that couple together with a single central lock. Peripheral cameras include a rectangular plastic housing held together with a planar spring lock, and a cylindrical aluminum extrude housing that divides into a rear portion with supporting components and a front portion with visual sensor components. In each embodiment, a bio-based printed circuit board substrate integrated with a prepreg substrate can be used.

The present invention provides a number of important technical advantages. One example of an important technical advantage is that an information handling system and peripherals have a modular construction with components that align with repair, reuse and recycling processes for material and component types. Modular assembly without the use of screws and adhesives simplifies disassembly of components in a logical manner associated with function and/or material type. The result is a more simple and less expensive breakdown of the information handling system and peripherals so that repair, reuse and recycling become a more economically feasible option.

BRIEF DESCRIPTION OF THE DRAWINGS

The present invention may be better understood, and its numerous objects, features and advantages made apparent to FIG. 1 depicts a front perspective view of a portable information handling system 10 manufactured to enhance recyclability;

FIGS. 3A-3I depict assembly of the information handling system main housing portion components without the use of any screws or adhesives;

FIGS. 4 and 4A-4I depict assembly of the information handling system lid housing portion components without the use of any screws or adhesives;

FIGS. 11A through 11E depict an example of assembly of the wireless keyboard;

FIGS. 14A through 14I depict an example of assembly of the alternative keyboard embodiment;

FIG. 18 depicts a cross-sectional view of an example of a printed circuit board having a hybrid of conventional and bio-based materials to enhance recycling and reuse of the printed circuit board;

FIGS. 23 and 23A through 23B depict an example camera having assembly and disassembly of a front housing portion having camera visual image sensor resources.

DETAILED DESCRIPTION

An information handling system and peripherals, such a keyboard, mouse and display, are manufactured for ease of disassembly by limiting or eliminating the use of screws and adhesives while using materials adapted for recycling, such as aluminum and plastics. The various example embodiments depicted by the Figures herein show the component breakdowns used for assembly without screws and adhesives as claimed, although ideally at the subcomponent level screws and adhesives are also avoided, as is shown in the example embodiments. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
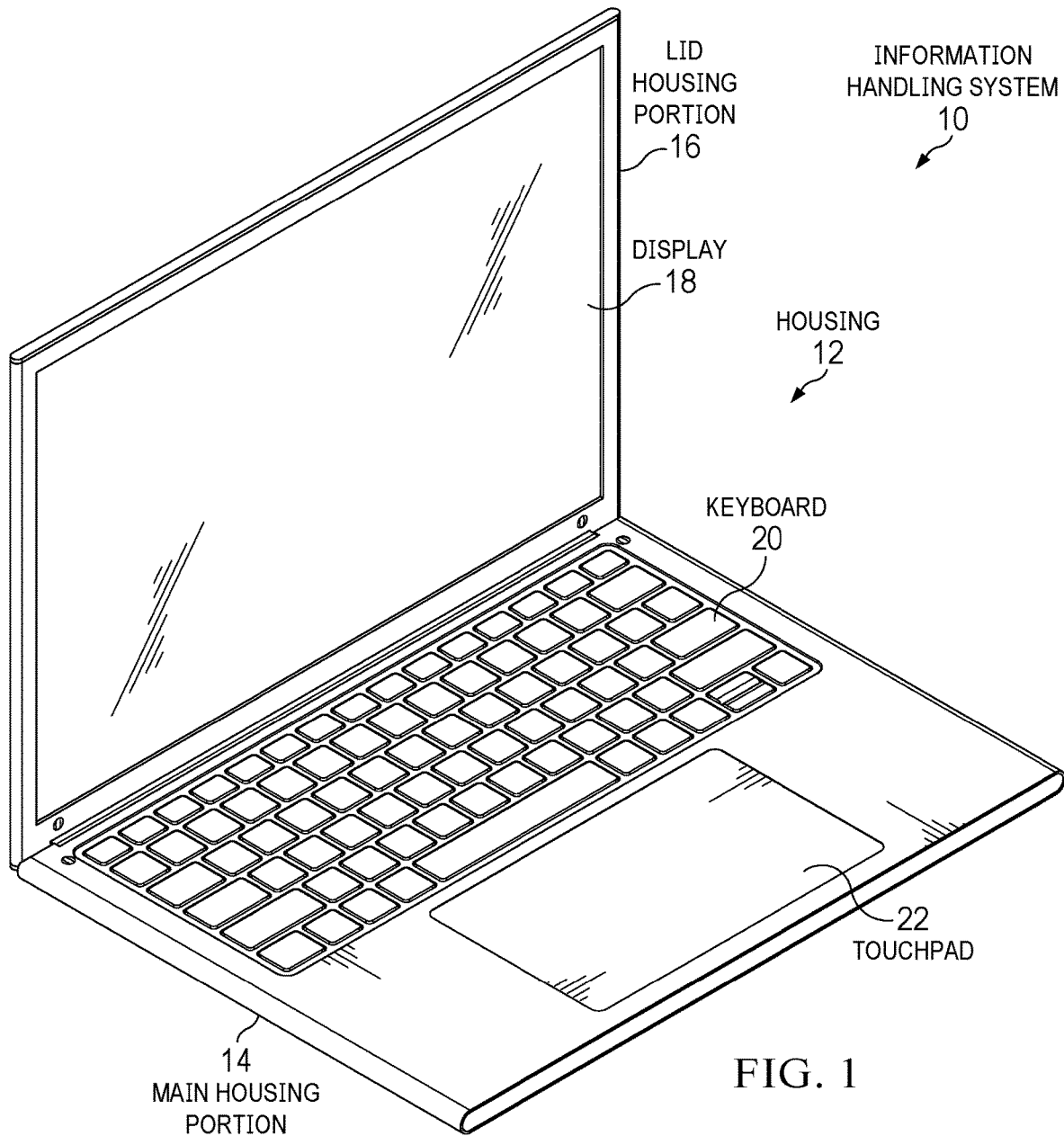

Referring now to FIG. 1, a front perspective view depicts a portable information handling system 10 manufactured to enhance recyclability. Generally, when information handling systems are assembled with screws and adhesives, the components of the information handling system do not readily break down into recyclable elements, such as single materials like plastic or aluminum, so that recycling is cost effective. To enhance recycling, portable information handling system 10 uses a combination of extruded, plastic and metallic parts assembled in some instances by magnets so that the system breaks down with minimal effort and into components that are cost effective for recycling. In the example embodiment, information handling system 10 has a clamshell configuration that opens to provide an end user with access to a keyboard 20 and touchpad 22 while viewing visual images at a display 18. A housing 12 is built from a main housing portion 14 that rotationally couples to a lid housing portion 16 with hinges, as described below in greater detail. As an example of some features that improve recyclability, information handling system 10 has an extruded aluminum housing that assembles with plastic components without using screws and adhesives. The various components can either be reused or recycled with a disassembly process that breaks down the system in a rapid manner into reusable or recyclable components, such as based upon material type, typical system wear and proclivity for reuse. As an example, main housing portion 14 and lid housing portion 16 may be broken down, cleaned and reused, or alternatively, melted for material value. While the aluminum housing typically does not physically wear in a way that prevents reuse, the keyboard keys tend to break down over time. Thus, a reused aluminum housing might have the same keyboard subcomponents, like the same keyboard membrane, with a new set of keyboard keys.

Figure 2:
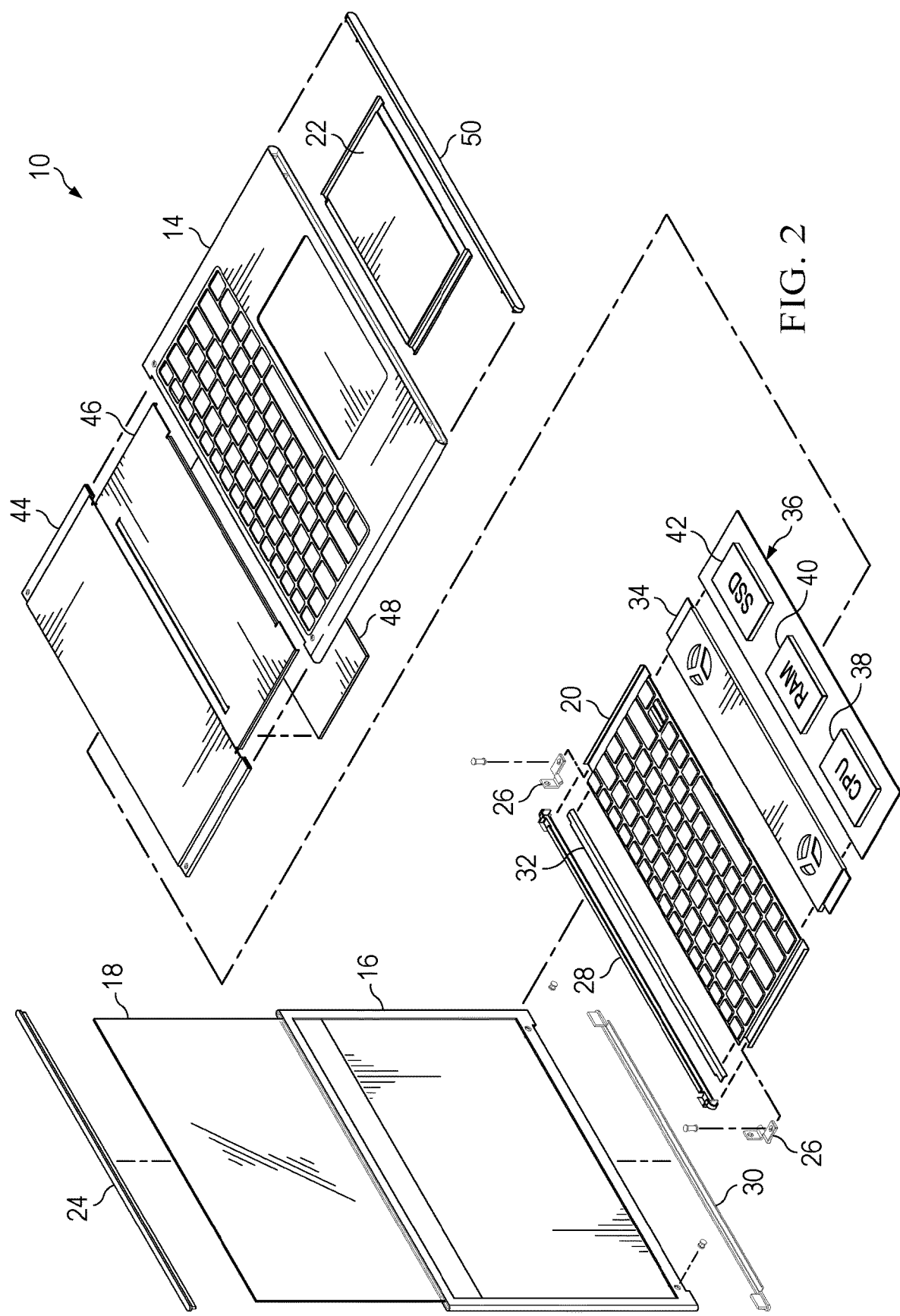
FIG. 2 depicts an exploded perspective view of an example embodiment of an information handling system having a modular assembly that enhances efficient disassembly and recycling.

Referring now to FIG. 2, an exploded perspective view depicts an example embodiment of an information handling system 10 having a modular assembly that enhances efficient disassembly and recycling. In the example embodiment, main housing portion 14 and lid housing portion 16 are assembled with internal modular components and then rotationally coupled by hinges 26. Lid housing portion 16 is extruded aluminum formed to have an open face through with a display panel 18 is visible and a solid rear face that protects display panel 18. Extrusion of aluminum through a mold leaves a top opening through which display panel 18 slides into place and a bottom opening adjacent main housing portion 14 through which a communication cable can be routed. A top opening cover 24 is extruded plastic or aluminum sized to fit into the top opening after display panel 18 slides into place, such as with plastic snaps that couple the top opening cover into the top opening. A display hinge cover 30 provides a bottom opening cover of extruded plastic or aluminum sized to fit into the bottom opening in cooperation with hinges 26. When the top and bottom covers are coupled to the lid housing portion openings, the interior of the lid housing portion and display panel are protected from contaminates. Lid housing portion 16 assembles into a module that is then coupled by hinges 26 to the assembled main housing portion 14.

Main housing portion 14 assembles as a module in a similar manner as lid housing portion 16 with components sized to slide into either a front or rear opening of an extruded aluminum body. In the example embodiment, the aluminum extrusion mold essentially forms an elongated tube with a front opening and a rear opening. Once the tube is extruded, key openings are cut in the housing upper surface through which keyboard keys of a keyboard module 20 can extend. In addition, a touchpad opening is cut in the upper surface through which a touchpad 22 is exposed to accept touch inputs. Keyboard module 20 slides into main housing portion 14 and is supported in part from below by an upper surface of a main housing tray 44 having a battery tray 46. Main housing tray 44 and battery tray 46 are, for example, steel panels that provide rigid support under keyboard module 20 by engaging with the interior or main housing portion 14. Main housing tray 44 accepts on its bottom surface a motherboard 36, a thermal module 34 having cooling fans and a battery 48. Motherboard 36 supports communication between processing components that cooperate to process information. For instance, a central processing unit (CPU) 38 executes instructions to process information in cooperation with a random access memory (RAM) 40 that stores the instructions and information. A solid state drive (SSD) 42 provides persistent storage of the instructions and information, such as an operating system and applications that are retrieved to RAM at system power up. When keyboard module 20, main housing tray 44 and touchpad 22 slide into the interior of main housing portion 14 a front cover 50 fits into the front opening to protect against entry of contaminants and a rear cover 28 fits into the rear opening with a body hinge cover 32 providing an aesthetic assembly around the hinge coupling with the lid housing portion 16. As is described in greater detail below, the assembly of the modules shown in FIG. 2 is completed without any screws or adhesives applied to couple the components into the completed information handling system 10.

Figure 3A:
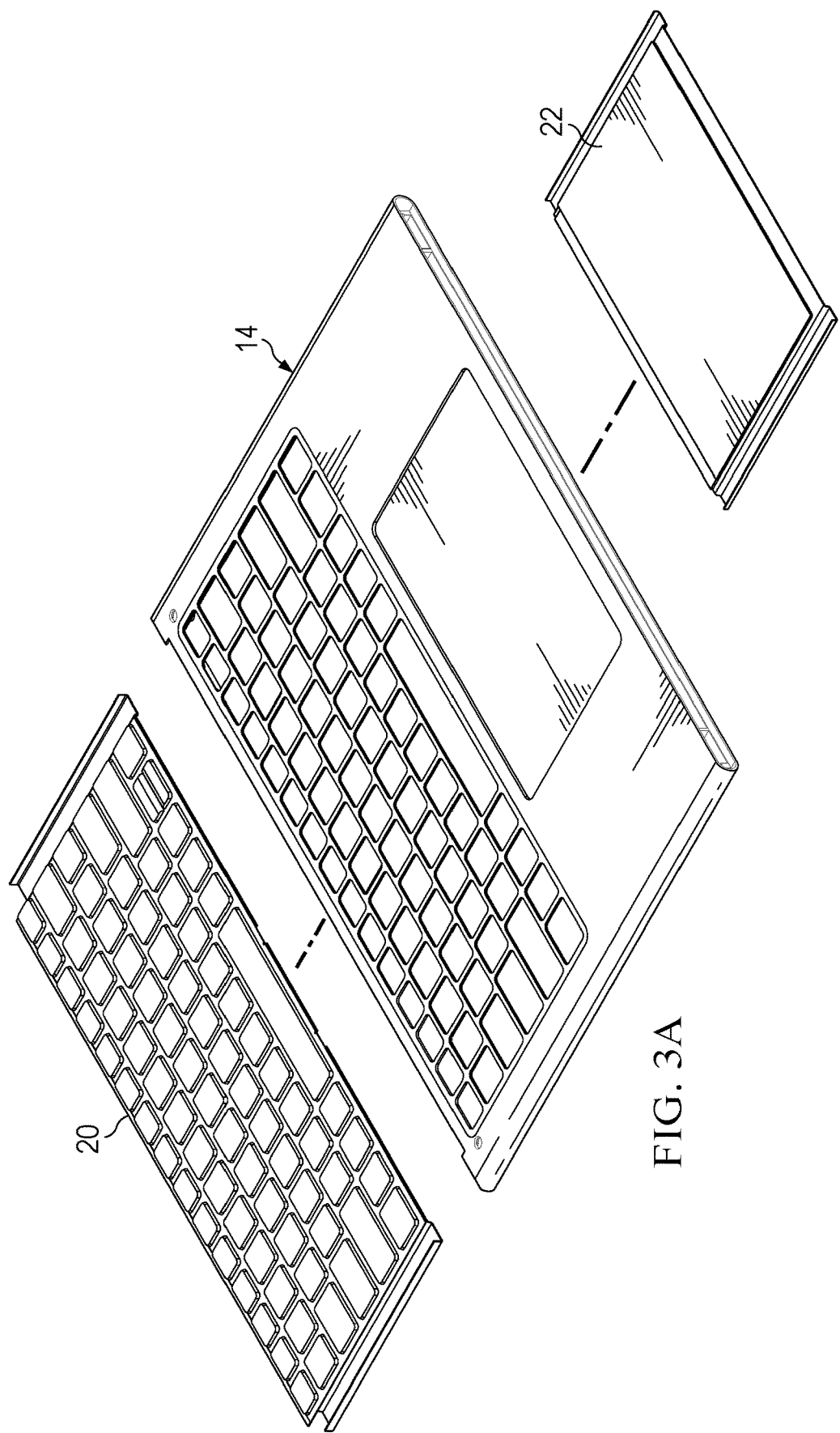
Figure 3B:
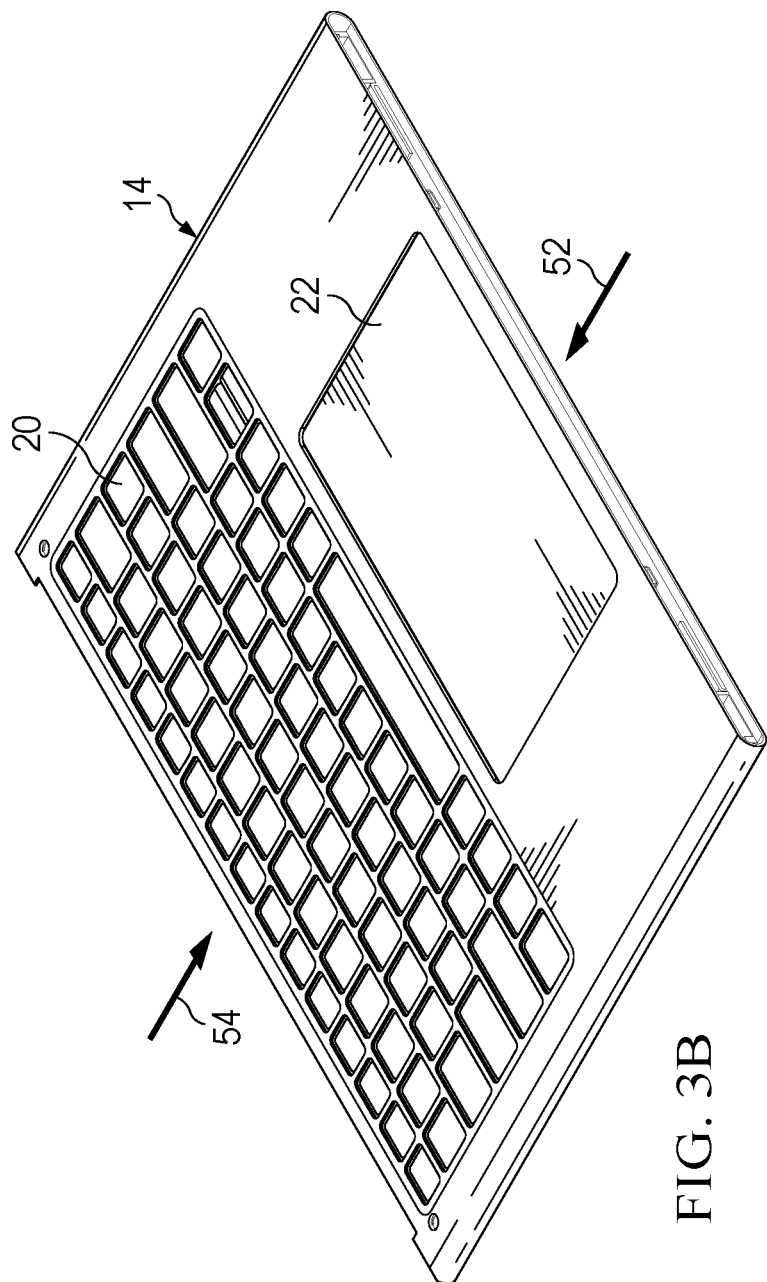
Figure 3C:
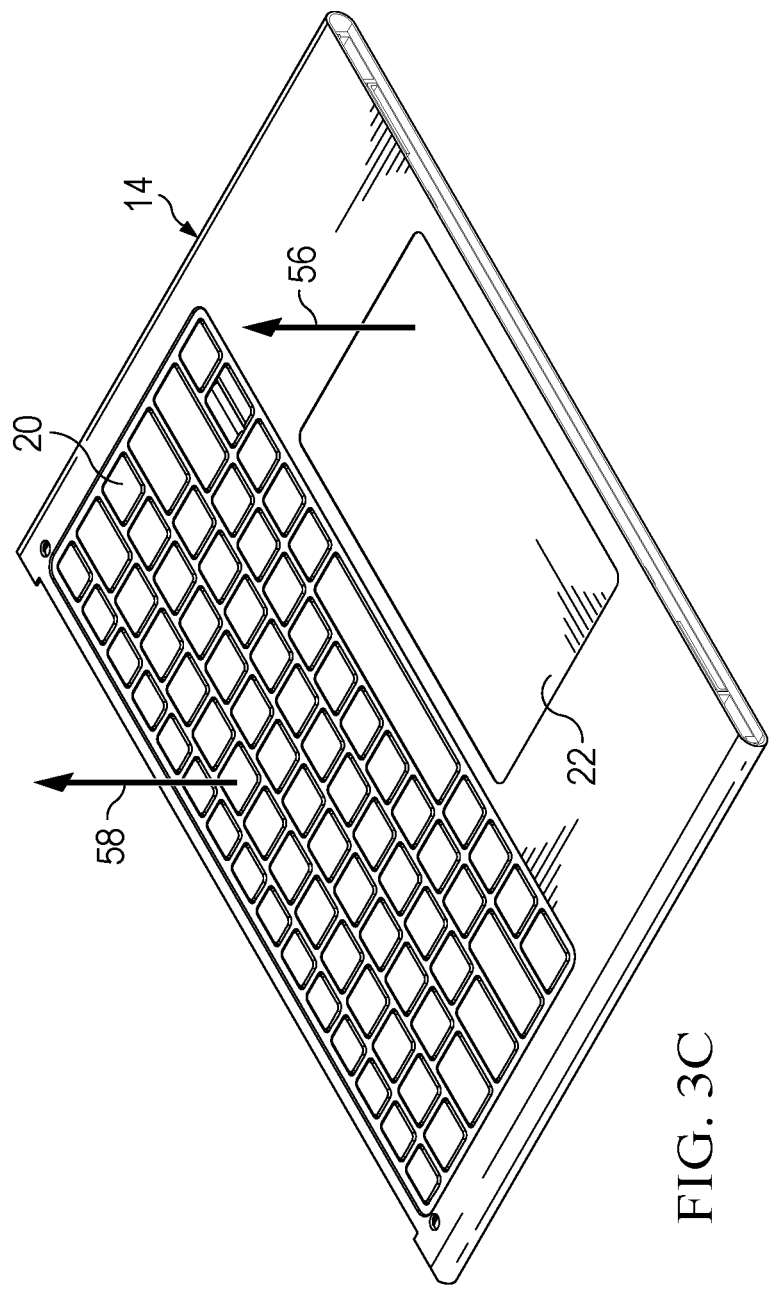

Referring now to FIGS. 3A-3I, assembly of information handling system 10 and main housing portion 14 components are depicted without the use of any screws or adhesives. FIG. 3A depicts main housing portion 14 in an upright orientation having a keyboard module 20 inserted through a rear opening and a touchpad module 22 inserted through a front opening, as indicated by arrows 54 and 52 of FIG. 3B. FIG. 3C illustrates assembly of keyboard module 20 to extend keys through key openings in main housing portion 14 with an upward bias as indicated by arrow 58 provided from magnetic attraction, as detailed in FIGS. 3D, 3H and 3I. Similarly, touchpad 22 is biased upward with magnetic attraction into the touchpad opening as indicated by arrow 56. FIG. 3D depicts one example embodiment of an arrangement of magnets 60 to bias keyboard module 20 and touchpad 22 into place. A pair of central magnets 60 are placed towards the front of main housing portion 14 where touchpad 22 aligns, and a second pair of outer magnets 60 are placed towards the rear of main housing portion 14 where keyboard module 20 aligns. Keyboard module 20 and touchpad 22 each include some ferromagnetic material, such as steel, that attracts to magnets 60 so that keyboard module 20 and touchpad 22 are held in position for subsequent assembly steps that secure the keyboard module and touchpad with sufficient robustness to accept end user presses.

Figure 3E:
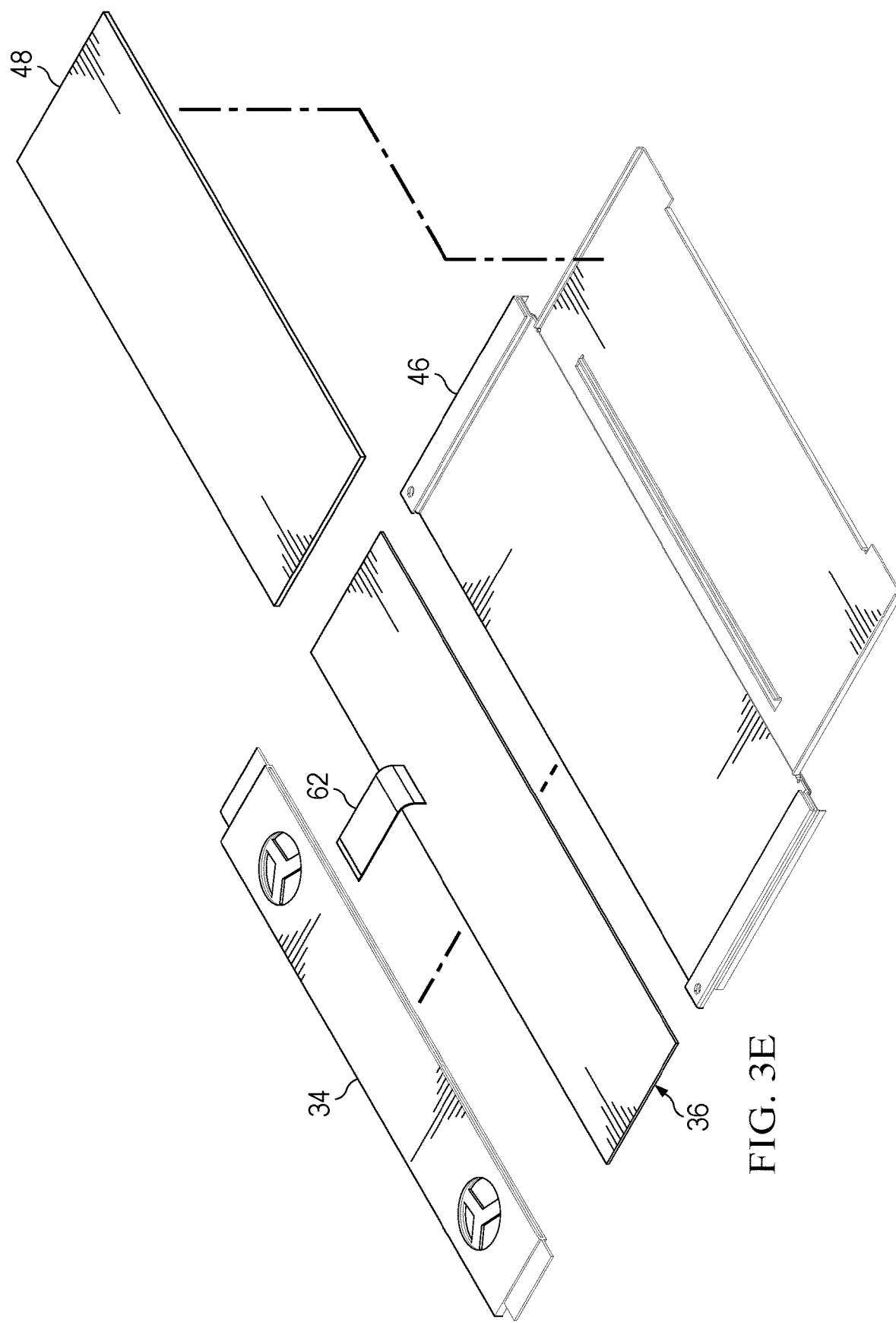
Figure 3F:
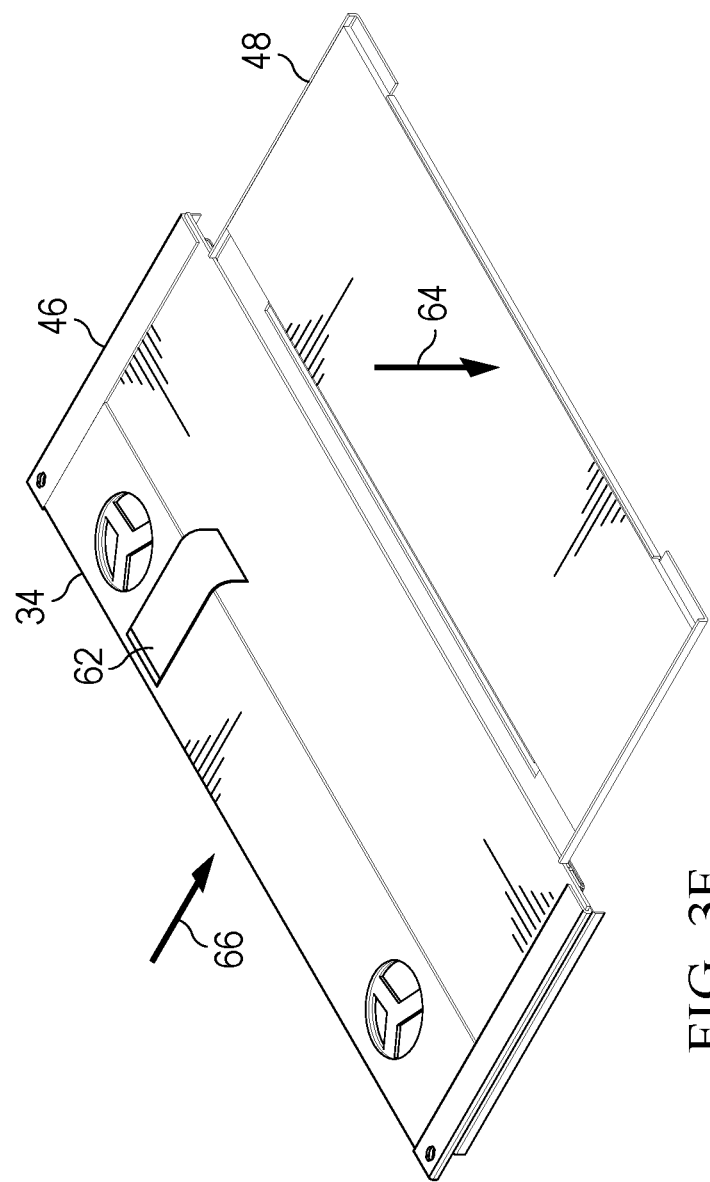
Figure 3G:
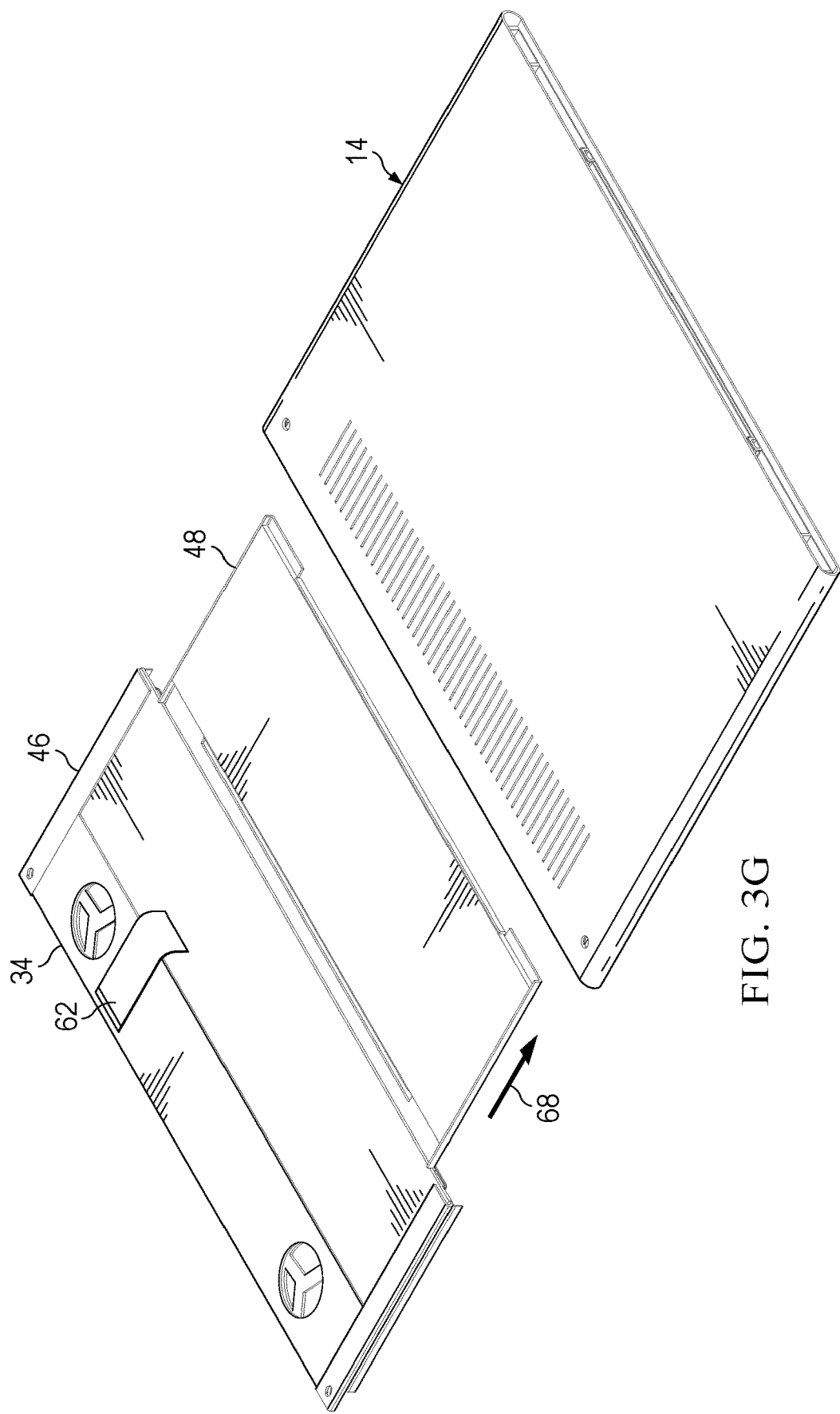
Figure 3H:
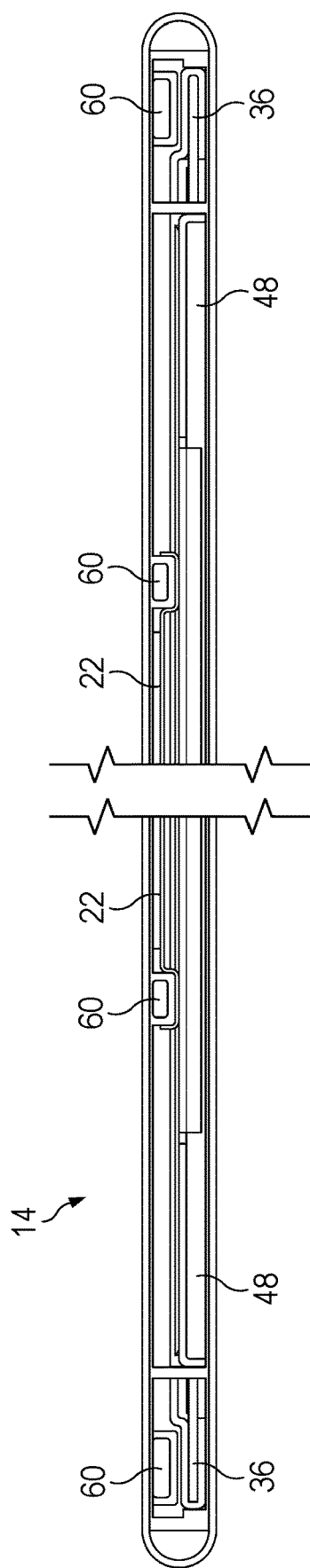
Figure 3I:
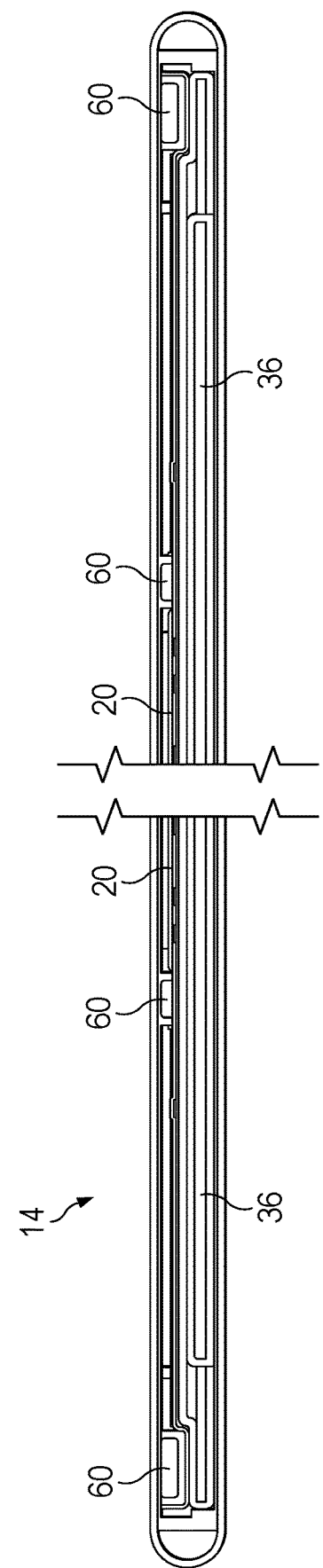

FIG. 3E depicts a bottom exploded view with the alignment of main housing components for assembly into main housing 14 after the keyboard module and touchpad are in position. A thermal module 34 having one or more cooling fans and motherboard 36 couple to a bottom side of main housing tray 44 so that the thermal module aligns to remove excess thermal energy from motherboard processing components, such as the CPU. A battery 48 couples to a battery tray 46 portion of main housing tray 44. A display cable 62 extends from mother board 36 to communicate visual image information from motherboard 36 to the display panel as described below. FIG. 3F depicts assembly of thermal module 34 and motherboard 36 along the axis of arrow 66 into rails defined by main housing tray 44, such as by engaging a snap feature that holds the thermal module and motherboard in place. Battery 48 presses downward as indicated by arrow 64 to engage with the battery tray 46 of main housing tray 44. The assembly of these components outside of main housing portion 14 provides adequate room for rapid assembly and is preformed without any screws or adhesives. At recycling, disassembly is performed with opposite steps and without having to free the components from coupling by screws or adhesives. FIG. 3G depicts insertion of the main housing tray subassembly along an axis indicated by arrow 68 from the rear of main housing portion 14. Main housing tray 44 is sized to fit into the interior of main housing portion 14 with alignment and placement aided by magnets 60 and, in some instances, structures defined within the interior of main housing portion 14. The surface of main housing tray 44 opposite motherboard 36 provides support for the keyboard module and touchpad to accept end user press inputs. FIG. 3H depicts a sectional view of main housing portion 14 with main housing tray 44 inserted and having features at the location of magnets 60 that define alignment within the housing interior. FIG. 3I depicts a sectional view of main housing portion 14 with main housing tray 44 having features that define a fully inserted position relative to magnets 66. The example feature of FIG. 3H aligns magnet 60 with a recess in touchpad 22 and the battery tray 46 of main housing tray 44 so that the touchpad has adequate underlying support. The example feature of FIG. 3I aligns the outer magnets 60 with a beveled end feature of main housing tray 44 so that the main housing tray is leveraged into place and also supportive under keyboard module 20. Disassembly is performed by pulling out main housing tray 44 over the magnetic attraction and then removing the components as described above. No screws or adhesives are used to assemble the main housing portion, which improves the efficiency of breaking down and recycling the system and its components.

Figure 4:
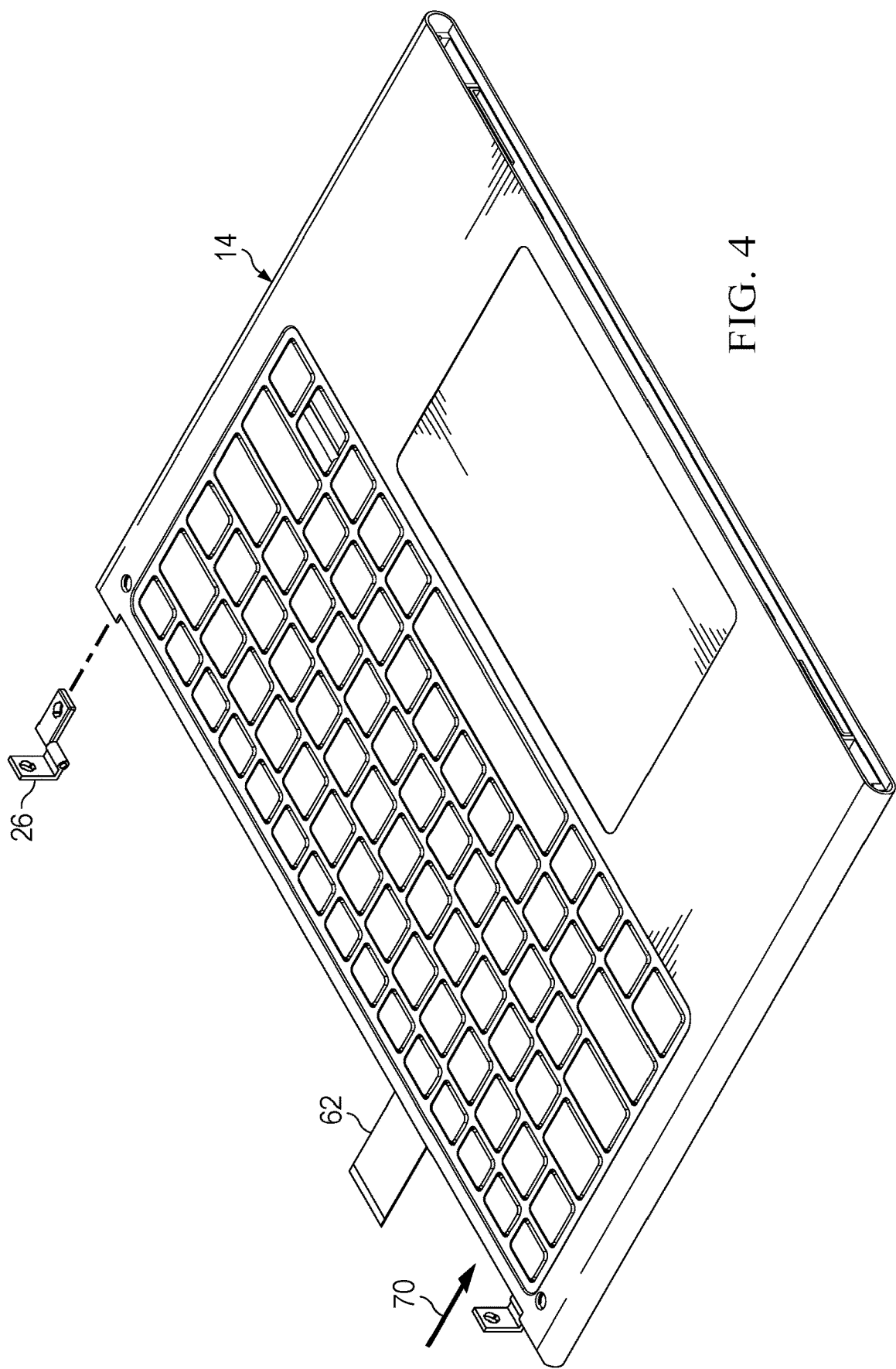
Figure 4A:
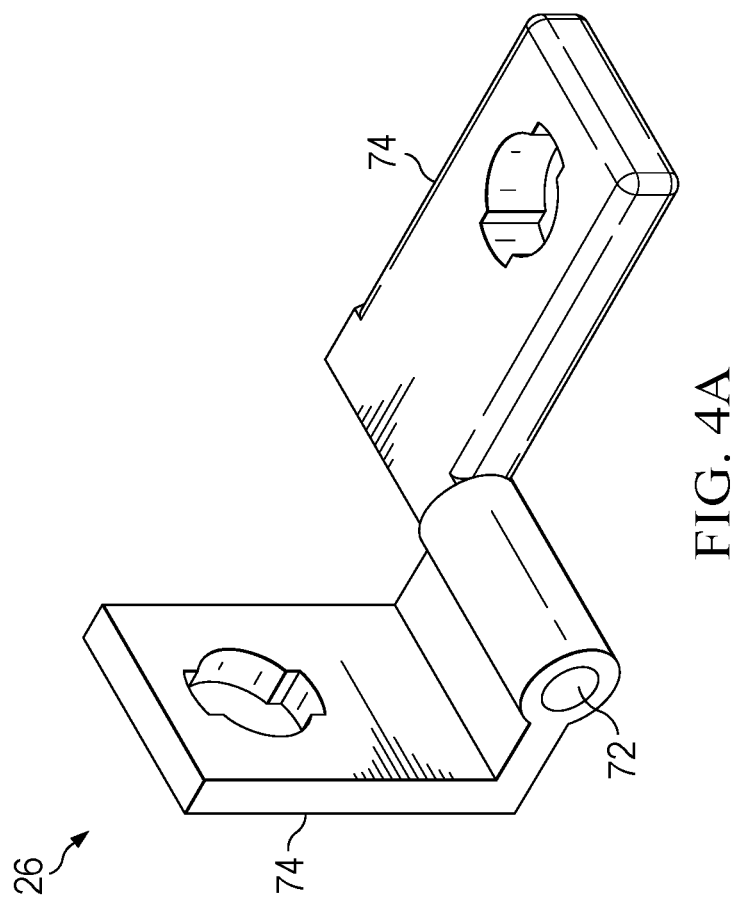
Figure 4B:
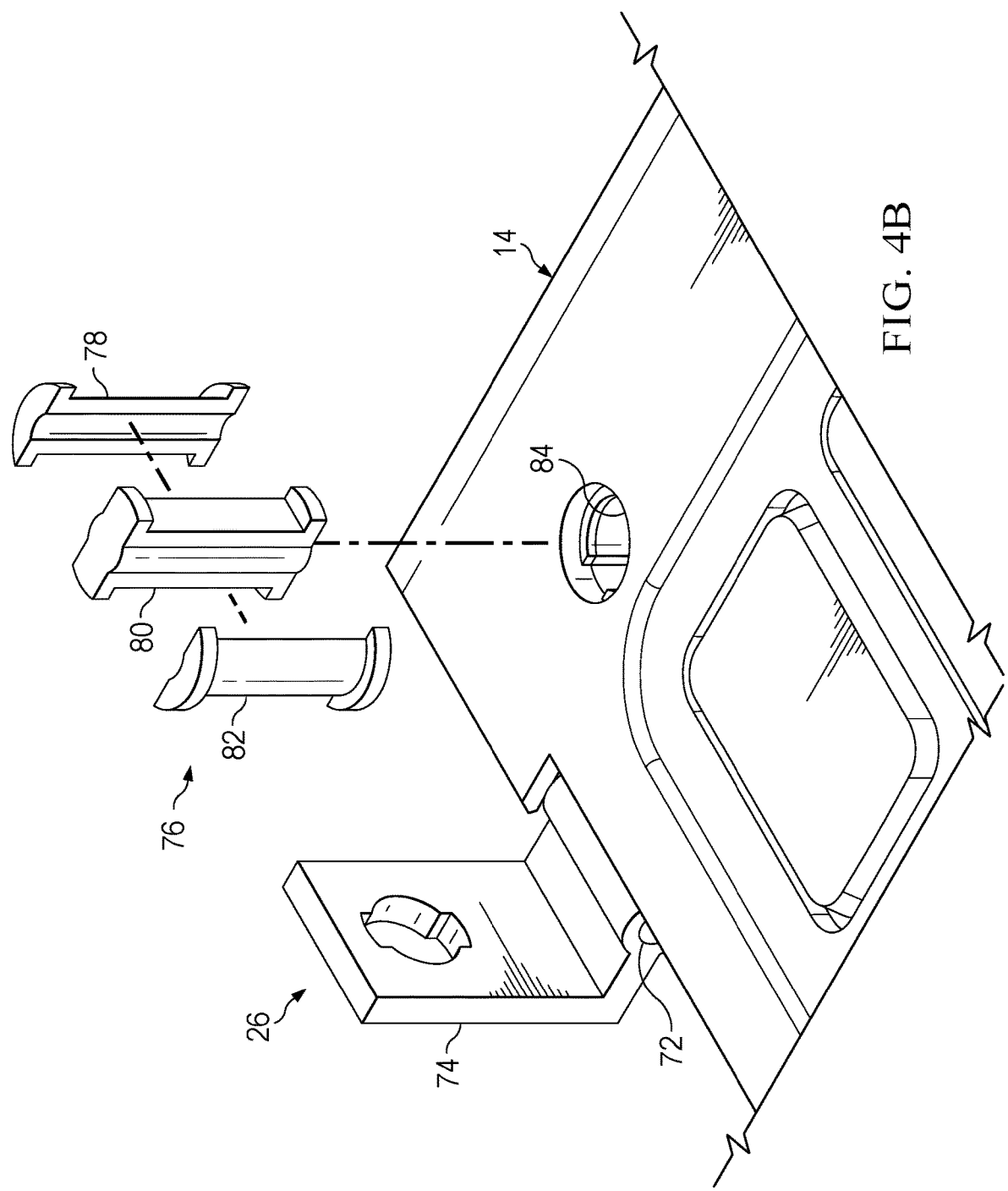
Figure 4C:
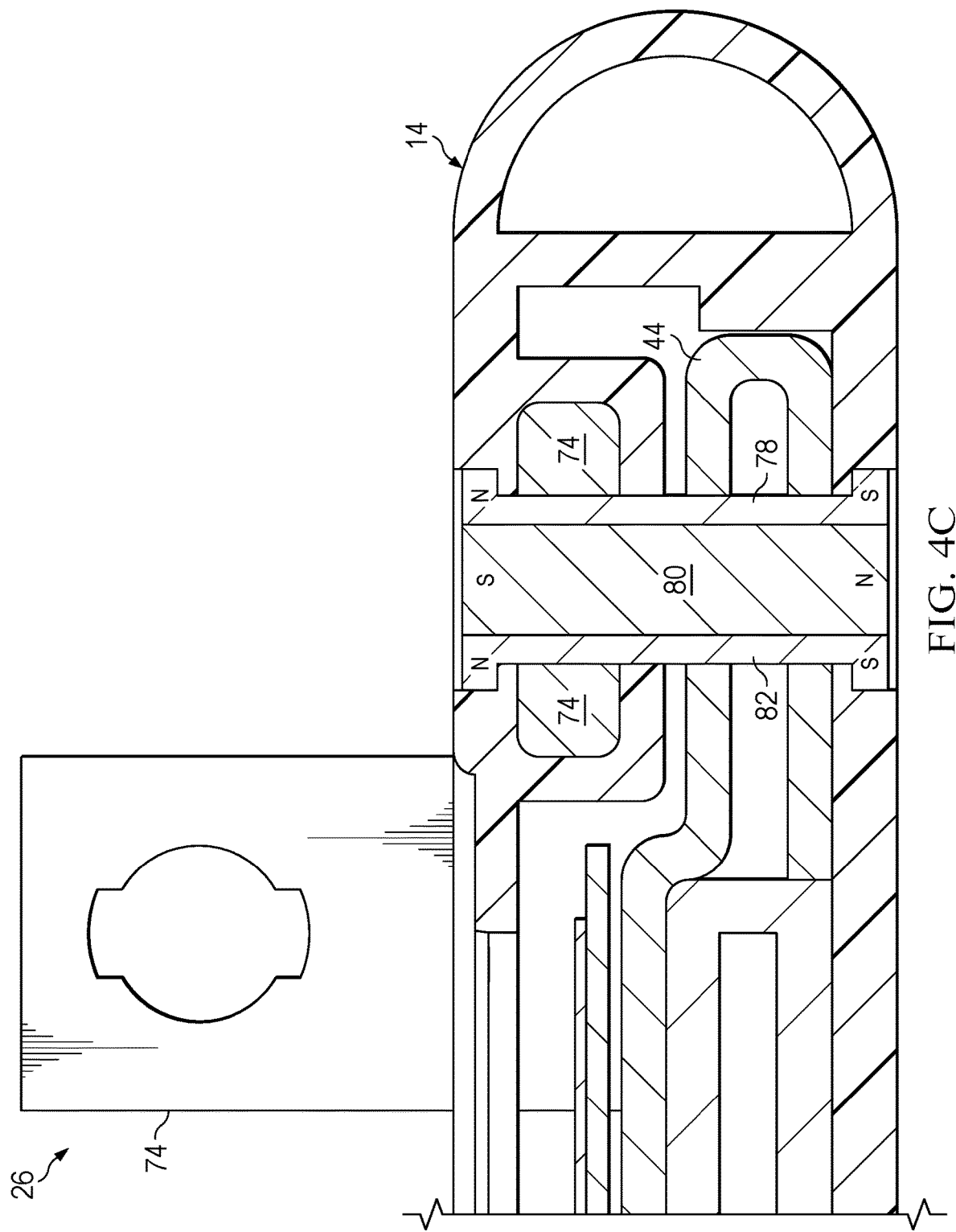

Referring now to FIGS. 4 and 4A-4I, assembly of the information handling system lid housing portion components without the use of any screws or adhesives is depicted. FIG. 4 depicts an upper perspective view of main housing portion 14 with the internal components assembled and having two hinges 26 inserted into the rear side as indicated by arrows 70 to align with an opening formed in main housing portion 14 and through the main housing tray. Display cable 62 extends out of main housing 14 aligned to couple with a display of lid housing portion 16. FIG. 4A depicts a detail view of hinge 26 having first and second brackets 74 rotating about an axle 72. Each bracket 74 has an opening that accepts a coupling device, which serves to both couple the hinge to the housing and also to secure the main housing tray in position within the main housing interior. FIG. 4B depicts a perspective detail view of a coupling device 76 aligned to insert into an opening 84 of main housing portion 14 that couples hinge 26 in place and also couples through the main housing tray to lock it in place. The coupling device of the example embodiment has three magnetic elements having an I-shape along an insertion axis. Outer coupling device elements 78 and 82 have an arc outer surface to fit within the circular opening 84 and a lip at an upper and lower side that fits in a recess formed in opening 84. Opening 84 has an I-shape or keyhole portion with a greater circumference so that central element 80 fits into opening 84 after elements 78 and 82 are inserted. FIG. 4C depicts a cross-sectional view of coupling device 76 inserted into opening 84 of main housing portion 14 and through hinge 26 and main housing tray 44 to hold the information handling system assembly together. In the example embodiment, magnetic attraction is applied to assemble the coupling device: outer elements 82 and 78 have north poles at an upper side and south poles at a lower side, while middle element 80 has a south pole at an upper side and a north pole at a lower side. This magnet pole arrangement holds the coupling device together and also aids in assembly, as is detailed below. In alternative embodiments, one or two of the elements may be steel or other ferromagnetic material instead of using magnets for all three elements.

Figure 4D:
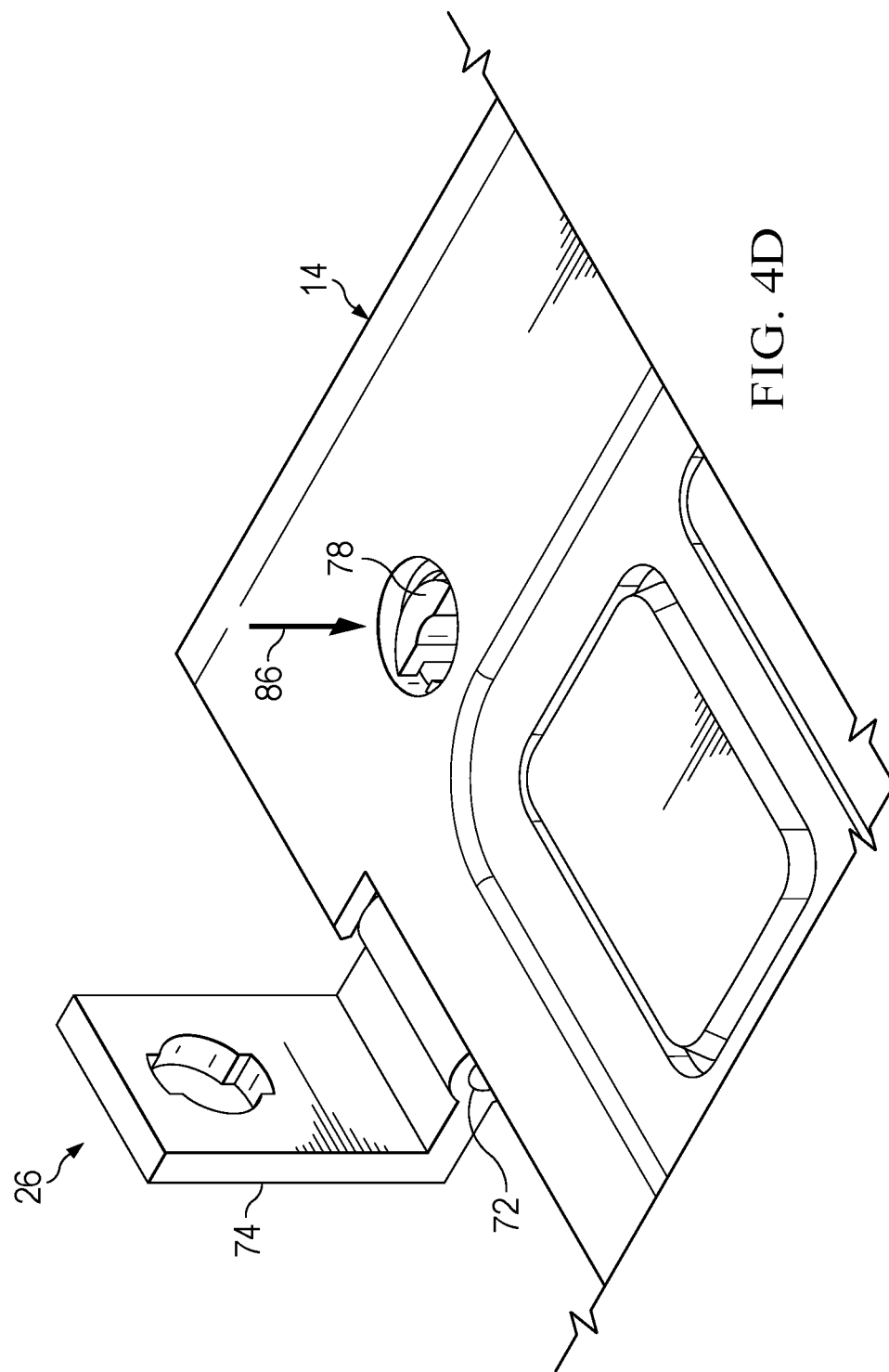
Figure 4E:
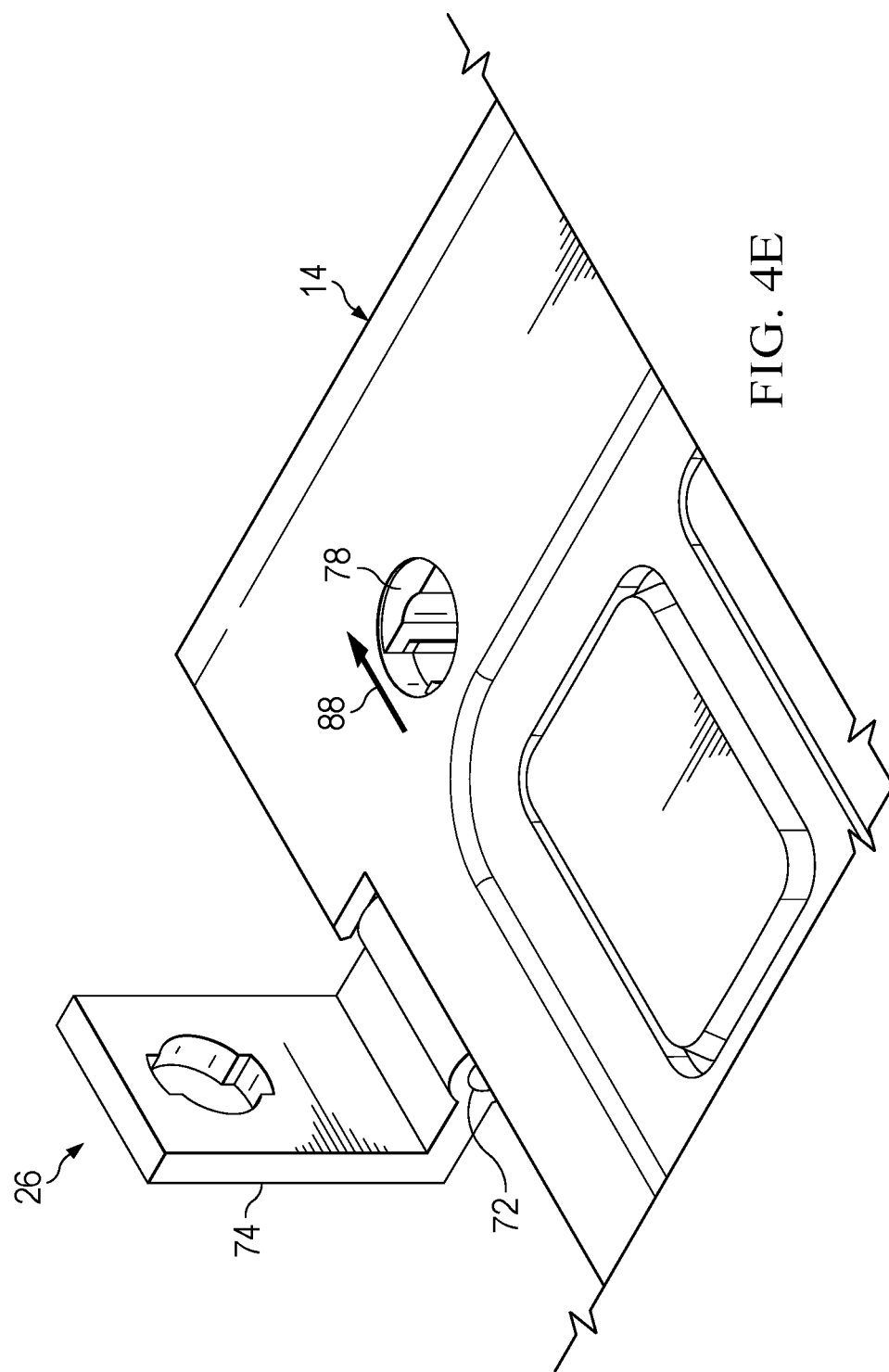
Figure 4F:
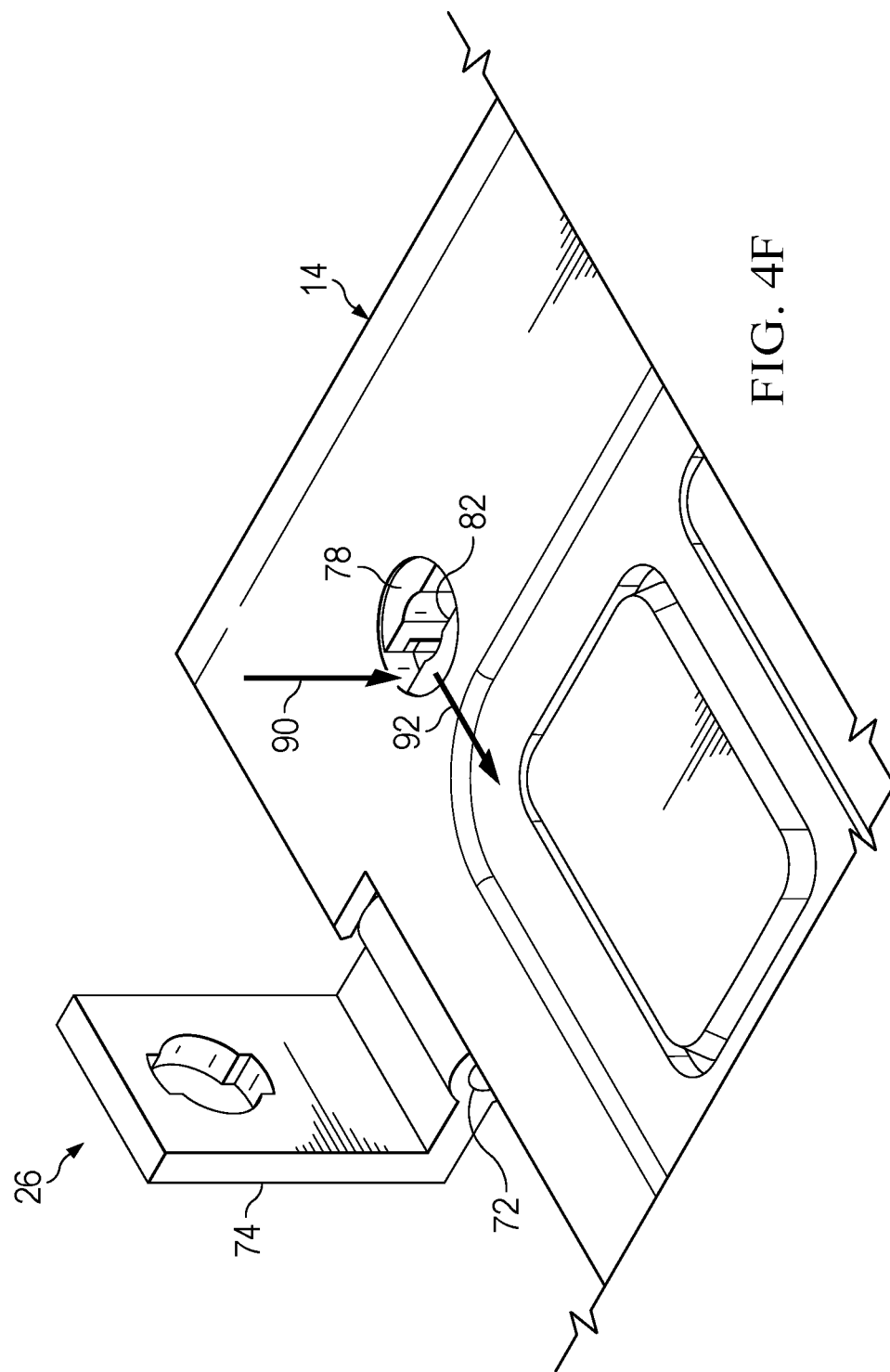

FIGS. 4D through 4G illustrate assembly of the coupling device 76 that leverages magnetic pole orientation of the coupling device elements. In FIG. 4D, the first coupling device element 78 is inserted as indicated by arrow 86 at the keyhole of increased diameter of opening 84 and slid to the side so that the upper I-shape lip of element 78 fits into the recess of main housing 14. In the example embodiment, element 78 is held in place in part by magnetic attraction to the steel of the main housing tray. In alternative embodiments element 78 may be a non-magnet ferromagnetic material or a magnet with a smaller level of magnetic attraction than the central element 80. FIG. 4E depicts insertion of element 78 along the axis indicated by arrow 88 so that the lip of the I-shape fits in the recess defined in the main housing portion that prevents vertical movement of element 78. FIG. 4F depicts insertion of the opposing outer element 82 in opening 84 along the increased circumference of the keyhole as indicated by arrow 90. Once the second element 82 inserts fully into the opening so that the I-shape lip and fit into the recess of main housing portion 14, the opposing magnetic force caused by alignment of like poles slides element 82 as indicated by arrow 92 under the lip of the main housing portion. The opposing magnetic force spaces elements 78 and 82 apart from each other to provide for insertion of the middle element 80 as indicated by arrow 94 of FIG. 4G. The I-shape portion of middle element 80 fits into the larger circumference of the keyhole of opening 84 and magnetically couples with outer elements 78 and 82. In the upper view of the assembled coupling device depicted by FIG. 4G, alignment forms are depicted having a bulge on each side of middle element 80 and a recess in each of outer elements 78 and 82 to guide the insertion of the middle element. As the middle element inserts all three poles of the three magnets are alike so that repelling magnetic forces will aid with the insertion of the middle element. Once the middle element 80 fully inserts, the opposite magnetic pole alignments will work to hold the coupling device in place. Disassembly is accomplished by applying a sufficient force to press out the middle element so that the outside elements can be removed.

Figure 4H:
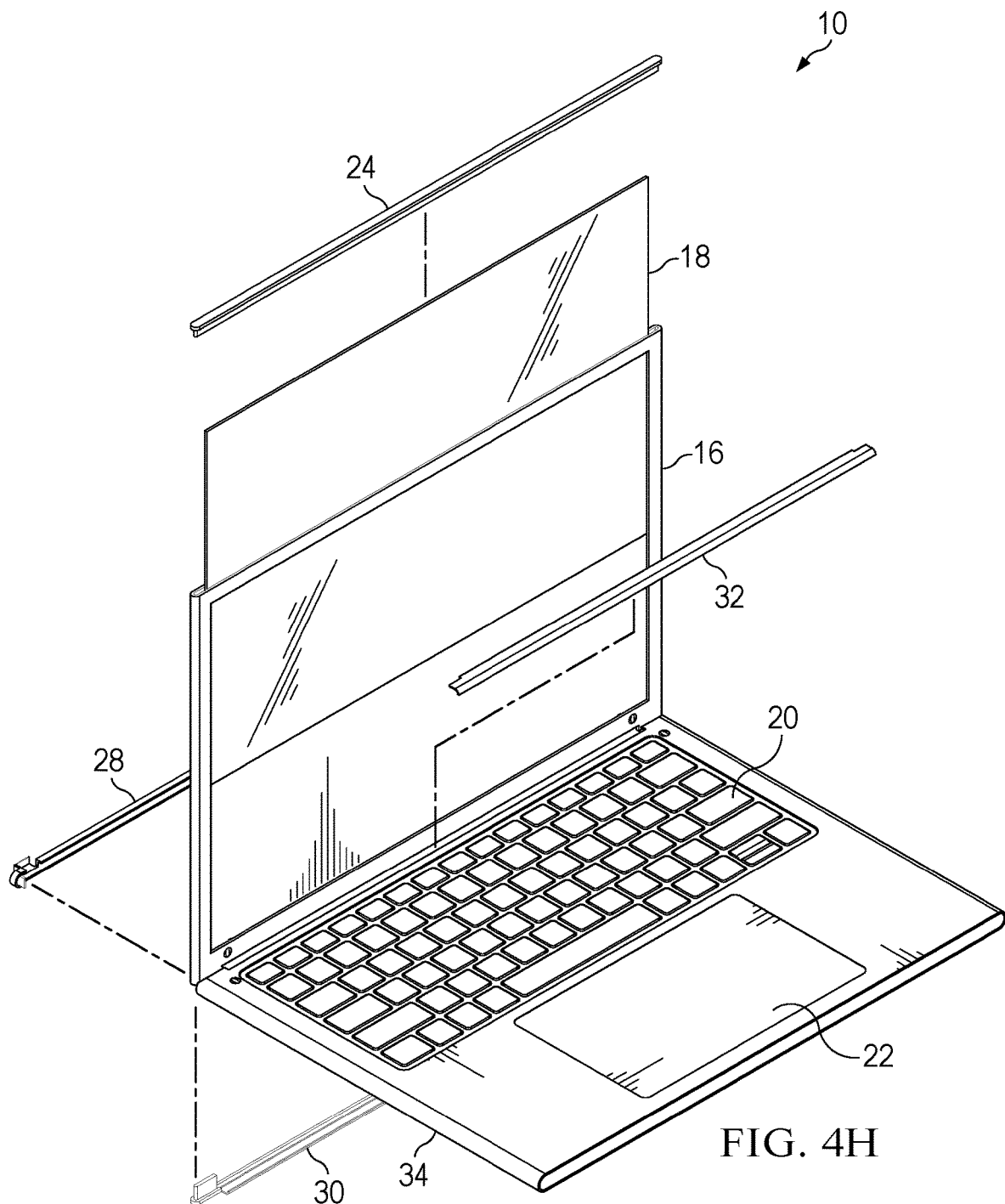
Figure 4I:
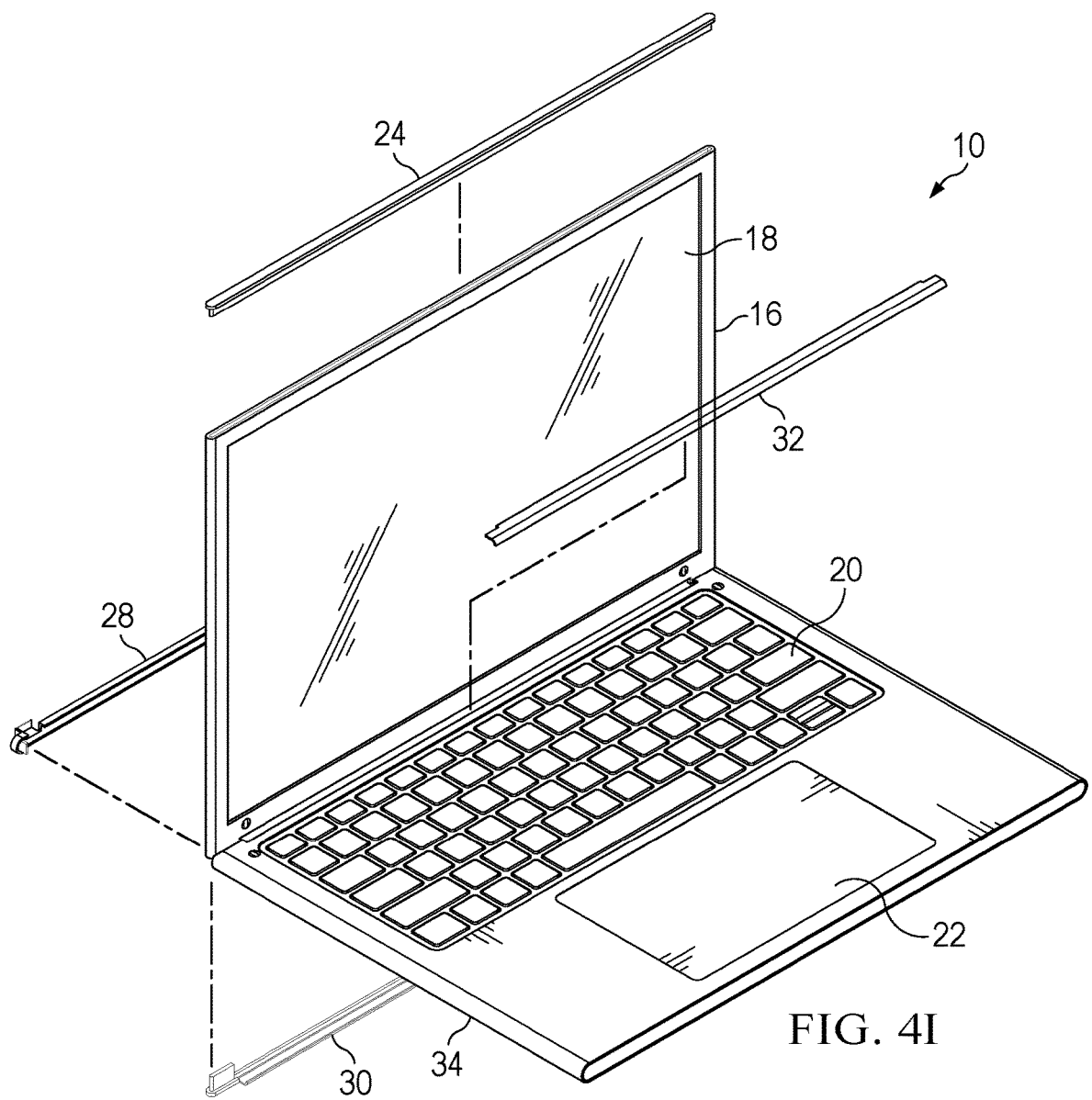

Once the main housing is assembled with hinge 26 extending out the rear side, the lid housing portion 16 and display panel 18 are assembled as depicted by FIG. 4H. Display panel 18 inserts into the bottom opening of lid housing portion 16 and is guided to position by the sides of the extruded housing. After insertion of display panel 18, a coupling device is inserted through lid housing portion 16 as described above to couple with the hinge 26 and hold display panel 18 in position. Once the lid housing portion couples to the hinges, the information handling system assembly is completed as shown by FIG. 4I by closing the ends of the main and lid housing portions. A lid housing portion top cover 24 inserts into the top opening of lid housing portion 16, a rear cover 28 inserts into a rear opening of main housing portion 14, and a front cover 50 inserts into the front opening of main housing portion 14. The top, rear and front covers may snap into position and couple to internal structures, such as the main housing tray and the display panel, such as to provide additional support to the main housing tray position. Once the top, rear and front covers couple into position, hinge covers 30 and 32 close the bottom side of lid housing portion 16 and provide room for rotation of the lid and main housing portions relative to each other about hinges 26. Disassembly of the information handling system is performed by removing the covers and reversing the assembly process. Since no screws or adhesives are used for the assembly of the components, disassembly can be performed in a rapid manner to yield components for reuse and recycling in a logical and preplanned manner. In the example embodiments, the top and bottom of the I-shape of the assembled coupling device substantially align with the housing upper and lower surface to provide a planar appearance. In alternative embodiments, protrusions other than the I-shape may be used to hold the coupling device in place, such a single protrusion that fits into a single recess of the opening, rather than the upper and lower recess shown in the example embodiment that accept the I-shaped form of the assembled coupling device.

Figure 5:
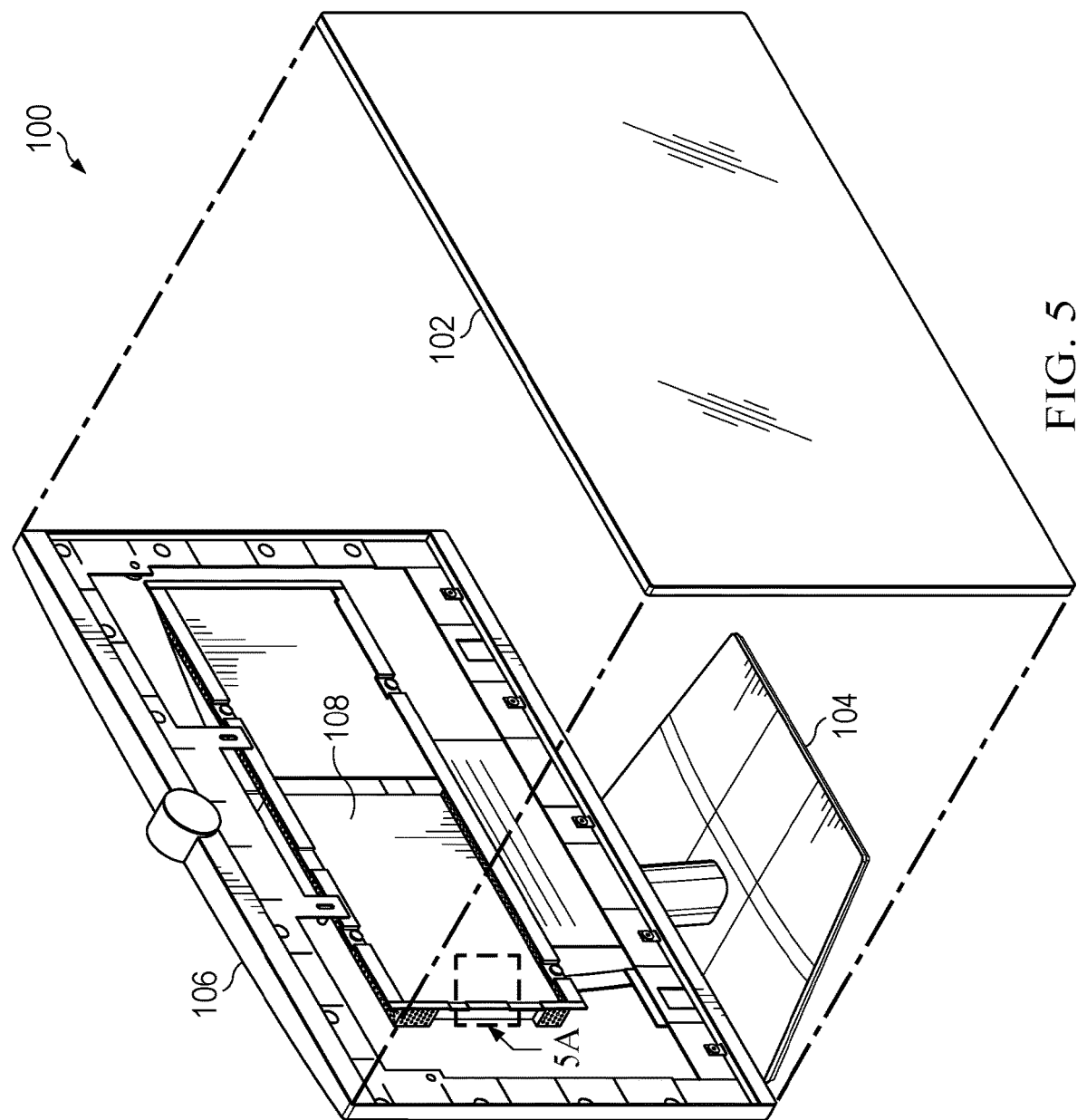
FIGS. 5, and 5A-5C depict an exploded view of a peripheral display that illustrates an example arrangement of display components that provide more efficient assembly for manufacture and disassembly for recycling.
Figure 5A:
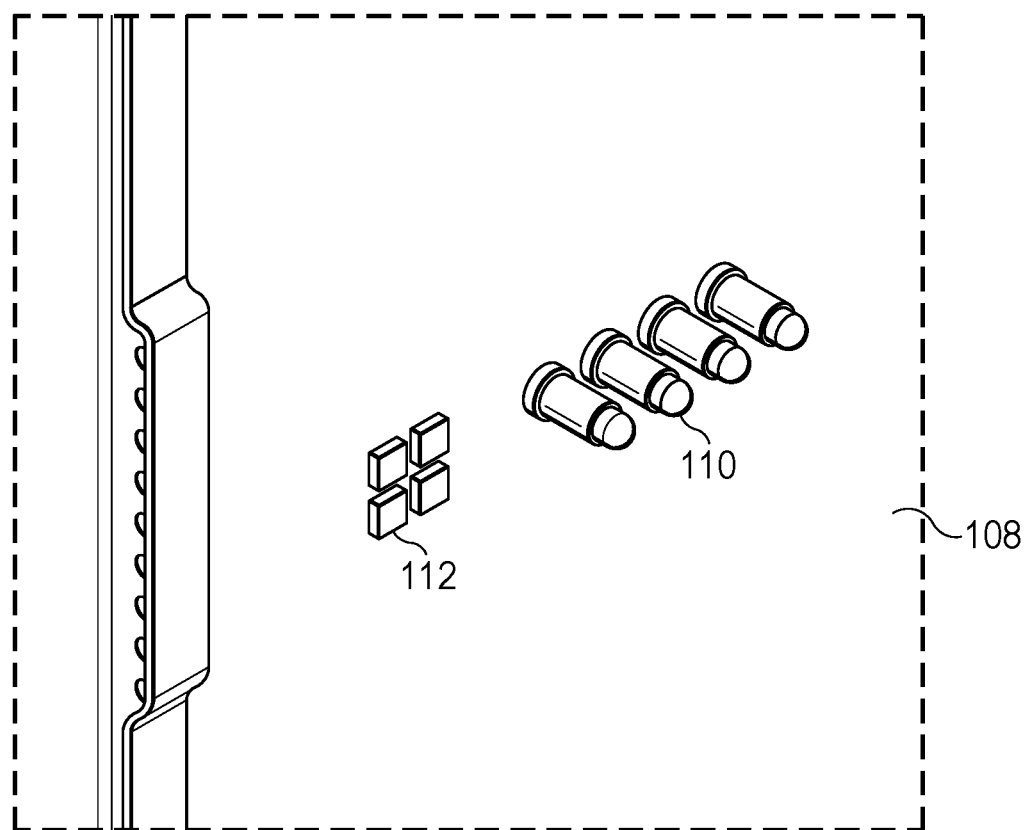
Figure 5B:
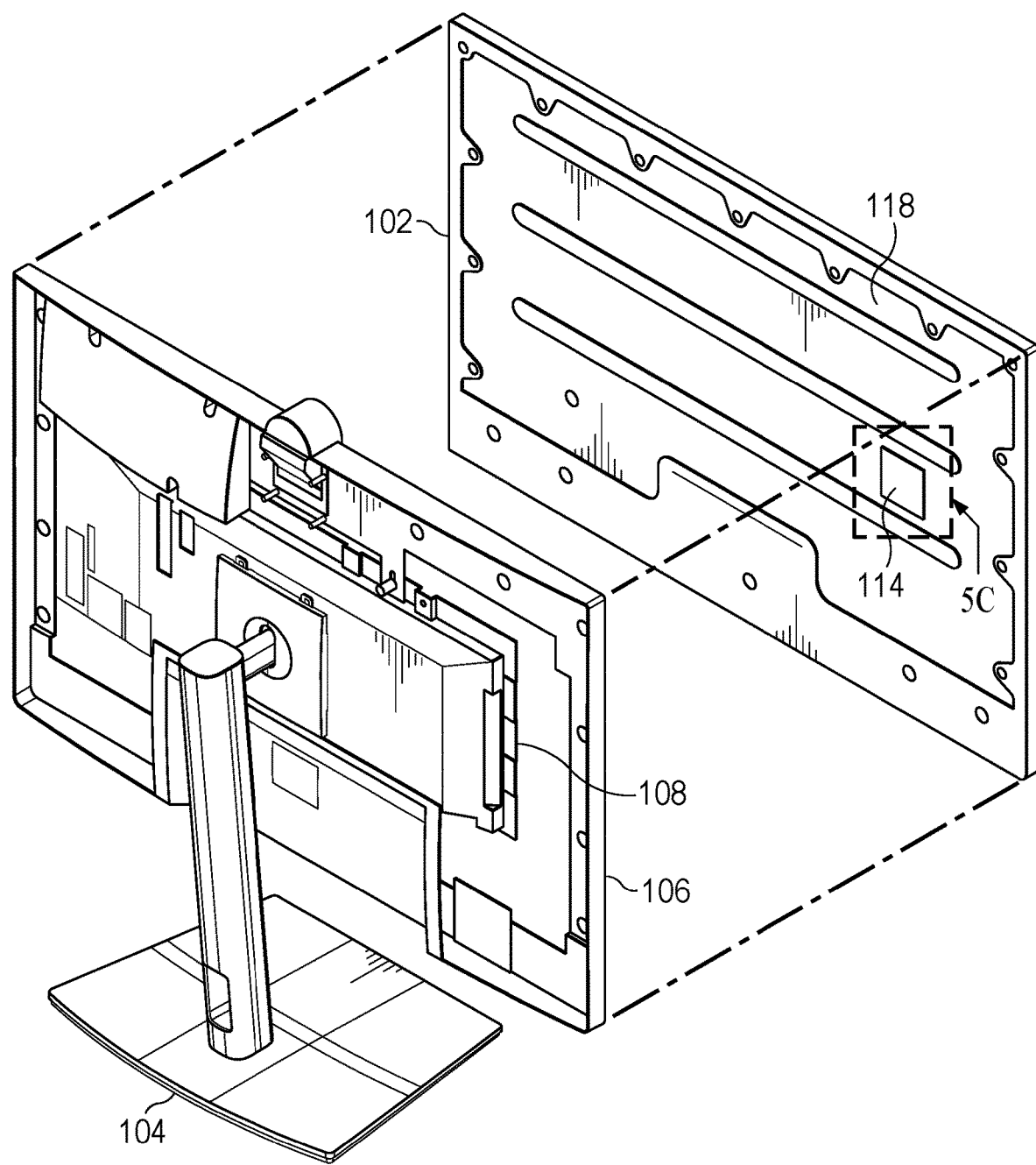
Figure 5C:
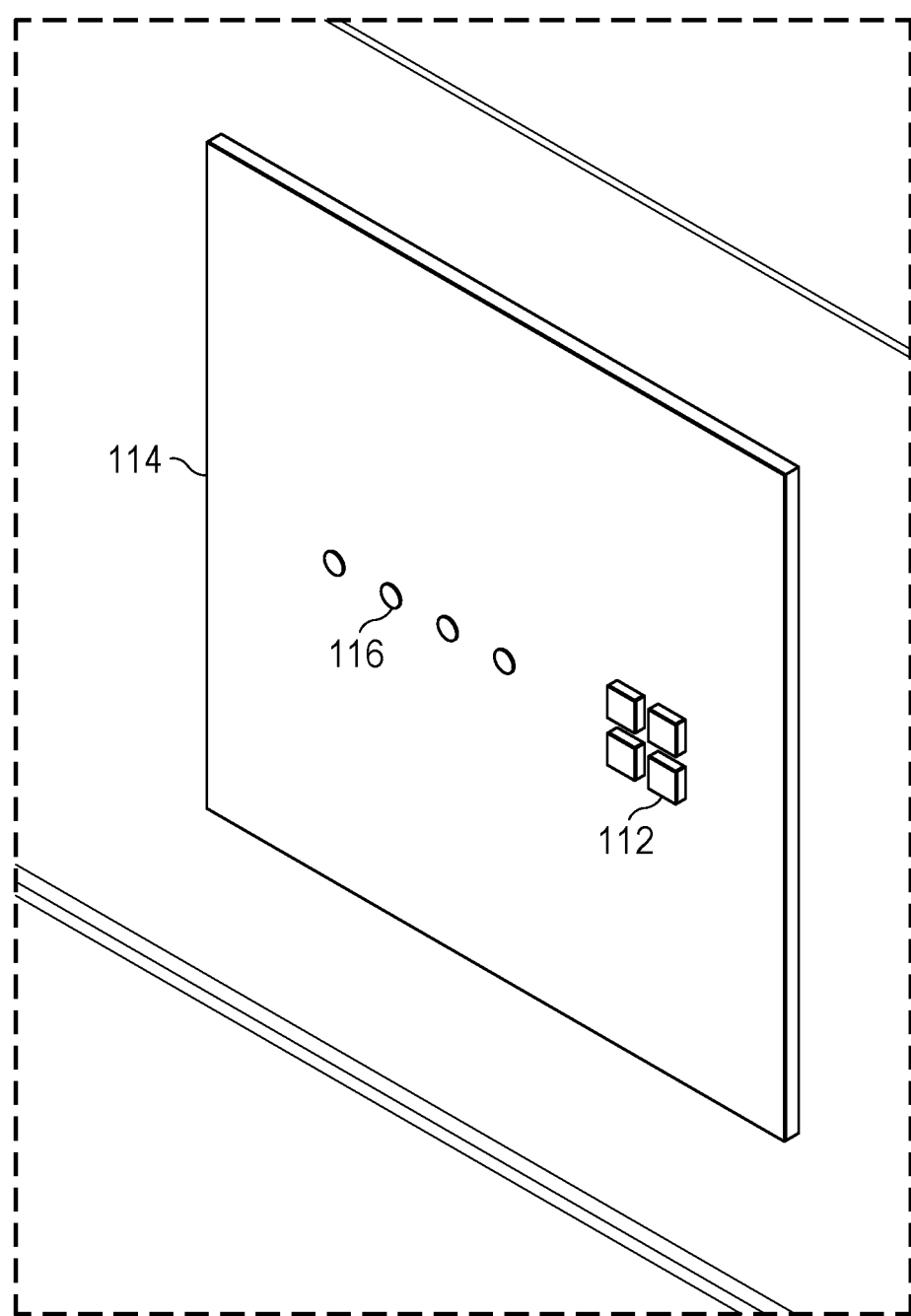

Referring now to FIGS. 5, 5A and 5B, an exploded view of a peripheral display illustrates an example arrangement of display components that provide more efficient assembly for manufacture and disassembly for recycling. To achieve simplified assembly and disassembly, a display panel 102 couples to a peripheral display frame with magnetic attachment and communicates with a scalar board to present visual images through a wireless contactless connector. The modular design assembles the components without adhesives and screws so that disassembly, repair and recycling is simpler and more cost effective. In the example embodiment of FIG. 5, peripheral display 100 holds a display panel 102 in a viewing position with a stand 104 and a frame 106. Display panel 102 aligns with frame 106 and couples into place over a scalar board 108 that receives and processes visual information from an information handling system to scan as pixel values to display panel 102. FIG. 5A depicts a detail view of scalar board 108, which has a set of pogo pins 110 with spring-loaded contact points that bias out from scalar board 108 and a contactless connector 112 that provides communication from scalar board 108 to display panel 102. For example, contactless connectors 112 are 60 GHz wireless radio transceivers, such as the MOLEX KSS104M and MSX60. FIG. 5B depicts a rear exploded view of peripheral display 100 having a metal backplate 118 and a control board 114 that supports power and information communication with scalar board 108. FIG. 5C depicts a detailed view of control board 114 having contact pads 116 that interface with the pogo pins to exchange power and ground and a contactless connector 112 to communicate with the scalar board contactless connector. The pogo pins, contact pads and contactless connectors align to communicate power and visual image information when magnets disposed in frame 106 couple to metal backplate 118 to hold display panel 102 in position on display stand 104, as described in greater detail below.

Figure 6:
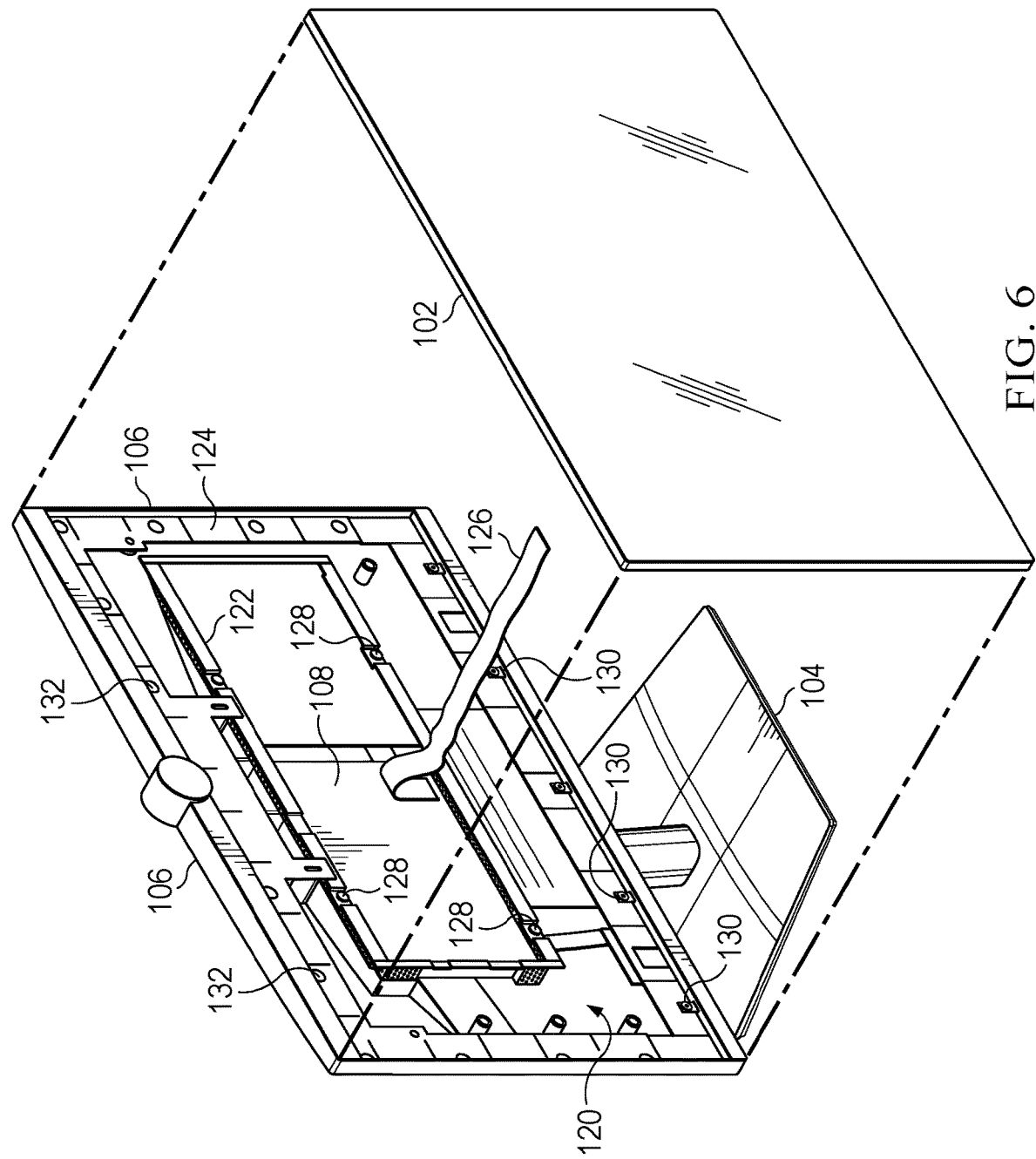
FIG. 6 depicts an exploded view of the peripheral display to illustrate an example with a cable visual image interface and magnets arranged at inner and outer circumferences to couple display panel to stand.

Referring now to FIGS. 6, an exploded view of peripheral display 100 illustrates an example with a cable visual image interface and magnets arranged at inner and outer circumferences to couple display panel 102 to stand 104. In the example embodiment, display panel 102 perimeter aligns with display frame 106 and a cable 126 provides a communication interface between scalar board 108 and display panel 102. A back cover 120 couples to the rear side of frame 106, such as with magnet force or other attachment techniques. When peripheral display 100 fails, the failure is typically with one of the display panel or the scalar board/power system. Thus, to improve serviceability and recyclability, display panel 102 and display stand 104 are coupled by magnets 128, 130 and 132 disposed in display stand 104. A first set of magnets 128 are disposed on metal cage 122 that is around the perimeter of scalar board 108. A second set of magnets 130 are disposed along the bottom perimeter of frame 106. A third set of magnets 132 are disposed along the sides and top perimeter of frame 106. The arrangements of magnets provide a strong magnetic attraction force to the display panel steel rear side to hold display panel 102 in place, but allows disassembly of display panel 102 by prying the display panel away from the frame 124.

Figure 7:
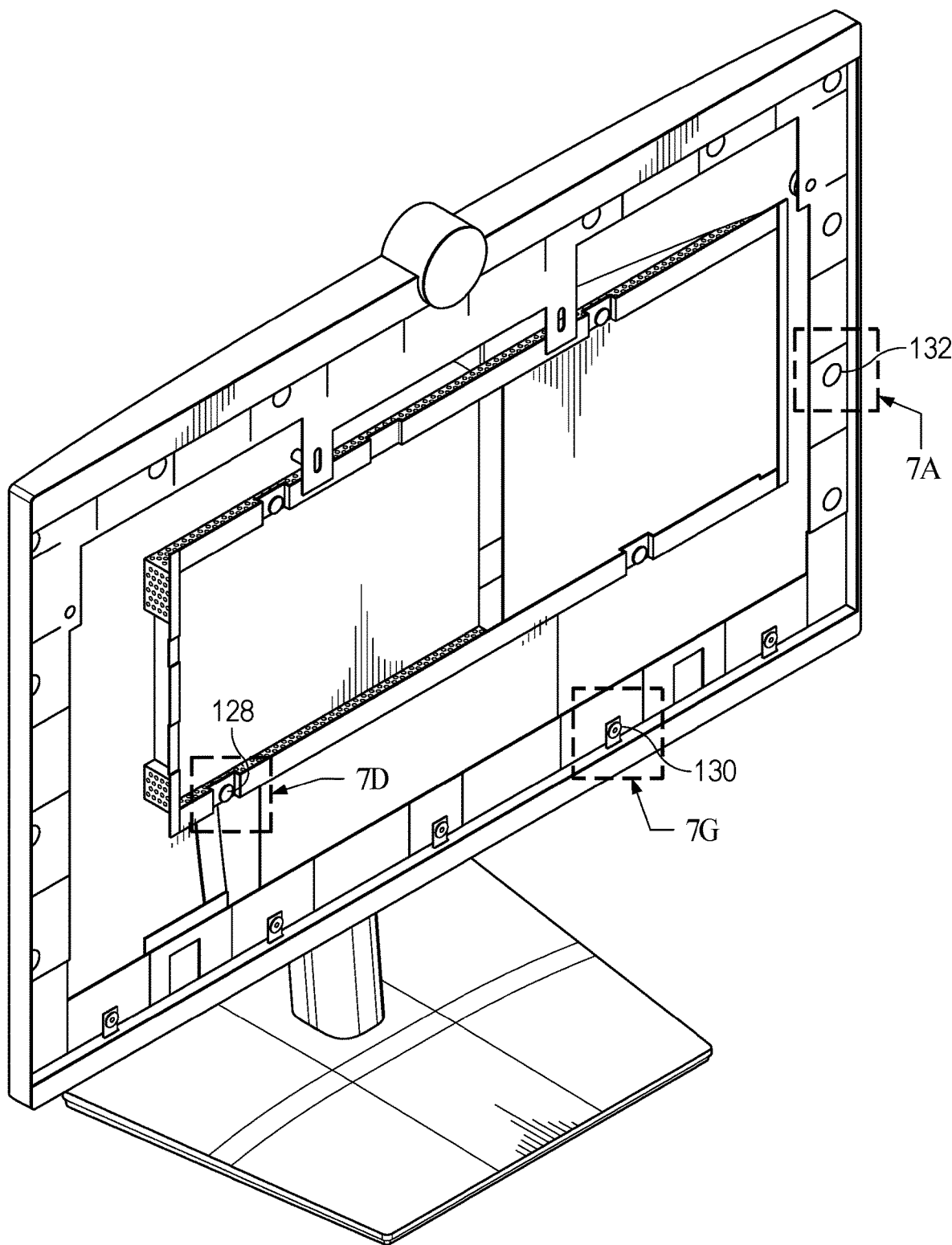
FIGS. 7 and 7A through 7I depict detailed views of magnet installation in the peripheral display.
Figure 7A:
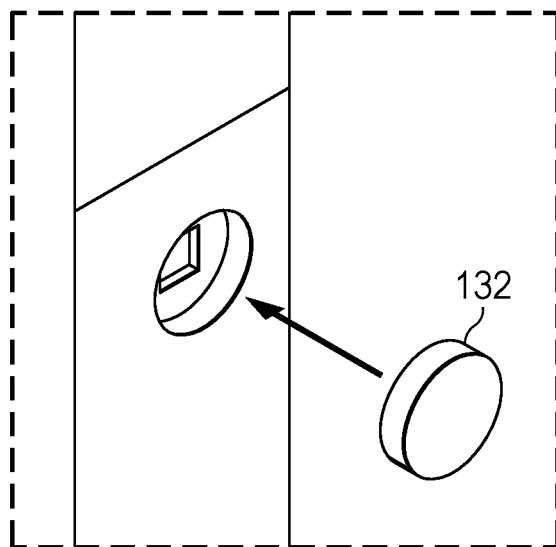
Figure 7B:
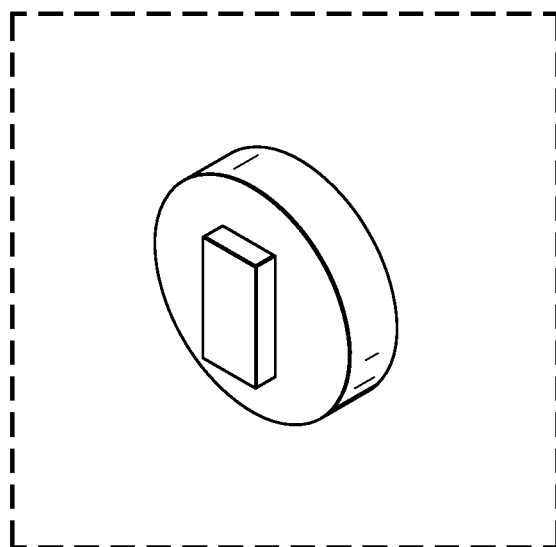
Figure 7C:
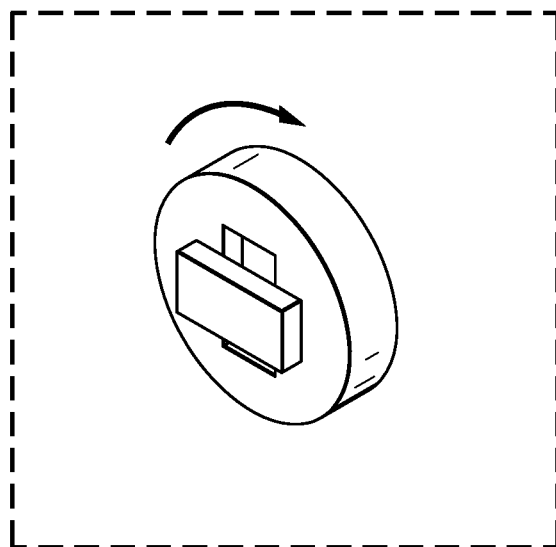
Figure 7D:
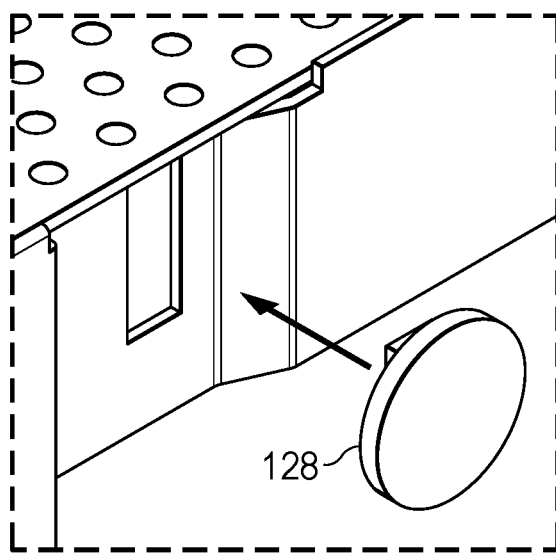
Figure 7E:
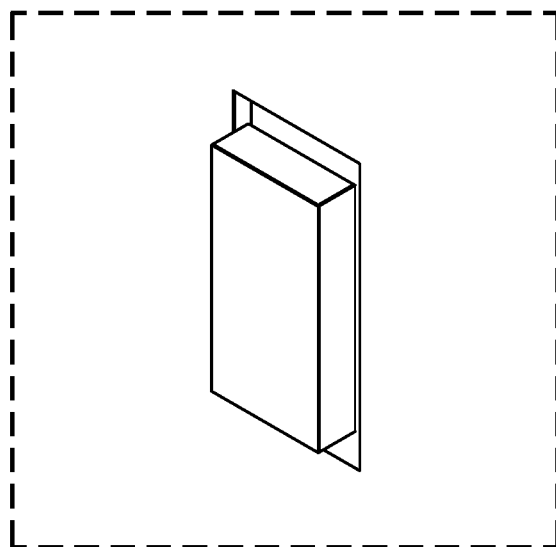
Figure 7F:
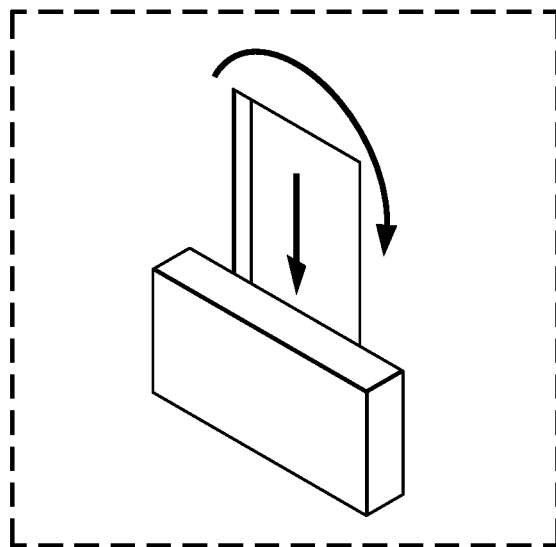
Figure 7G:
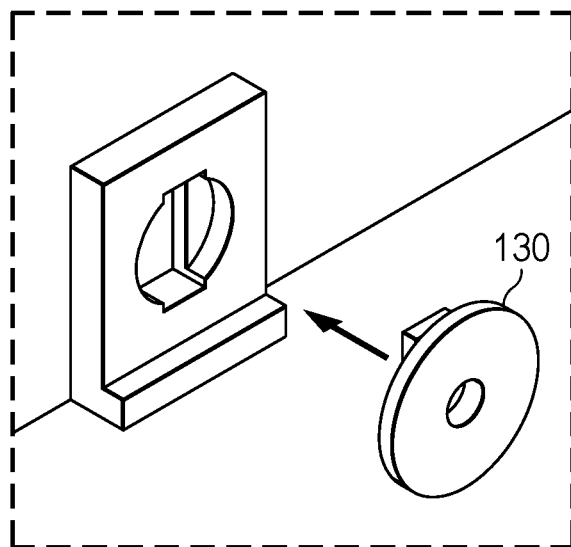
Figure 7H:
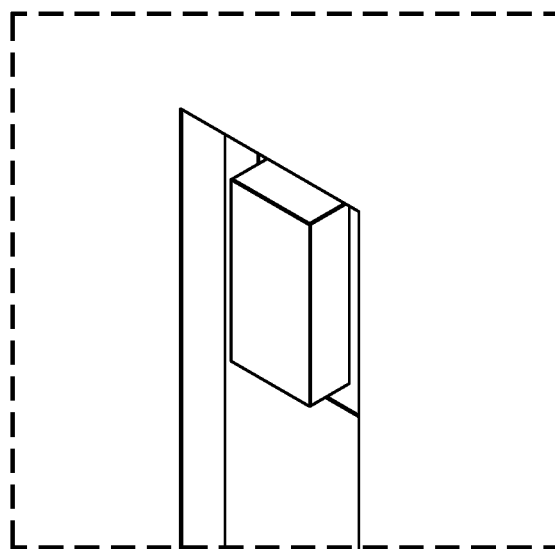
Figure 7I:
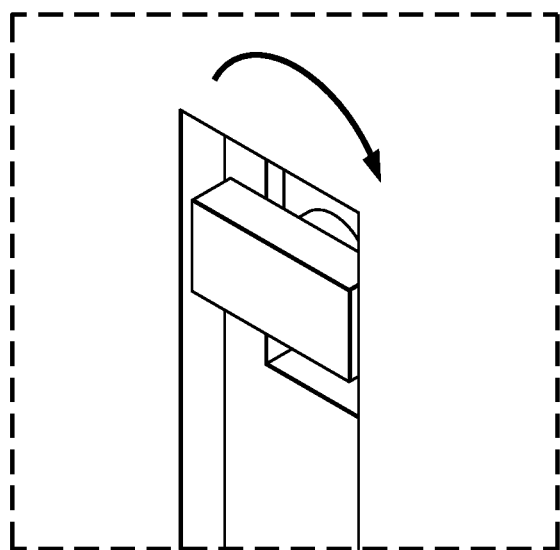

Referring now to FIGS. 7 and 7A through 7I, detailed views of magnet installation in peripheral display 100 are depicted. A first set of magnets 128 couple to a metal frame surrounding the scalar board and power board within the display stand. FIG. 7D illustrates that magnet 128 inserts into a slot opening formed in the metal frame within a recess so that magnet 128 will couple in place in the same plane as the metal frame. FIG. 7E depicts a rear rectangular member extending from the back side of magnet 128 through the slot of the metal frame. FIG. 7F depicts a 90 degree rotation and downward sliding movement of magnet 128 to couple in place at the lower side of the frame. Magnets 130 disposed along the bottom side of the perimeter of the display frame have a circular shaped central opening and rest on an extension outward from the display frame. FIG. 7G depicts insertion of a member at the back side of magnet 130 into a slot of the display frame. FIG. 7H shows magnet 130 from behind the display frame with the member inserted in the slot. FIG. 7I shows magnet 130 from behind with a rotation of 90 degrees to hold the member in place. Magnets 132 disposed along the sides and top of the frame have a circular shape and fit within a circular recess formed in the frame. FIG. 7A depicts insertion of magnet 132 into a slot formed in the recess. FIG. 7B depicts insertion of the member into the slot and FIG. 7C depicts rotation of the magnet and member to couple magnet 132 to the frame. In some instances, when the display panel couples tightly to the display frame, rotation of the member and magnet to rotate the member in alignment with the slot can reduce the magnetic attraction to help remove the display panel by releasing the magnet to pull off from the display panel.

Figure 8:
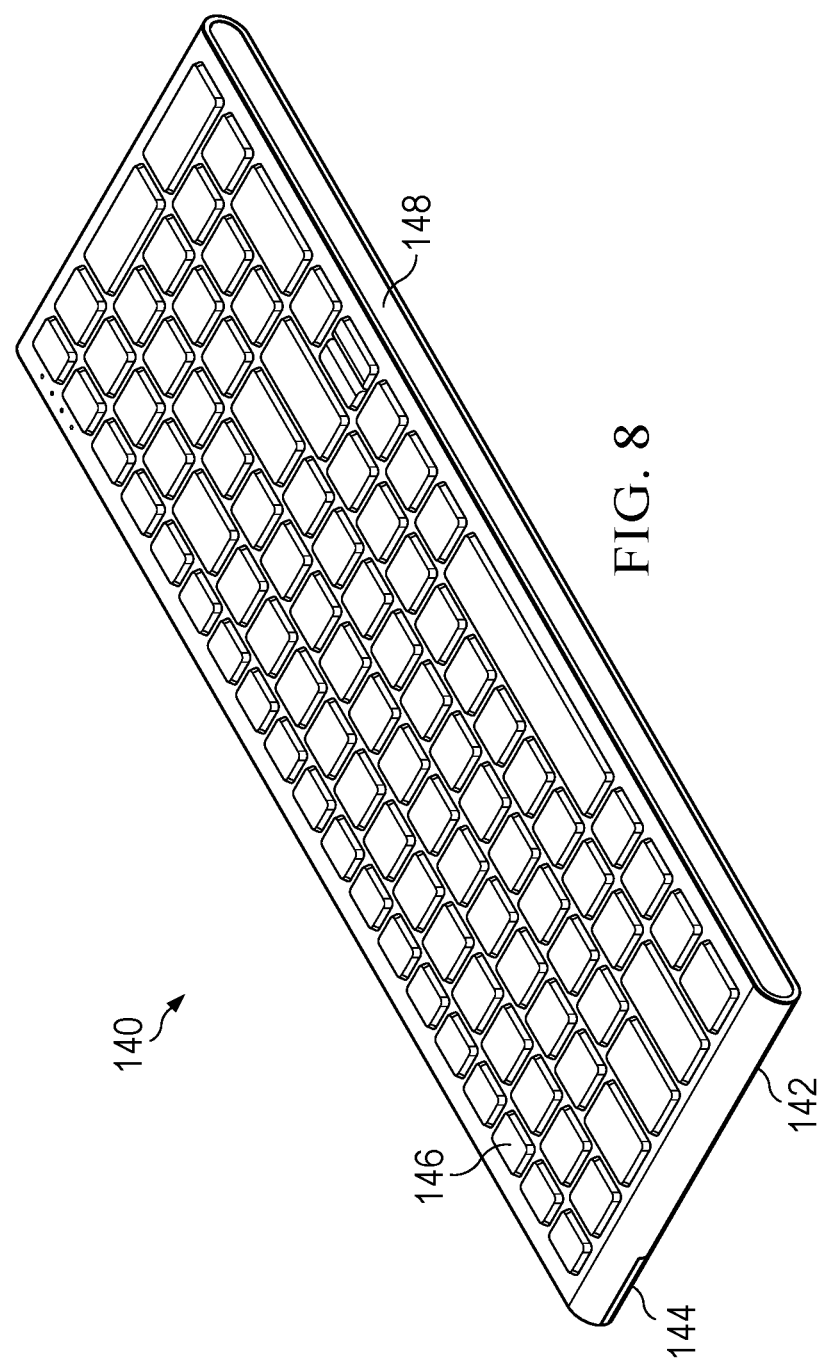
FIG. 8 depicts a front perspective view of a wireless keyboard having components assembled without screws and adhesive to simplify manufacture and enhance recyclability.

Referring now to FIG. 8, a front perspective view depicts a wireless keyboard 140 having components assembled without screws and adhesive to simplify manufacture and enhance recyclability. Wireless keyboard 140 is constructed in an aluminum extruded housing 142 that is extruded through a mold defining an elongated tube having a front and rear opening. Keys 146 of an underlying keyboard module extend out from housing 142 to accept end user inputs that are wirelessly communicated to an information handling system. A cover 148 couples to the front opening to protect the interior of housing 142. A bottom cover 144 provides access to electronic components within housing 142. The openings for bottom cover 144 and keys 146 may be die cut, laser cut, or otherwise cut out of the extrude housing.

Figure 9:
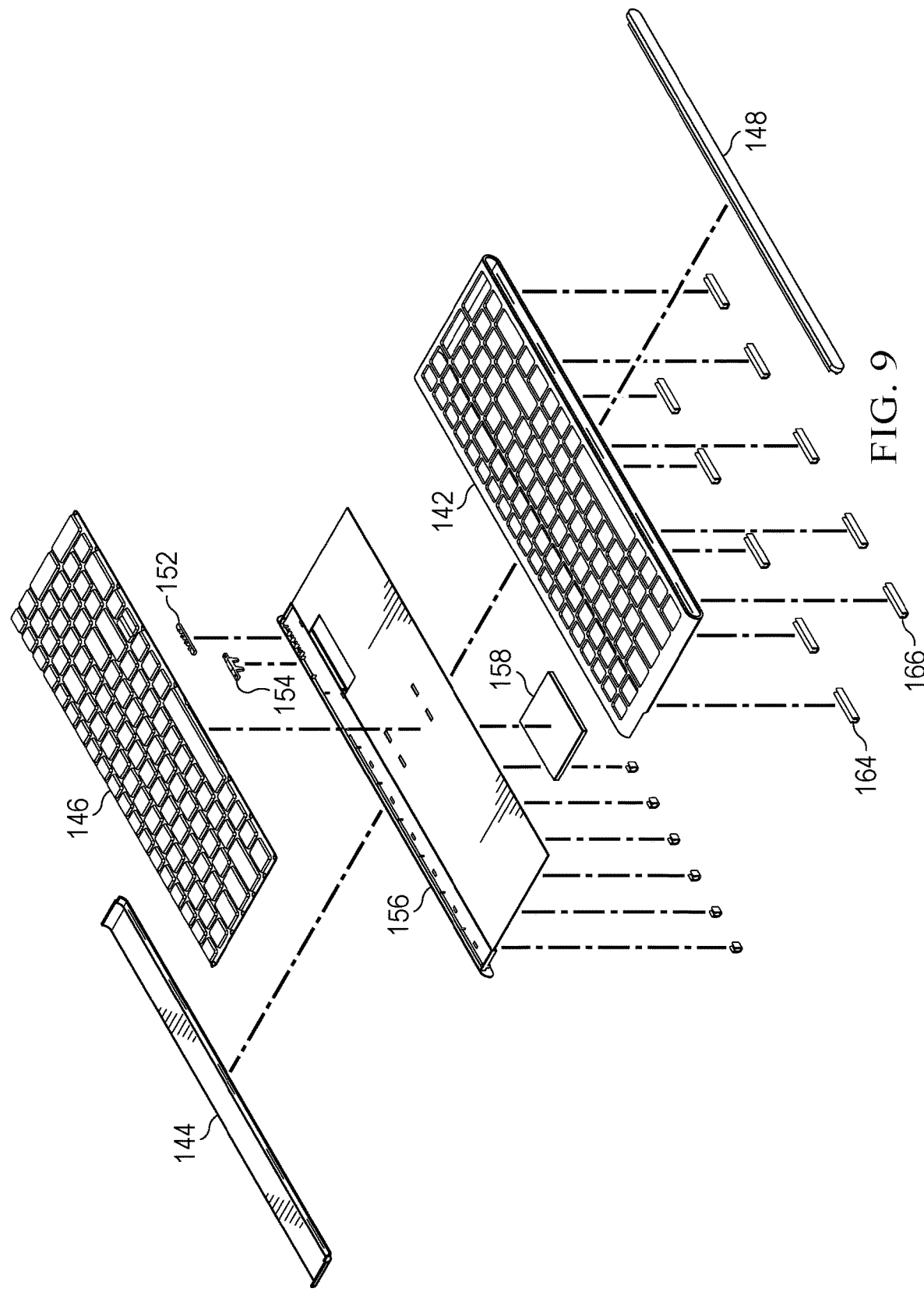
FIG. 9 depicts exploded front upper perspective view of the wireless keyboard having components assembled without screws or adhesives.

Referring now to FIG. 9, an exploded front upper perspective view depicts the wireless keyboard 140 having components assembled without screws or adhesives. Keyboard module 140 extends keys 146 upward that are part of a conventional keyboard module having, for example, keys biased away from a membrane by a rubber dome. The keyboard module is supported by a plastic tray 156 that slides in extruded aluminum housing 142 and couples against front cover 148 to have a rigid support surface that accepts typed inputs. A sliding power button 154 accepts power switch inputs to turn the keyboard electronics on and off by translating sliding motion to a circuit board on the bottom of plastic tray 156. A plastic LED light guide 152 directs LED illumination from the circuit board to the upper side of the keyboard. Plastic tray 156 has a cover on a rear side that couples into the rear opening of housing 142 when the tray slides into the housing from the rear side. Bottom cover 144 is a plastic material that covers electronic components coupled to the bottom side of plastic tray 156. Rubberized feet 164 and 166 fit through openings in the bottom of housing 142 by snapping in place or, as is described below, coupled in place with C-clips that slide on and off.

Figure 10:
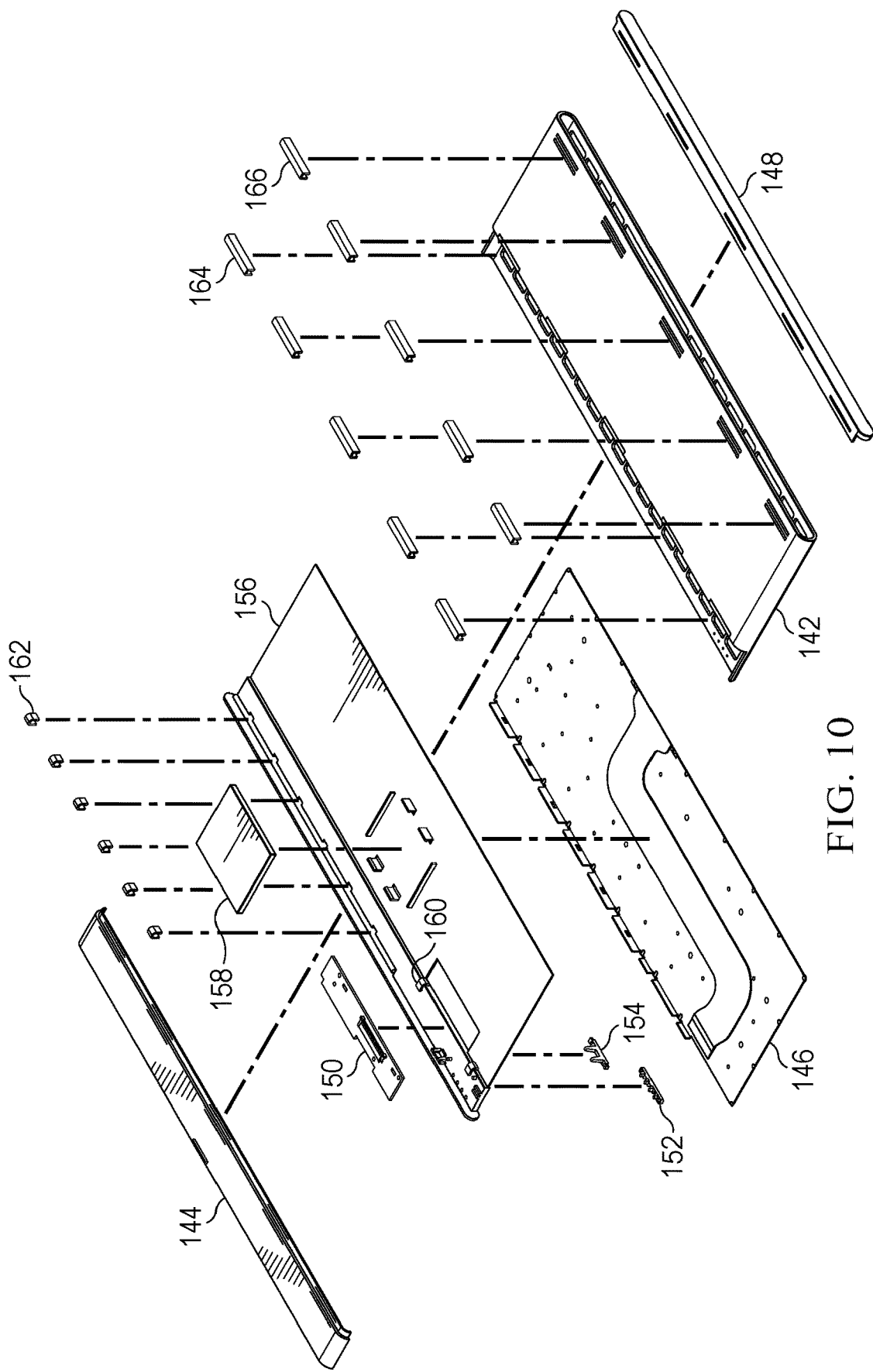
FIG. 10 depicts an exploded front bottom perspective view of the wireless keyboard having components assembled without screws or adhesives.

Referring now to FIG. 10, an exploded front bottom perspective view depicts the wireless keyboard 140 having components assembled without screws or adhesives. A printed circuit board having components that support wireless communication couples to the bottom side of plastic tray 156 and is held in place by C-clips 160 in a location to engage with sliding power button 154 and light guide 152. C-clips 160 and 162 are plastic to allow recycling of the assembled plastic parts and remove with a sliding motion so that removal of the components has minimal effort. A battery 158 clips on the bottom side of plastic tray 156 with C-clips.

The keyboard module bottom side has extensions into plastic tray 156 that are coupled in place by C-clips. Plastic feet 166 and rubber covers 164 are formed as elongated C-clips that couple to opening cut in housing 142 and engage with front cover 148 to hold it in place. Rubber covers 164 may be double shot injected to form a single piece or separately coupled in place by a C-clip form. Front cover 148 has a ledge that inserts inwards and under plastic tray 156 to support plastic tray 156 from below against keyboard press inputs.

Figure 11A:
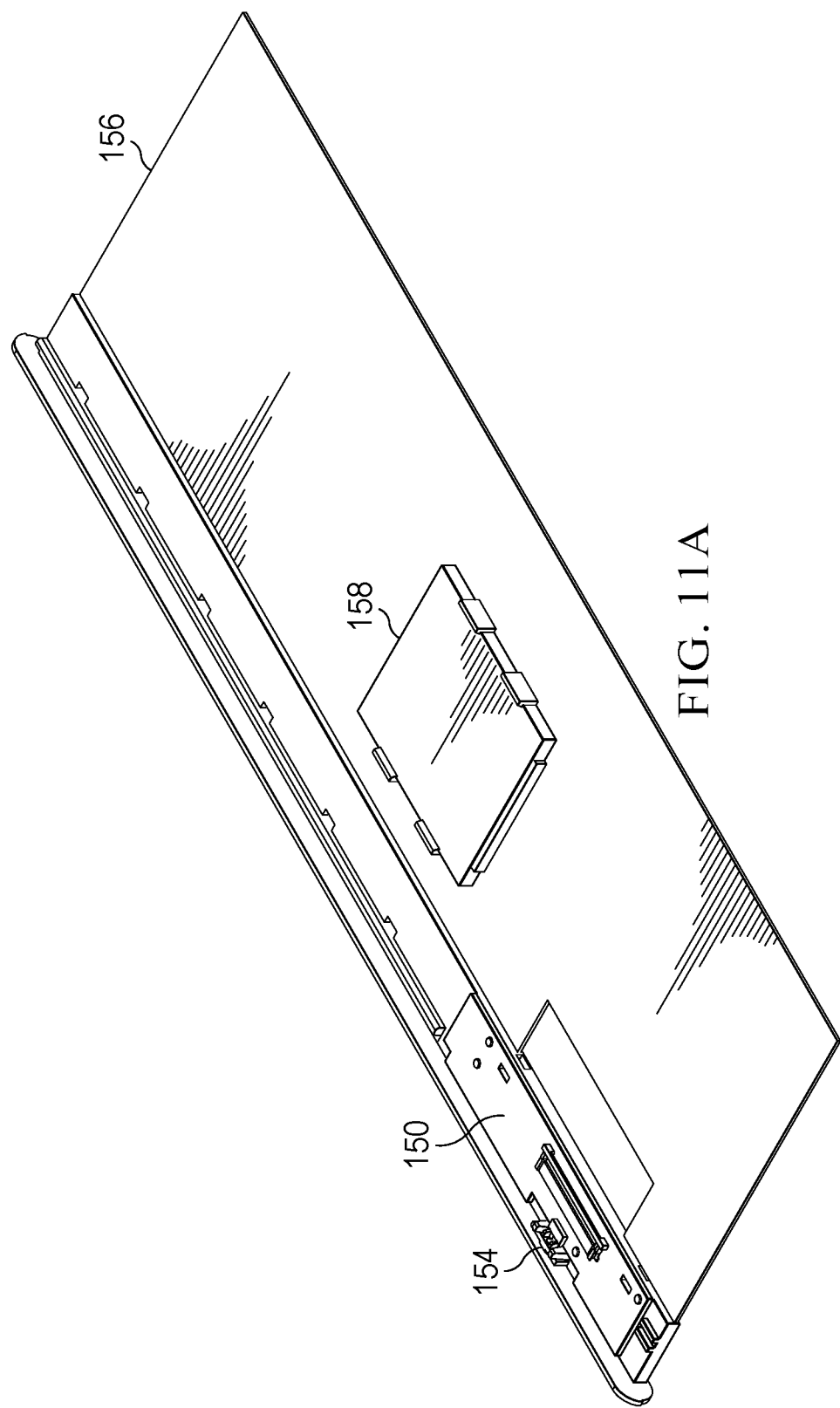
Figure 11B:
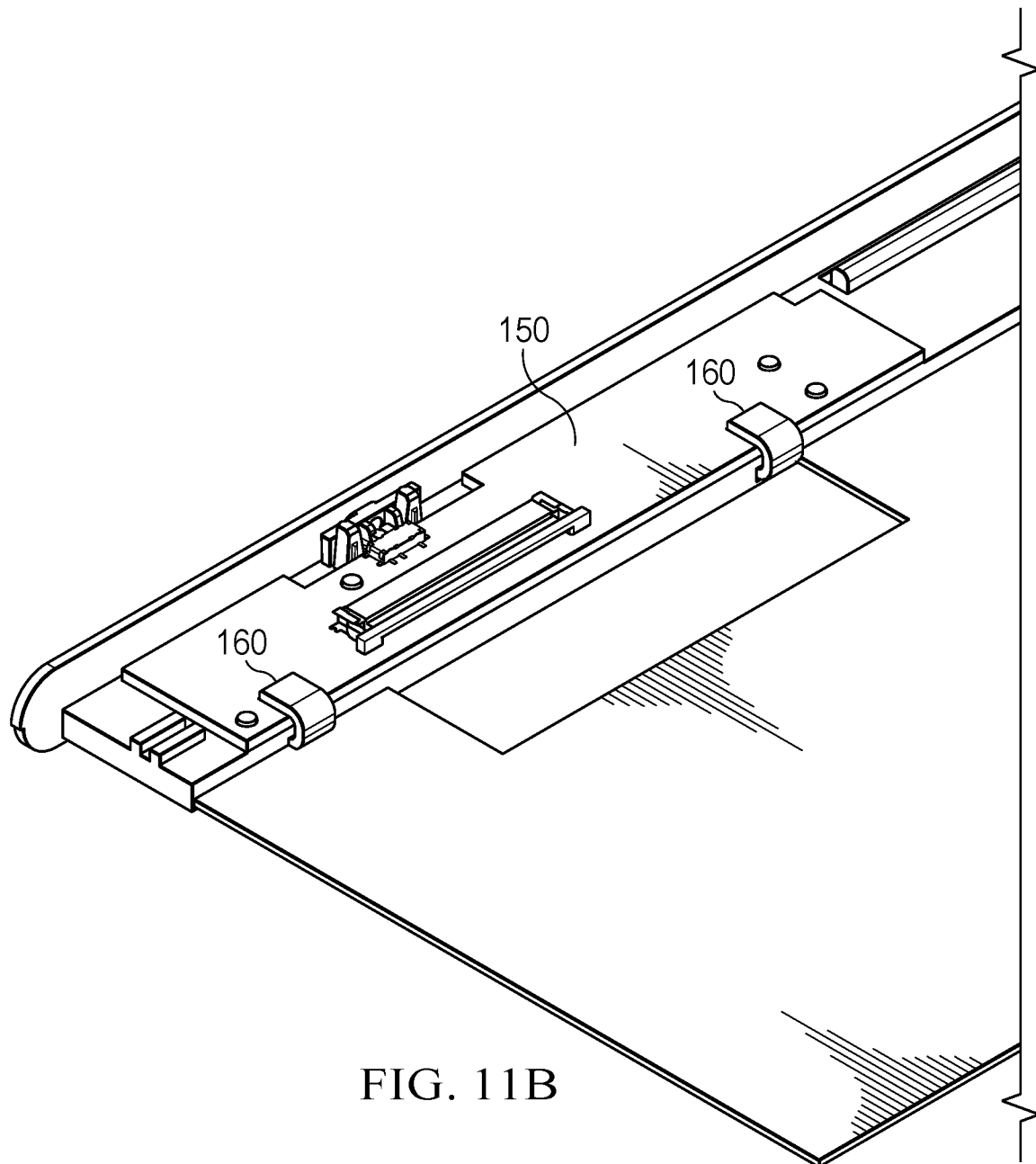
Figure 11D:
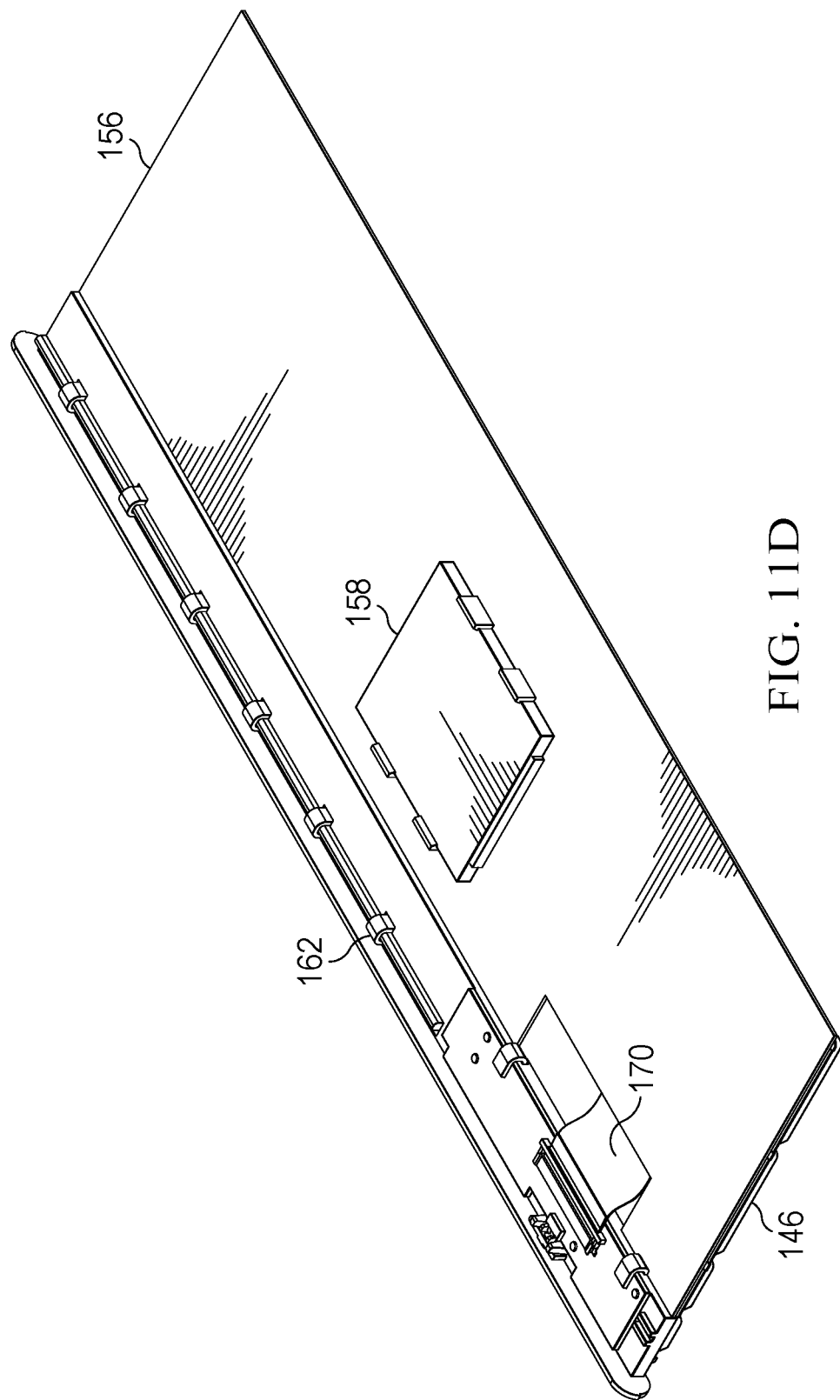
Figure 11E:
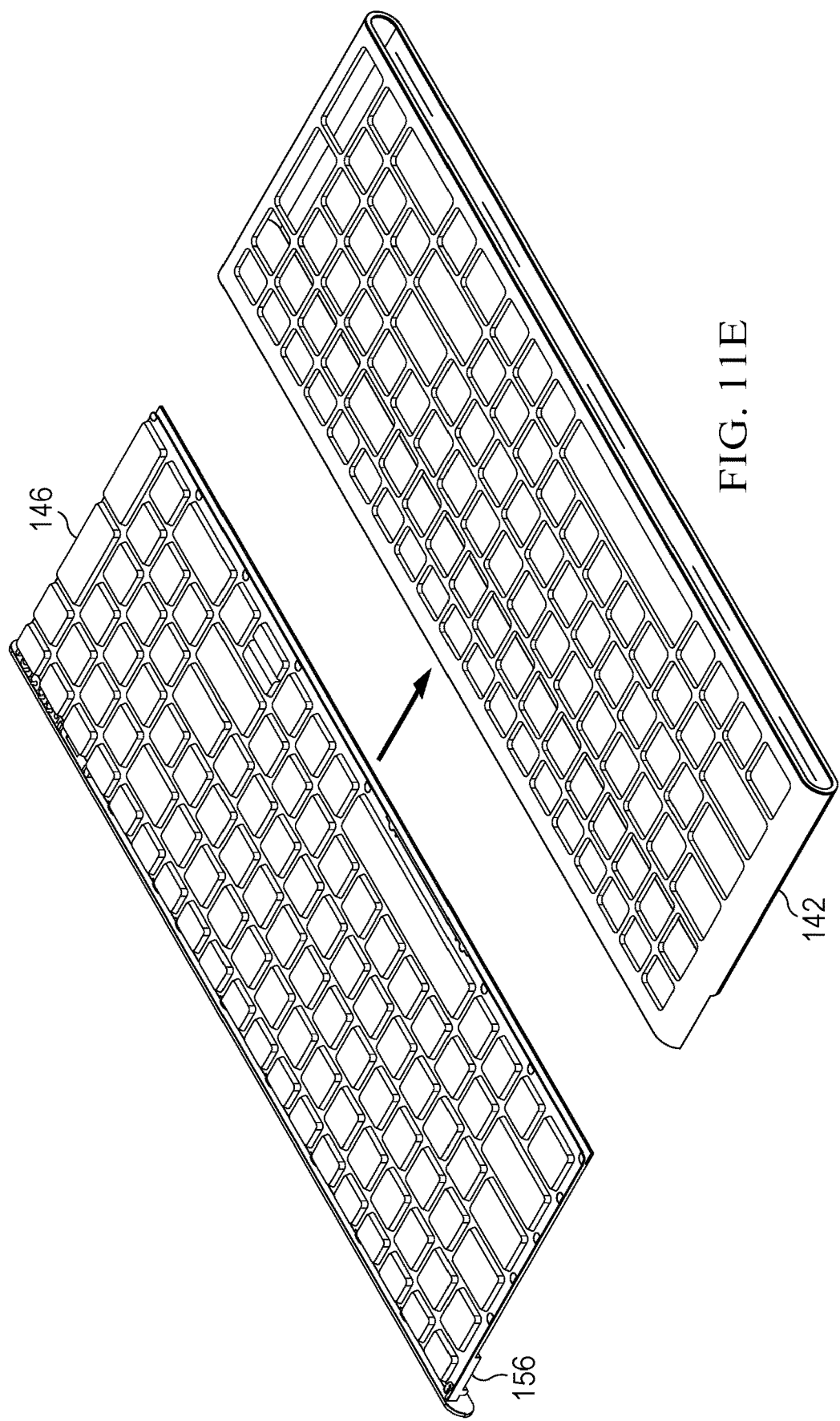

Referring now to FIGS. 11A through 11E, an example of assembly of the wireless keyboard 140 is depicted. FIG. 11A depicts coupling a battery 158 to a bottom side of plastic tray 156, such as with C-clips or plastic snaps integrated in the tray bottom side. Printed circuit board 150 couples to plastic tray 156, such as with C-clips, and engages with power switch 154. FIG. 11B depicts a detailed view of plastic C-clips that couple printed circuit board 150 to a lowered ledge of plastic tray 156. The C-clips have a lip on each of the opposing inner walls to engage with a recess feature of the circuit board or lowered ledge. FIG. 11C depicts the plastic tray 156 turned right side up so that the upper surface provides support to keyboard module 146 with an opening of plastic tray 156 arranged to pass through a cable of keyboard module 146. FIG. 11D depicts a bottom perspective view of plastic tray 156 with keyboard cable 170 coupled to the printed circuit board and plastic C-clips that pass into slots of keyboard module 146 to hold the keyboard module on the plastic tray upper surface. Once keyboard module 146 is coupled to plastic tray 156, the assembled subunit is slid into the rear opening of housing 142 until the rear cover couples into and closes the rear opening, as depicted by FIG. 11E. The keyboard assembly completes by coupling the front cover to the keyboard housing as shown in FIG. 8.

Figure 12:
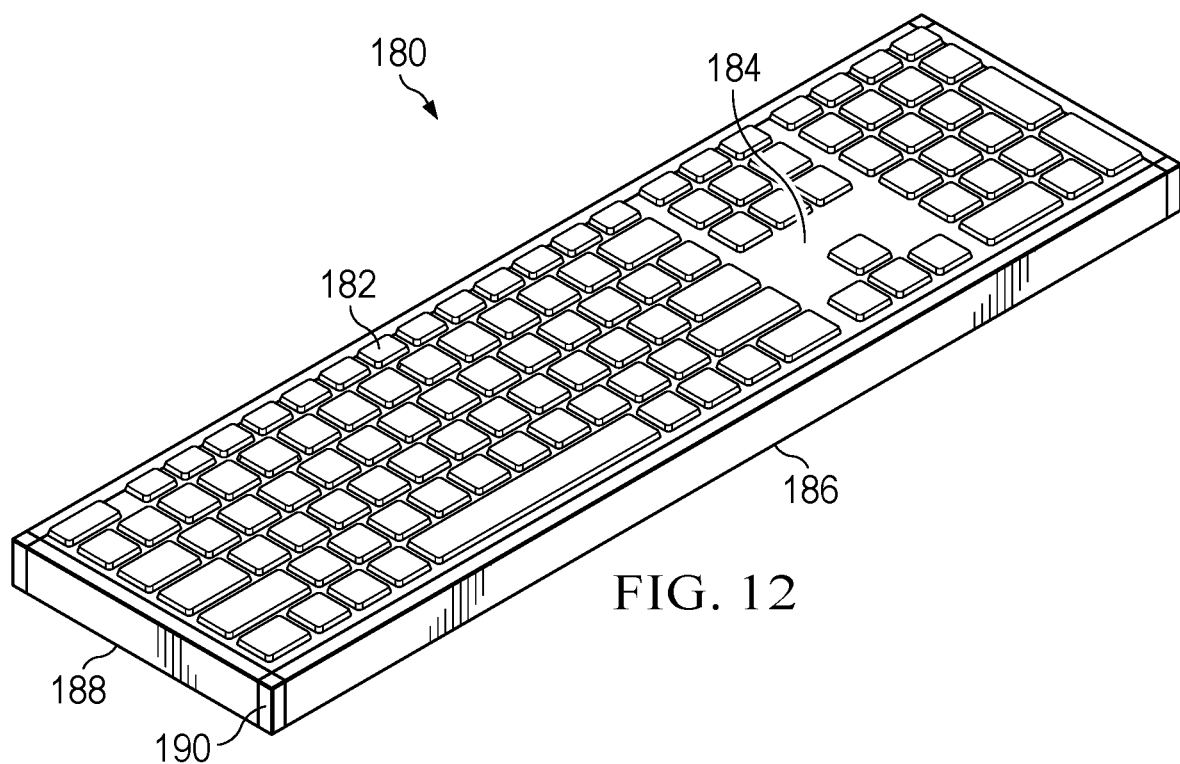
FIG. 12 depicts an alternative embodiment of a keyboard having components assembled without the use of screws and adhesives.

Referring now to FIG. 12, an alternative embodiment of a keyboard 180 has components assembled without the use of screws and adhesives. In the alternative example embodiment, a plastic housing 184 supports a keyboard module 182 with extruded aluminum rails 186 and 188 that fit into rail guides on all four sides and that are held in place by corner stopper caps 190. As with the example embodiment of FIG. 9, keyboard 180 may be configured to communicate with an information handling system wirelessly or through a cable. The extruded aluminum rail is released by removing the corner stopper caps 190 so that the keyboard can be disassembled to recycle or reuse. The keyboard components are assembled without the use of screws or adhesives.

Figure 13:
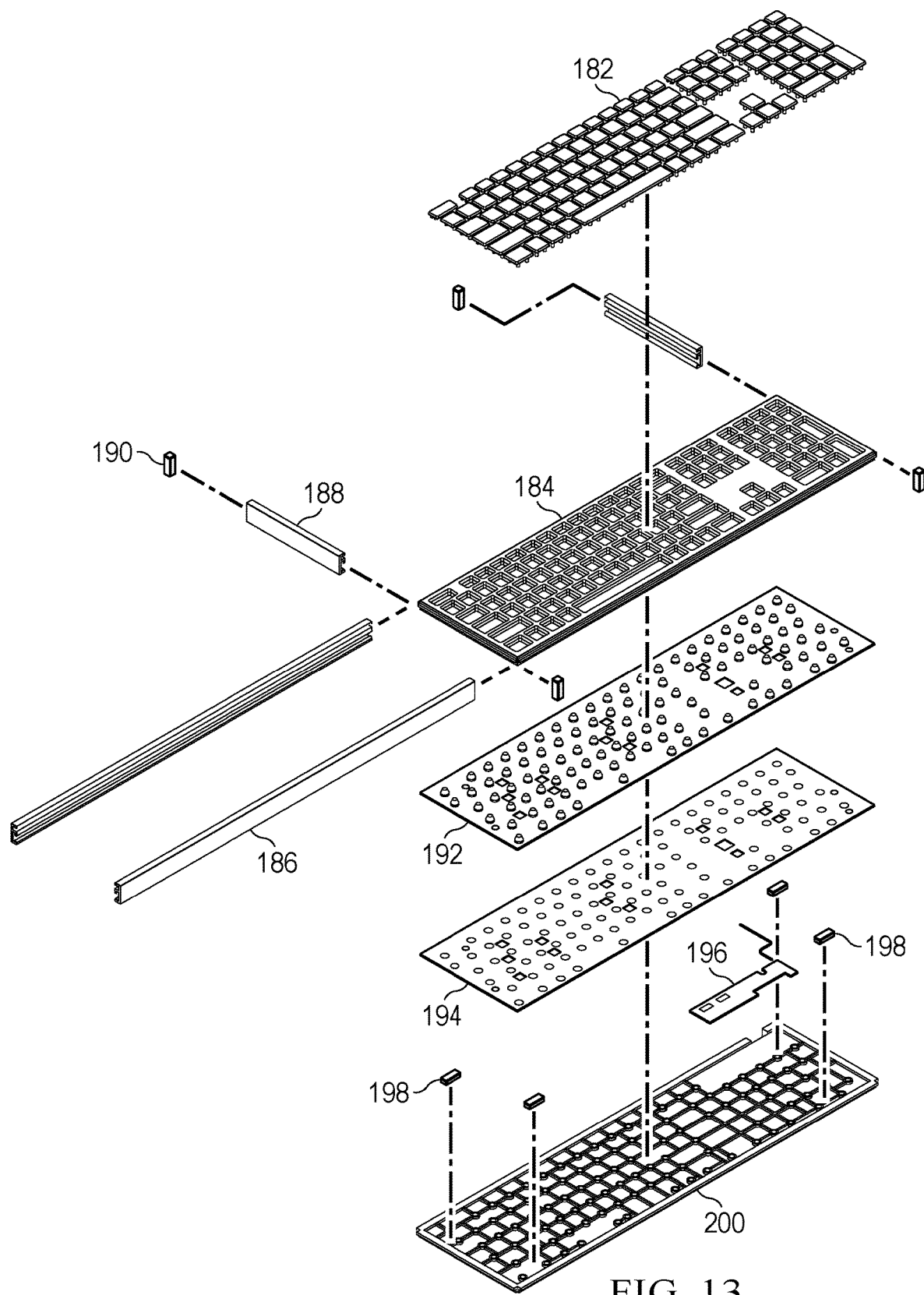
FIG. 13 depicts a front perspective exploded view of a keyboard having components assembled without the use of screws or adhesives.

Referring now to FIG. 13, a front perspective exploded view depicts a keyboard 180 having components assembled without the use of screws or adhesives. A plastic molded housing 184 has openings to accept keys of a keyboard module 182 and has rail guides formed along all four sides that accept aluminum extruded front and rear rails 186 and side rails 188. A plastic bottom cover 200 aligns with the openings of housing 184 to provide a support for membrane 194 that detects key touches and a rubber dome sheet 192 that provides an upward biasing mechanism for keys of keyboard module 182. A printed circuit board 196 couples to the base of bottom cover 200 and interfaces with membrane 194 to receive and communication key inputs to an information handling system, such as with BLUETOOTH wireless signals or a USB wired interface. Feet 198 couple to the bottom cover to support the bottom cover over a support surface. Corner stopper caps 190 couple to each corner of keyboard 180 at the intersection of the rails to hold the rails in place. To break down the keyboard, such as for recycling or reuse, corner stopper caps 190 are removed to release the front, rear and side rails. Once the rails are removed, the keyboard physical layers pull apart.

Figure 14A:
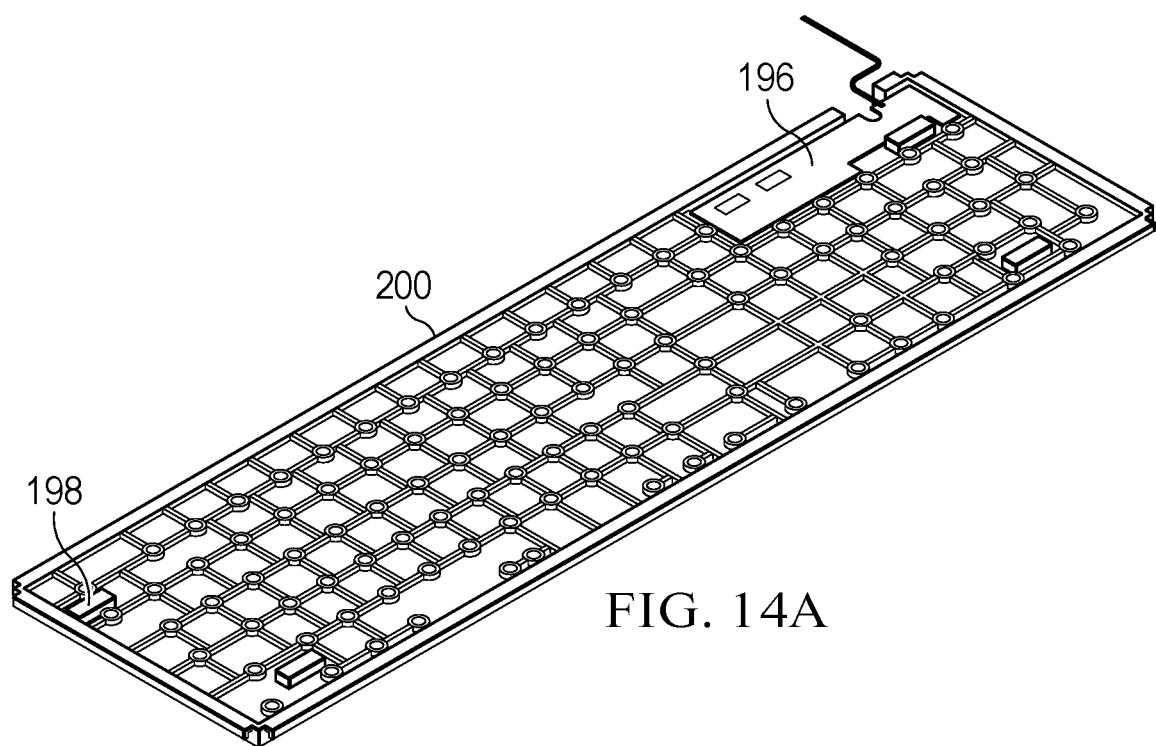
Figure 14B:
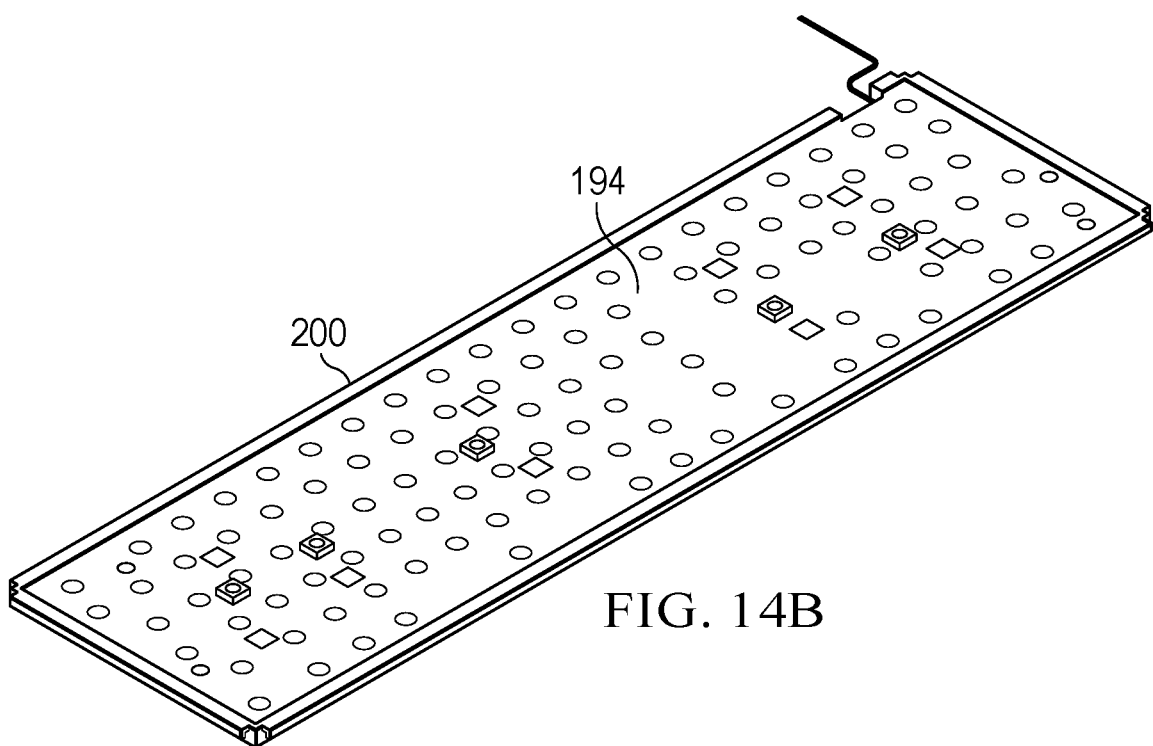
Figure 14C:
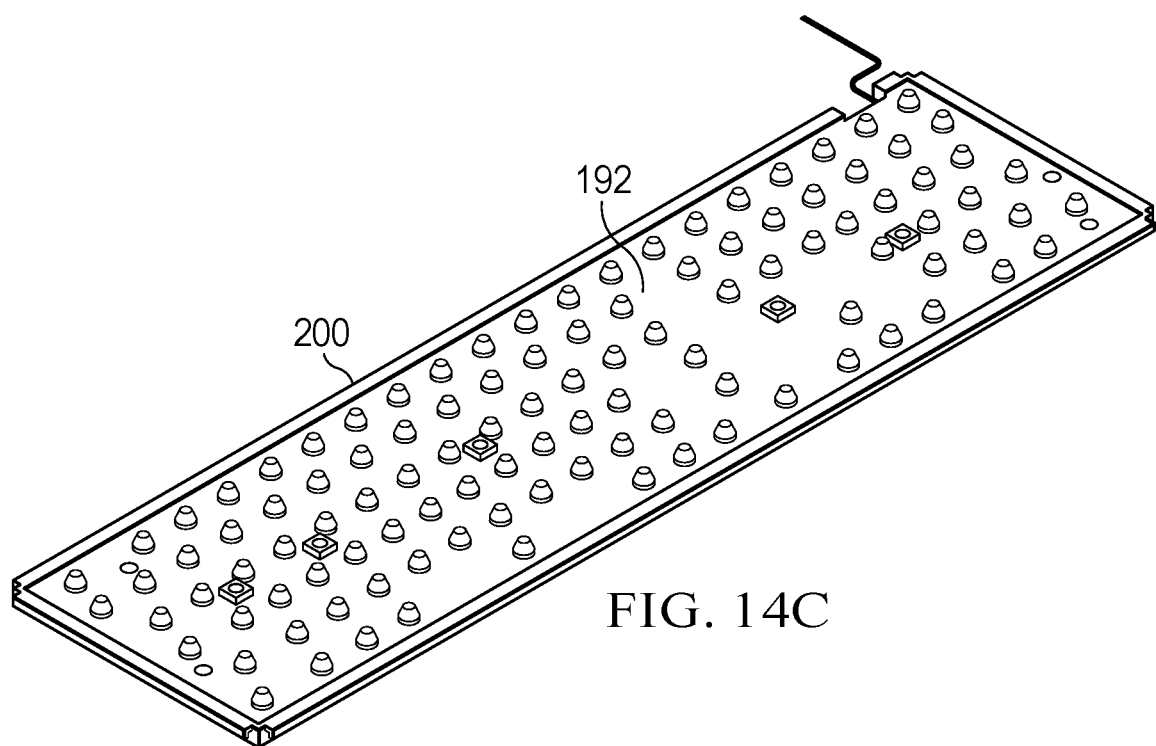
Figure 14D:
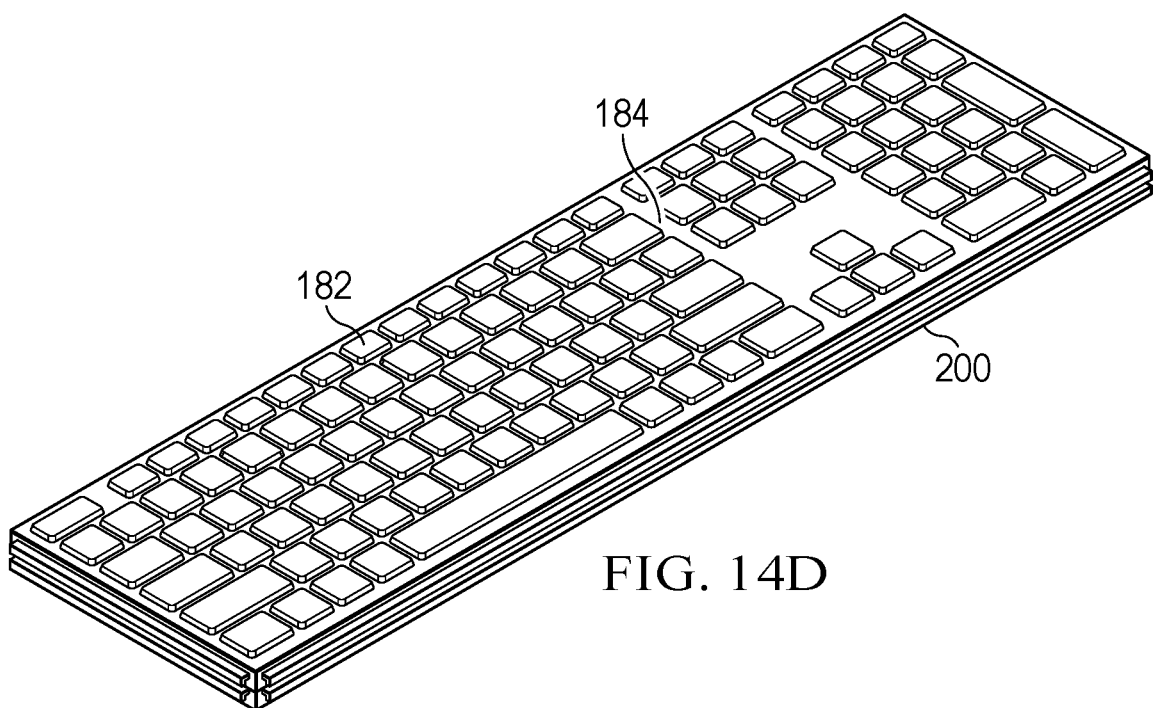

Referring now to FIGS. 14A through 14I, an example of assembly of the alternative keyboard embodiment is depicted. FIG. 14A depicts plastic bottom cover 200 having a rubber foot 198 inserted at each corner. Printed circuit board 196 couples to the bottom cover 200, such as with snaps or with C-clips. Alternatively, the printed circuit board is positioned by a structure of the bottom cover and held in place by compression at final assembly of the keyboard. In the example embodiment, printed circuit board 196 has a contact connector exposed on the upper side that interfaces with the membrane so that a cable is not needed. FIG. 14B depicts the membrane 194 placed over the bottom cover 200 and aligned by structures extending upwards and through openings of membrane 194. FIG. 14C depicts a rubber dome sheet 192 placed over membrane 194 and having a rubber dome at the location of each keyboard key to bias the keyboard key away from the underlying membrane 194 that detects key presses. Once the subassembly for the bottom portion of the keyboard is assembled, an upper subassembly is built that couples over the bottom portion. The keyboard module 182, which in this example is a set of plastic keycaps, is snapped in place over the housing 184. FIG. 14D depicts the upper assembly of keyboard membrane 182 and housing 184 placed over top of the bottom cover 200 with the assembled contact membrane and rubber dome membrane.

Figure 14F:
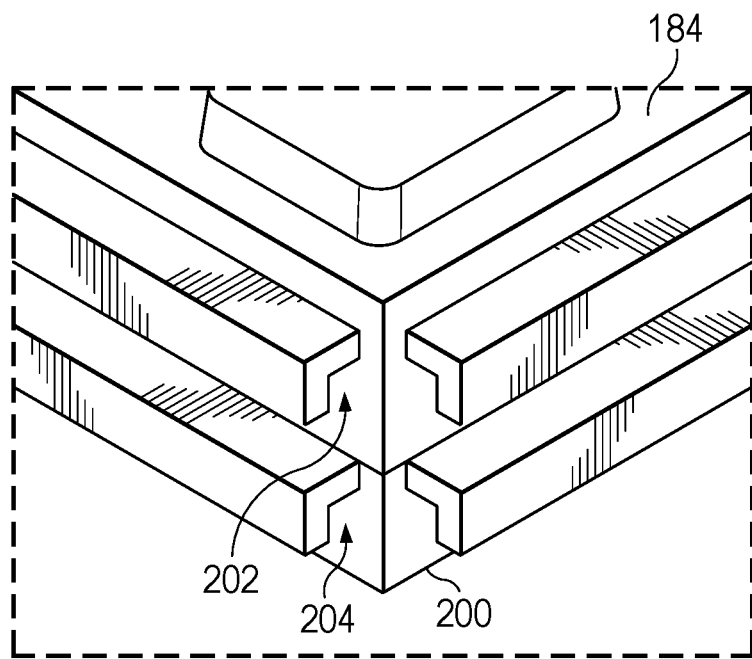
Figure 14G:
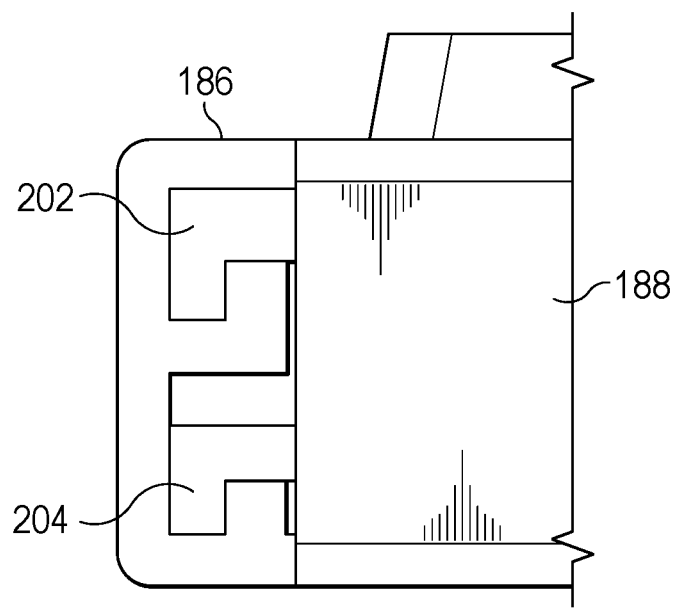
Figure 14H:
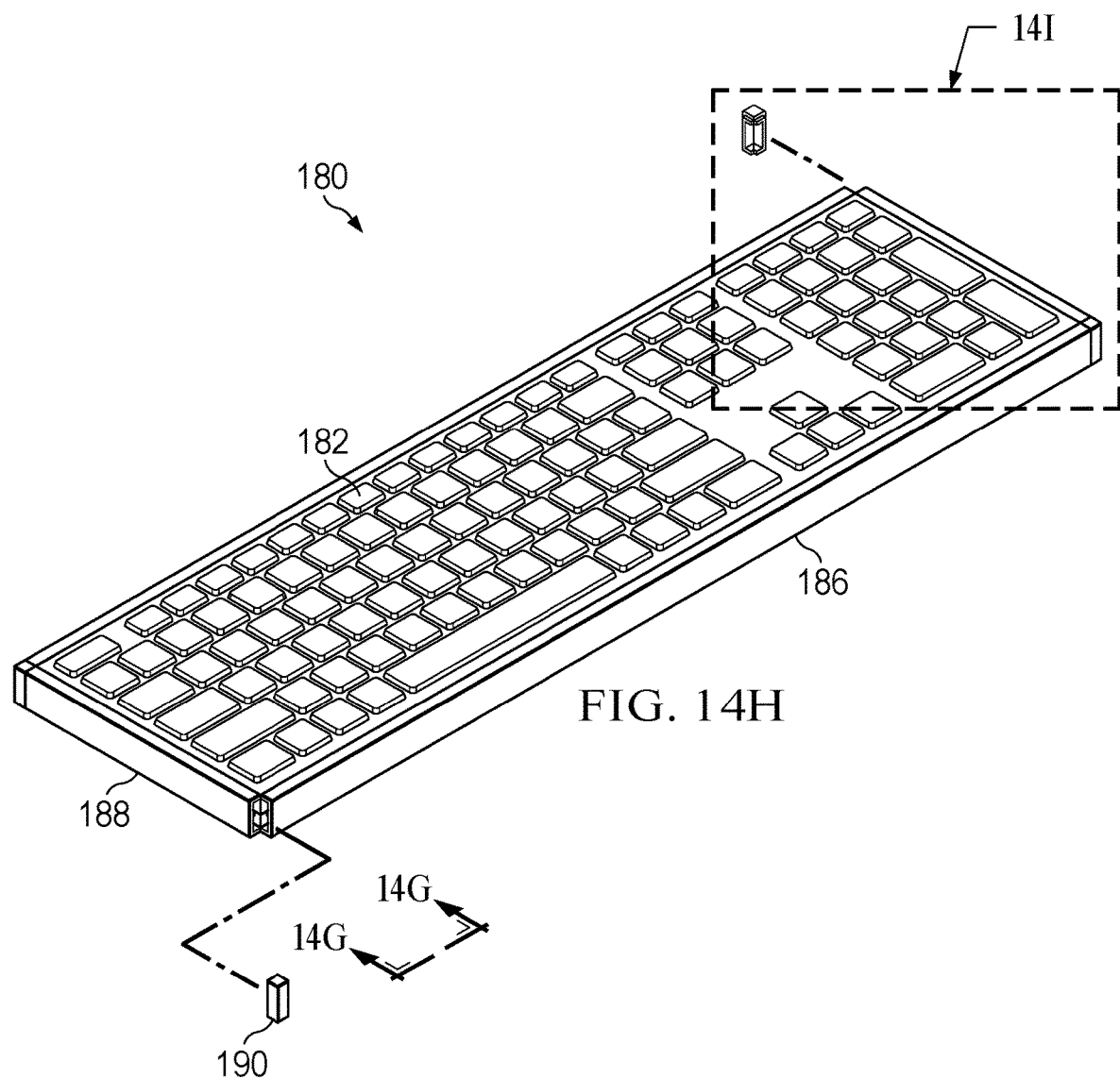
Figure 14I:
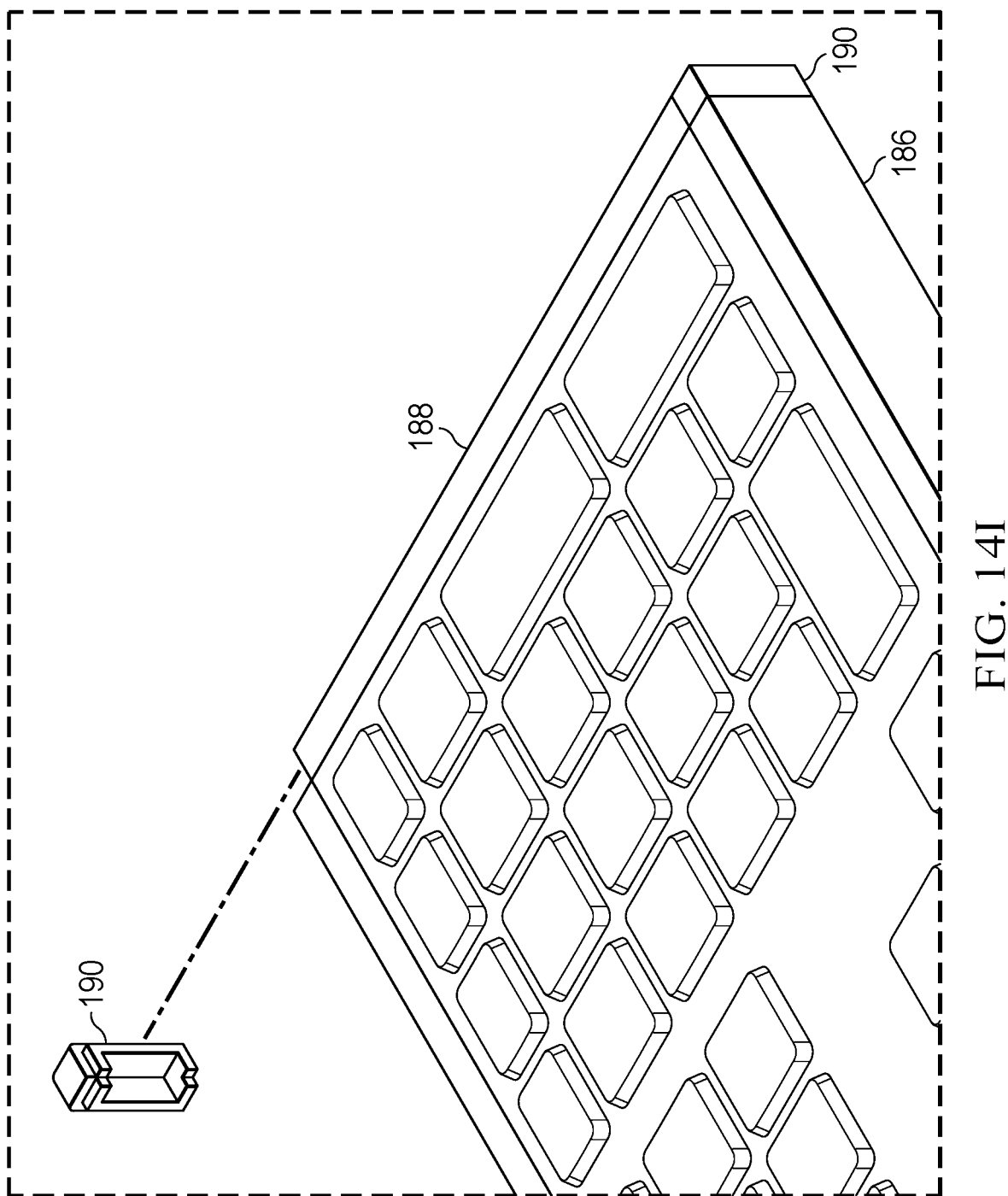

Once the keyboard upper and lower subassemblies are aligned, aluminum extruded rails 186 and 188 are slid into place to compress the layers slightly and hold the assembly together. FIG. 14E depicts front and rear rails 186 slid as indicated by arrows 206 into guides at the front and rear sides of the assembly, and side rails 188 slid as indicated by arrows 208 into guides at the sides of the assembly. FIG. 14F depicts a detail view of housing 184 and bottom cover 200 having a rail guide 202 and 204 respectively that each engage a common rail. Each rail couples over the upper guide 202 associated with the perimeter of housing 184 and the lower guide 204 associated with the perimeter of bottom cover 200 to hold the vertical assembly together without any adhesives or screws. FIG. 14G depicts a cross-sectional view of a front rail 186 coupled to upper rail guide 202 and lower rail guide 204 at a corner location having a side rail 188 coupled to the side of the assembly. In the example embodiment, the rail is extruded to have a member that extends under a lip of each guide and that provides a slight compression of the keyboard assembly. When all four rails couple around the perimeter of the keyboard assembly, each corner has an open spot that could allow the rails to slide if not protected, as is illustrated by FIG. 14G. FIG. 14H depicts a corner stopper cap 190 aligned to couple to the rail guides at each corner of the keyboard and hold the rails in place. FIG. 14I shows an example of an inner snap feature that couples in place at the keyboard and is removed to provide disassembly of the keyboard.

Figure 15:
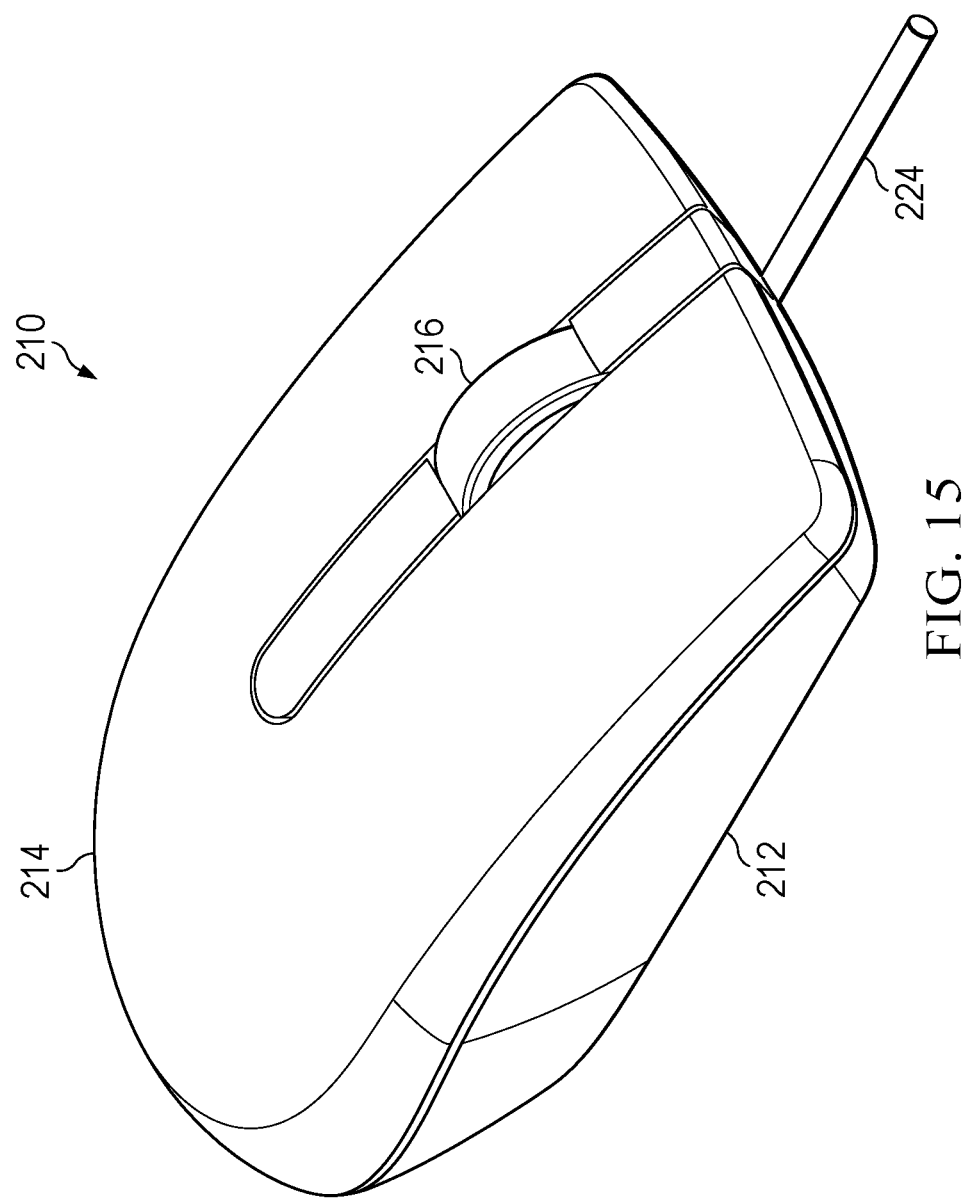
FIG. 15 depicts an example embodiment of a mouse that assembles from components without the use of screw and adhesives.

Referring now to FIG. 15, an example embodiment of a mouse 210 is depicted that assembles from components without the use of screw and adhesives. Mouse 210 has a bottom housing 212 that moves over a support surface and a top housing 214 that couples over the bottom housing and provides the end user access to push buttons at an upper surface on both sides of a scroll wheel 216. In the example embodiment, a cable 224 extends from bottom housing 212 to communicate mouse movements sensed by a position sensor to an information handling system interfaced with cable 224, such as through a USB port. Mouse 210 includes components assembled within the a plastic housing in a manner that provides rapid disassembly that reduces the cost associated with component reuse and recycling, as is illustrated in greater detail below.

Figure 16:
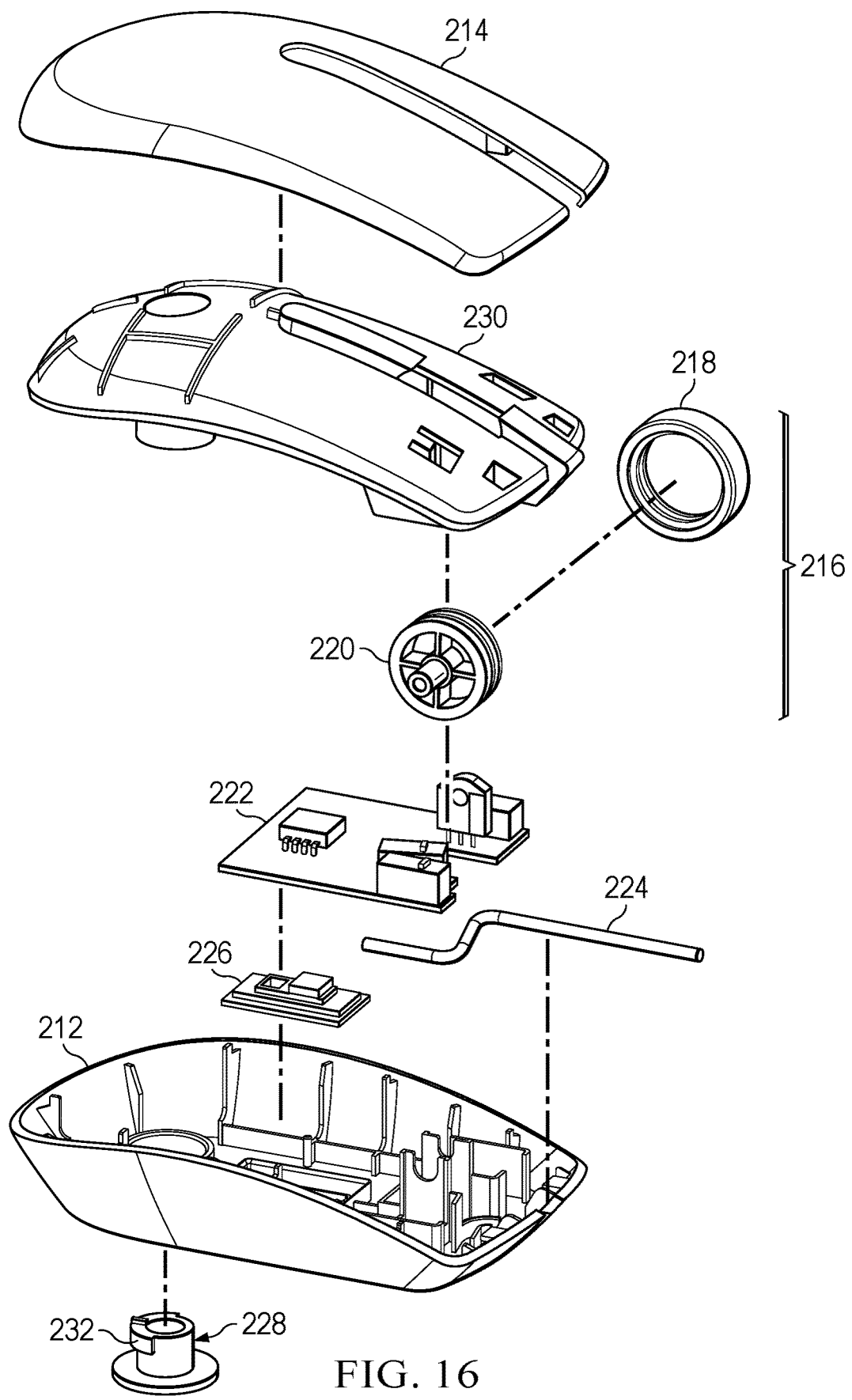
FIGS. 16 and 16A depict upper and lower perspective exploded views of the mouse to illustrate assembly of the mouse components without screws or adhesives.
Figure 16A:
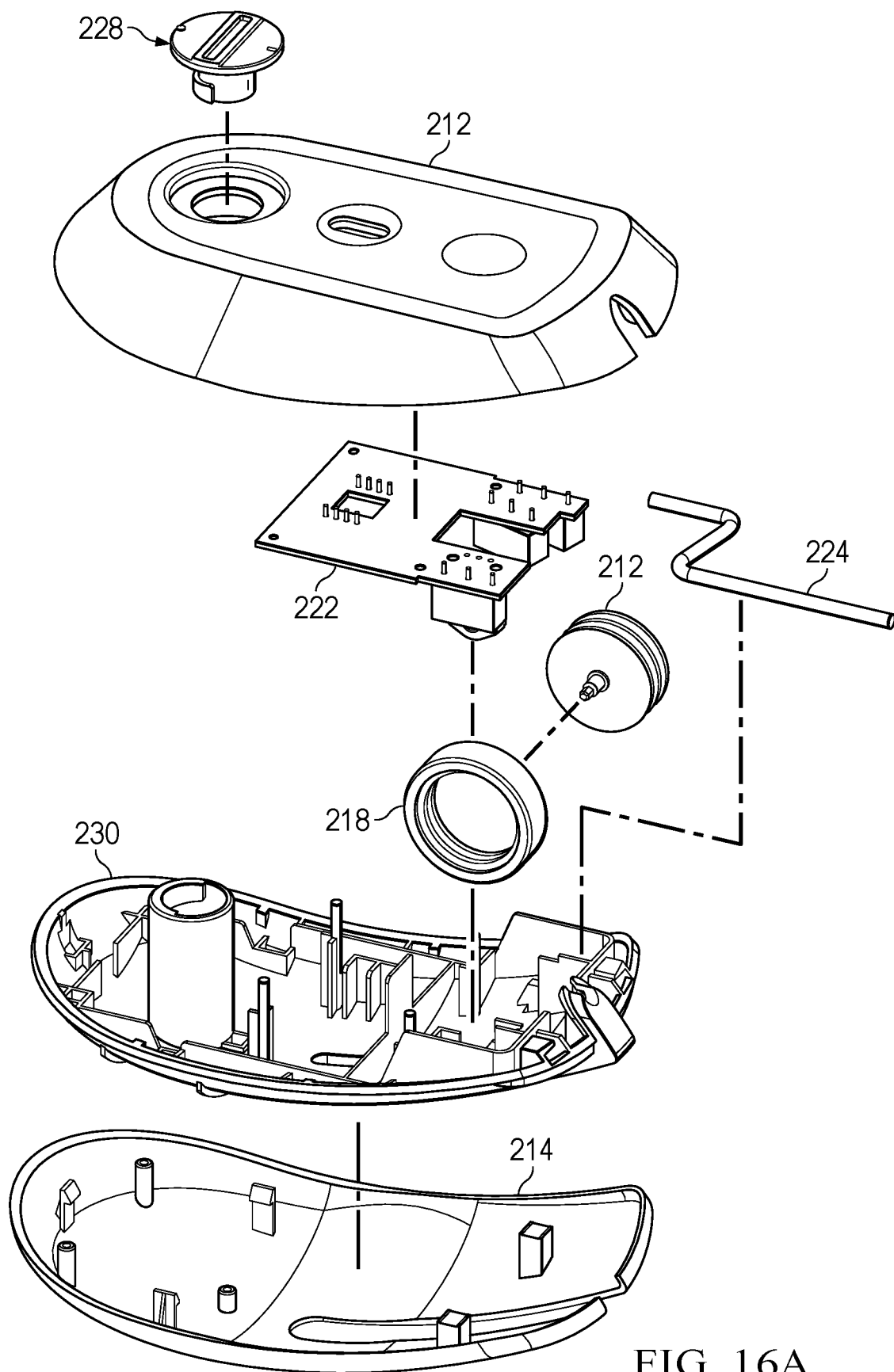

Referring now to FIGS. 16 and 16A, upper and lower perspective exploded views depict the mouse to illustrate assembly of the mouse components without screws or adhesives. Bottom housing 212 is injection molded to include structures that accept a plastic sensor lens 226 and a printed circuit board 222 having a position sensor and a processing resource to manage communication of inputs through cable 224. A plastic scroll wheel 220 with a rubberized cover 218 provide the scroll wheel 220 that extends out of top housing 230 and rotates in response to an end user finger motion. The plastic scroll wheel 220 has an axle 216 extending from each side that engages with the processing components of printed circuit board 222, which includes an optical or other type of sensor to detect scroll wheel rotation. A plastic top cover 230 couples over bottom housing 212 to enclose printed circuit board 222 in place. A central post extends from the plastic top cover 230 down into a recess and opening of bottom housing 212 and includes a side cam member extending from the inner circumference that engages with a central lock 228 to hold the mouse assembly together. For example, a cam member 232 extending from the outer circumference of central lock 228 rotationally engages the member extending from the inner circumference of plastic top cover 230 to compress the bottom and top housing portions together and hold the printed circuit board in place. A plastic key plate 214 snaps over top of top cover 230 with structures in a bottom surface and translates button push inputs through top cover 230 to buttons disposed in printed circuit board 222. The components depicted in FIGS. 16 and 16A assemble and disassemble with engagement and release of central lock 228 for ease of recycling and reuse without the use of any screws or adhesives.

Figure 17A:
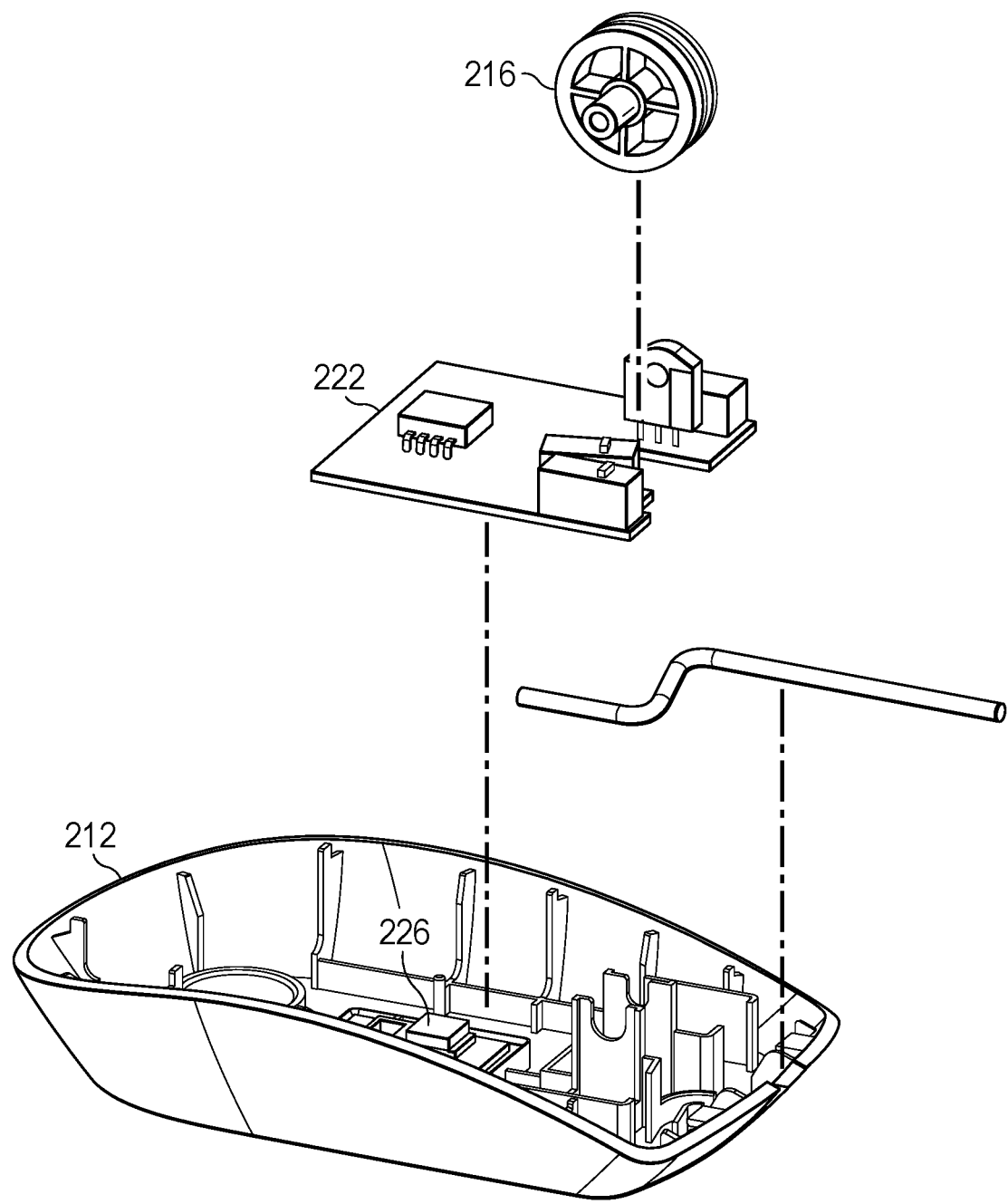
FIGS. 17A through 17E depict assembly of the mouse without the use of screws or adhesives.
Figure 17B:
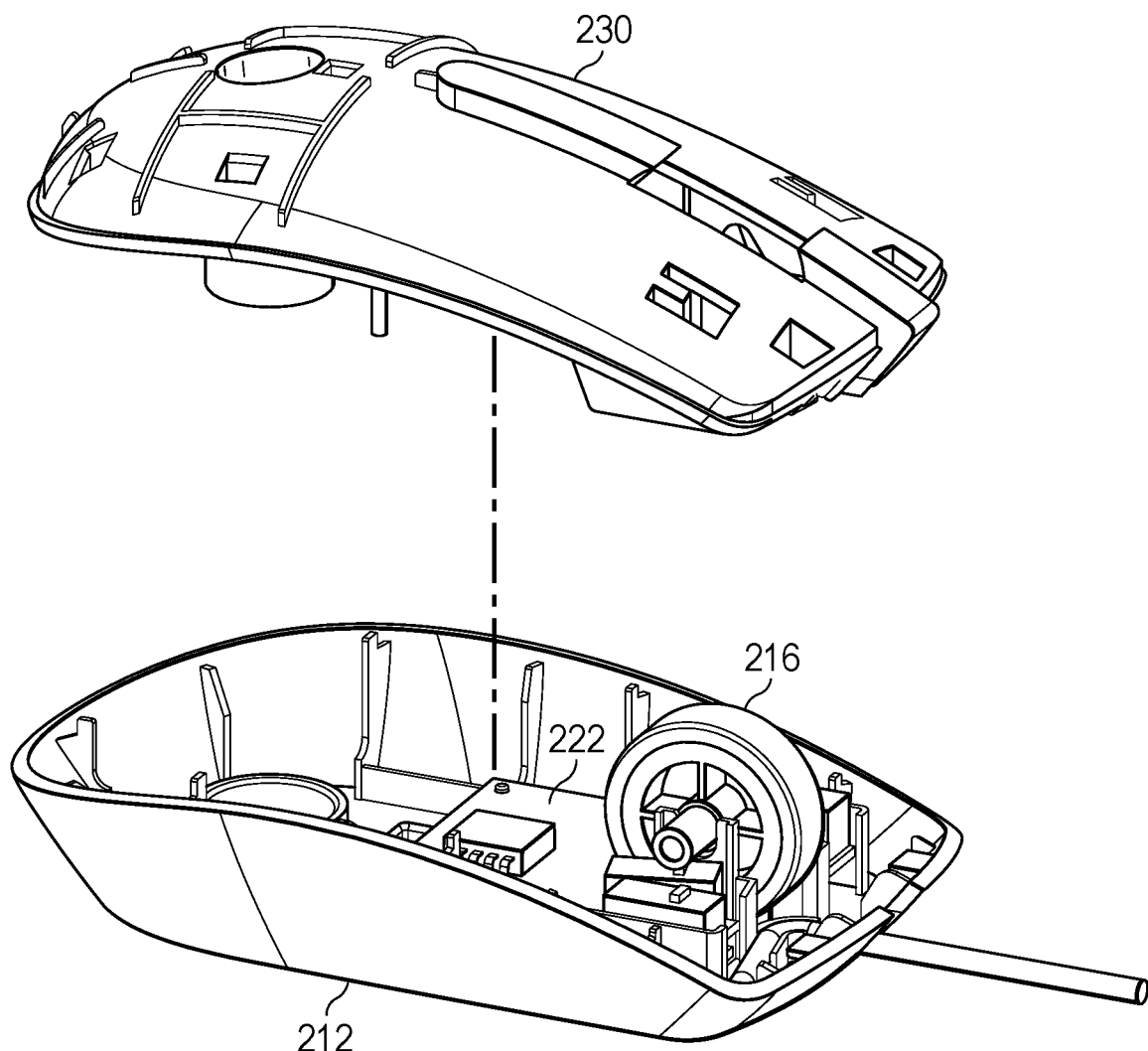
Figure 17C:
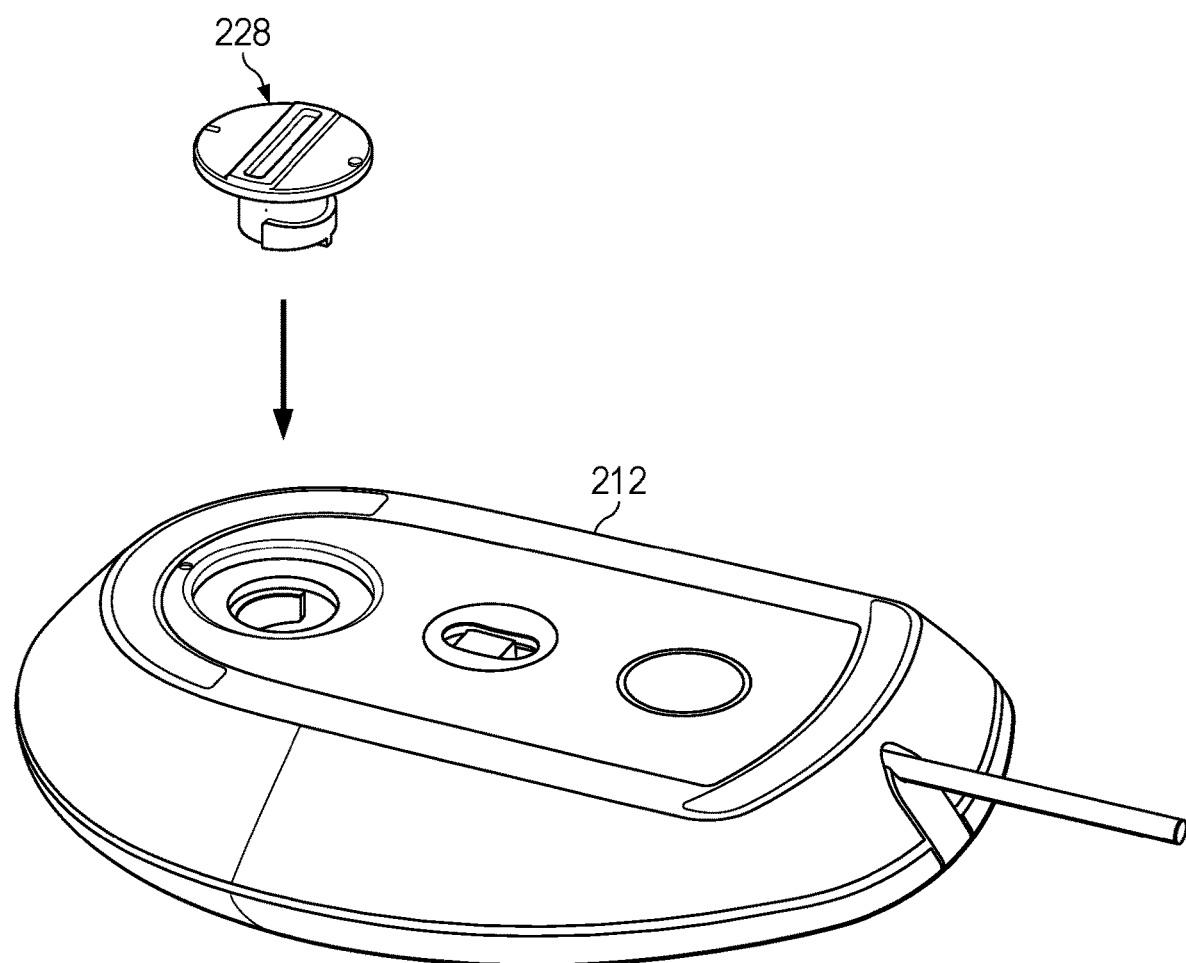
Figure 17D:
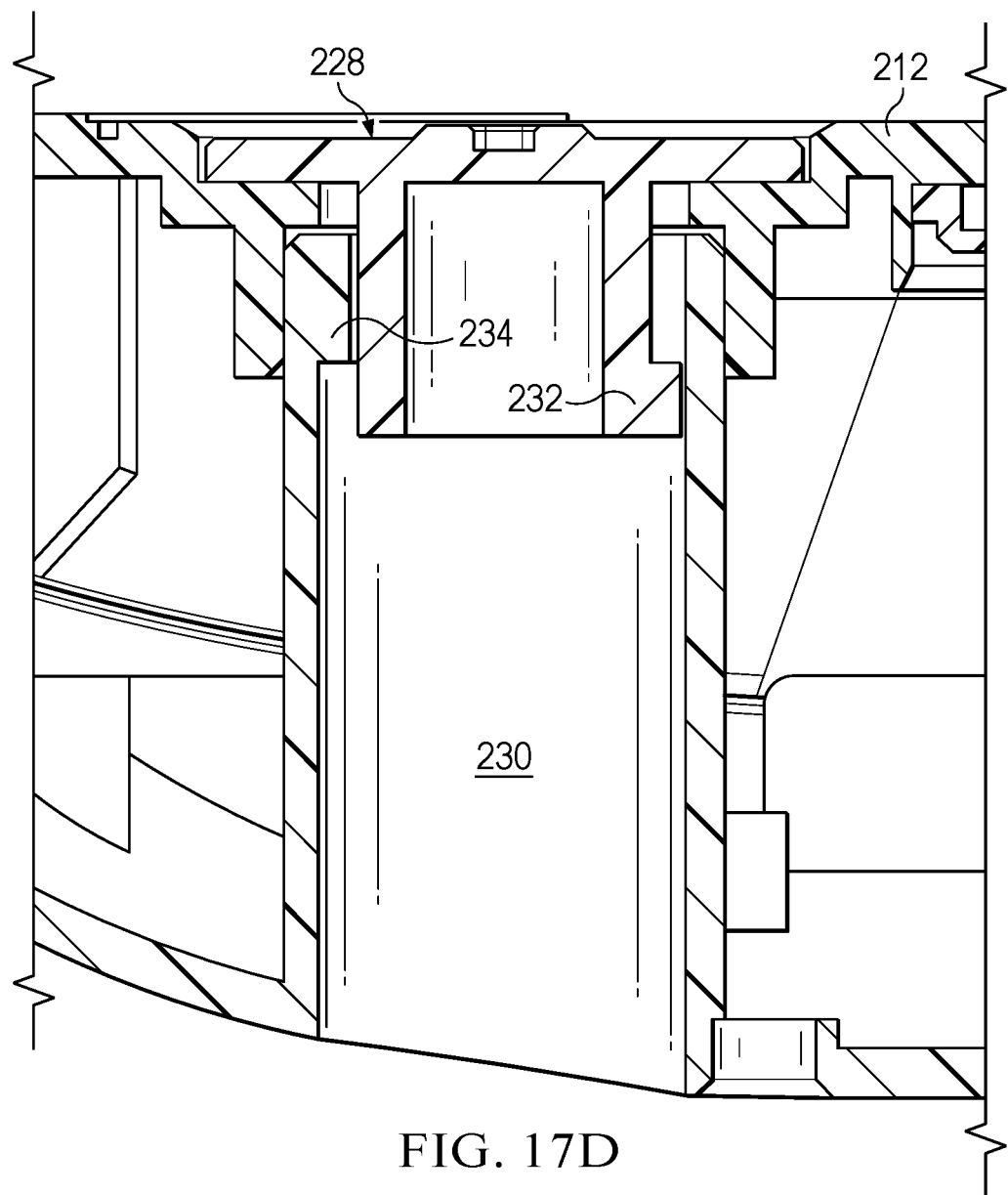
Figure 17E:
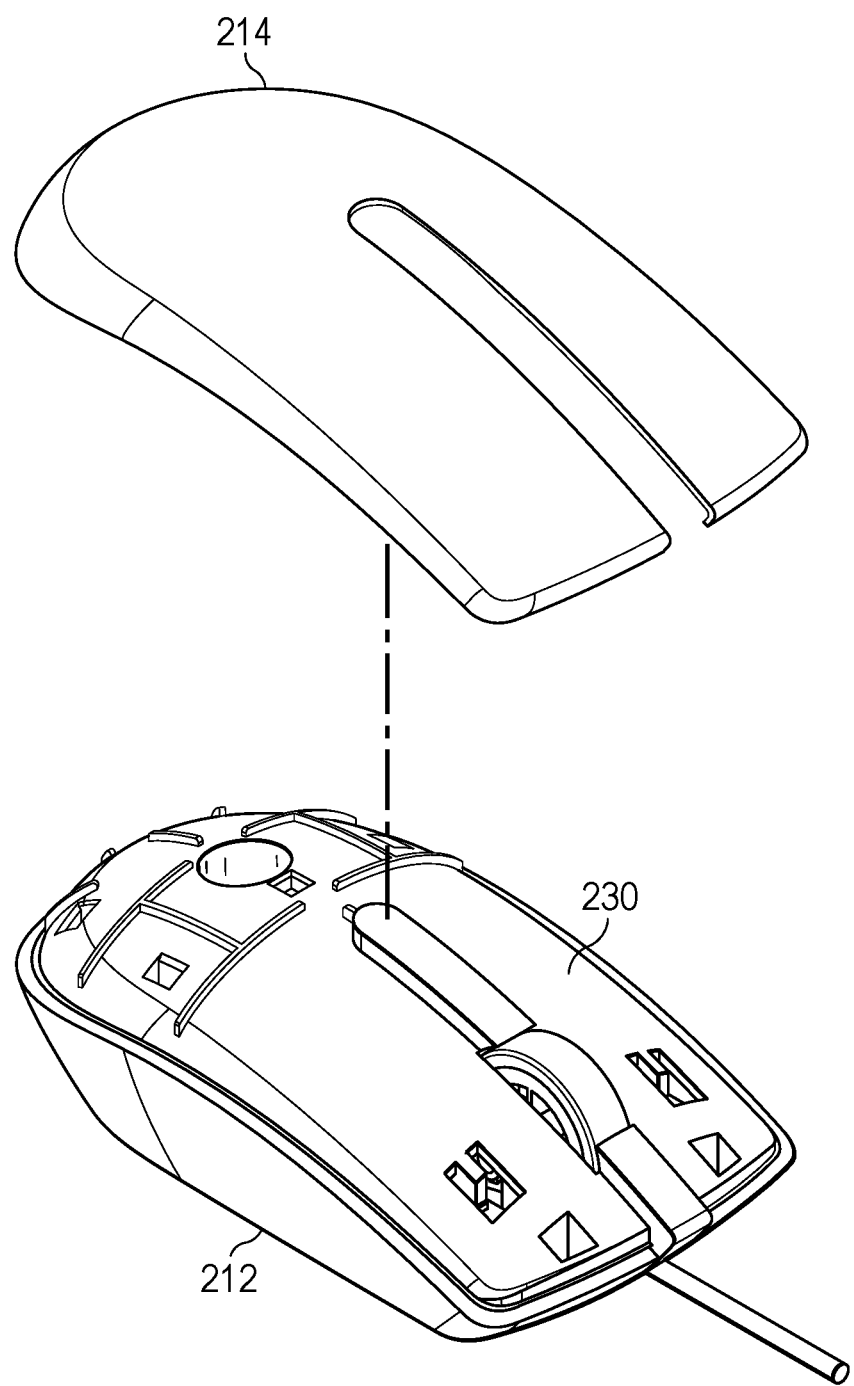

Referring now to FIGS. 17A through 17E, assembly of the mouse is depicted without the use of screws or adhesives. FIG. 17A depicts printed circuit board 222 has scroll wheel 216 coupled in place and is then placed in bottom housing 212 over lens 226, which is snapped into place in alignment with a position sensor at the bottom side of printed circuit board 222. Structures of bottom housing 212 hold printed circuit board 222 and scroll wheel 216 in place. FIG. 17B depicts top cover 230 aligned over bottom housing 212 to place the central post of the top cover into the opening of bottom housing where the central lock is inserted. Internal members extending down from top cover 230 engage with printed circuit board 222 to hold it in place when the central lock is rotated to a locked position to compress top cover 230 into bottom housing 212. FIG. 17C depicts a bottom view of bottom housing 212 with central lock 228 aligned to insert in the opening to couple with the top cover 230. Marks on the bottom surface of the bottom housing show the rotational positions to which central lock 228 rotates to lock and release the mouse housing for assembly and disassembly. FIG. 17D depicts a cross-sectional view of the top cover 230 where a cam extension 234 from the inner circumference of the top cover engages with a cam surface 232 of the outer circumference of central lock 228. Once the central lock rotates to lock the cam surfaces relative to each other, the bottom housing and top cover compress towards each other to capture the printed circuit board and other internal components. FIG. 17E depicts coupling of keyplate 214 over to top cover 230 to complete the assembly. At end of life, the mouse breaks down by removing the keyplate and central lock, then breaking the components down to like materials for recycling or selecting components for reuse.

Referring now to FIG. 18, a cross-sectional view depicts an example of a printed circuit board having a hybrid of conventional and bio-based materials to enhance recycling and reuse of the printed circuit board. In the example embodiment, dual assemblies of copper layers 252 and a bio-based substrate 250 are each separately built as printed circuit boards then sandwiched around a conventional prepreg (such a fiberglass laminate composite material) or similar layer 254 to manufacture a peripheral device printed circuit board that is used in a peripheral, such as the keyboards and mouse described above, the cameras described below and some subsystems of the information handling system described above as well as other types of systems. Generally, bio-based materials lack the stiffness and electrical properties to use in systems and peripherals that perform more complex processing tasks. For instance, poorer dielectric and insulating properties can make bio-based printed circuit boards a less favorable choice for devices that carry dense signal traffic. In many instances, bio-based circuit boards are sufficient to handle the processing and signaling associated with peripheral devices, such as a mouse position sensor or a mouse scroll wheel rotation sensor, or an interface with a keyboard membrane. Similarly, some information handling system functions include small circuit boards that do not have heavy processing and signaling demands that can operate with bio-based materials. Including bio-based materials in the printed circuit boards helps to improve recycling of the device by allow the board to be discarded where it can biodegrade. In addition, bio-based printed circuit boards avoid the use of fossil fuels so that a more sustainable product results. Generally, bioplastics of PLA, PHA, PBS and starch blends are biodegradable and built without fossil fuels; biobased PE, PET, PA and PTT do not biodegrade but offer an alternative to fossil fuel plastics. In one embodiment, at end of life, a hybrid board may be reused by melting the bio-based substrate off of the prepreg substrate so that the prepreg substrate can be reused.

In the example embodiment, printed circuit board 222 is, for example, a mouse or keyboard printed circuit board that has a central prepreg layer 254 sandwiched between biobased PLA GO substrates that make up about 20% of the total board thickness. A top layer 252 is a copper routing layer that has conductive pads to accept electronic components and a bottom layer 252 is a copper routing layer that also has conductive pads to support electronic components. For instance, these layers have components affixed with a pick and place or similar process and interface through the biobased substrate 250 to an underlying internal ground plane 252 on top of the prepreg layer 254 and an internal power plane layer 252 below the prepreg layer. The prepreg layer offers improved stiffness relative to the bio-based substrates 250 but does not biodegrade and is prepared with conventional fossil fuel materials. However, at product end of life when the printed circuit board is removed, the prepreg layer 254 may be separated from the bio-based layers and reused while the bio-based layers are recycled or discarded in an environmentally friendly manner. As an example, the prepreg layer may have both a ground plane and a power plane coupled to it so that the prepreg layer may be reused by removing the top and bottom routing layers and then attaching new top and bottom routing layers with bio-based substrates. This approach will work well where a peripheral device has a defined footprint, such as a mouse or keyboard printed circuit board. In some instances, the ground and power plane layers may be part of the bio-based substrate so that only the prepreg layer is reused. Alternatively, the printed circuit board may be reused by keeping one of the routing layers coupled to the prepreg layer along with both the ground and power planes; the other bio-based substrate and routing layer are then replaced. In some instances, the prepreg layer, ground plane and power plane may be reused in a context having a separate multi-layer bio-based interface added at one side to interface the top and bottom routing layers or to encapsulate the prepreg layer within bio-based substrate that provides a communication interface.

In some instances, bio-based substrates have a greater sensitivity to heat that can impact the life of a printed circuit board. The copper used in ground and power planes and help to spread thermal energy and transfer thermal energy to external the printed circuit board, however, the thermal energy can also transfer through vias to routing layers. In one embodiment, thermal energy at a hybrid printed circuit is managed by including one or more graphene layers within the printed circuit board, such a 70 micrometer layer or graphene paint having a thermal conductivity of 70 to 200 Wmk. The graphene layer tends to transport thermal energy along its plane without substantial transfer normal the plane of the graphene layer. Similarly, graphene tends to conduct electricity in plane and having a dielectric characteristic normal the plane. In one example embodiment, a first layer of graphene paint is disposed between the ground plane and the bio-based substrate and a second layer of graphene paint is disposed between prepreg substrate and the power plane. The graphene layers each transport thermal energy to the periphery of the printed circuit board where another structure can accept the thermal energy. In alternative embodiments a graphene layer may be disposed between each substrate layer or just between one or more selected of the substrate layers. For example, graphene may be applied between the bio-based substrate and the ground plane; and/or between the ground plane and the prepreg substrate; and/or between the prepreg substrate and the power plane; and/or between the power plane and the bio-based substrate. The selection of graphene layer placement may depend on a number of factors to include the thermal characteristics of the processing components of the board, the expected operating conditions of the printed circuit board and the thermal transfer characteristics of the copper elements of the printed circuit board.

Figure 19:
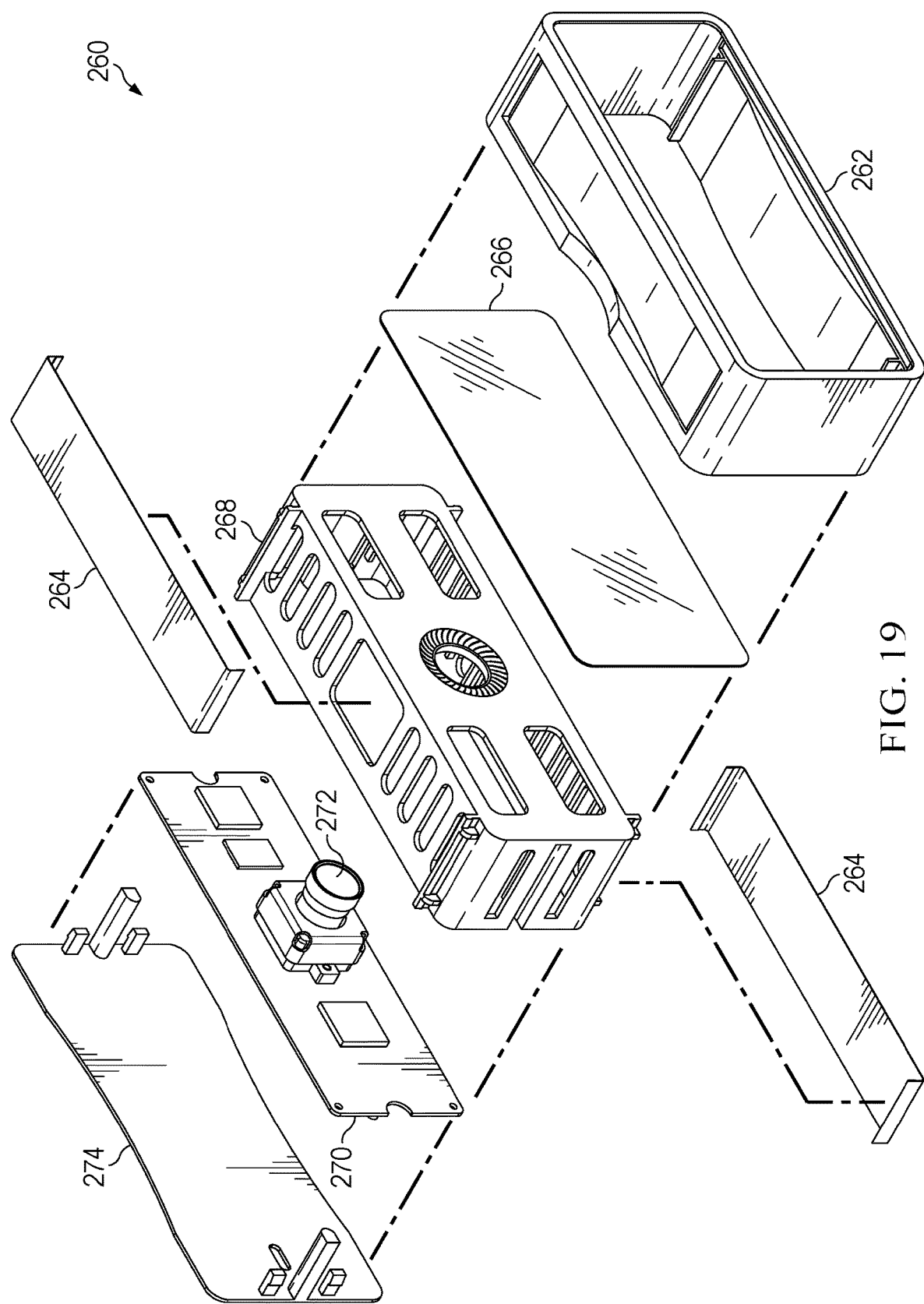
FIGS. 19 and 19A, exploded front and rear perspective views of a web camera are depicted that assembles from components without the use of screw and adhesives.
Figure 19A:
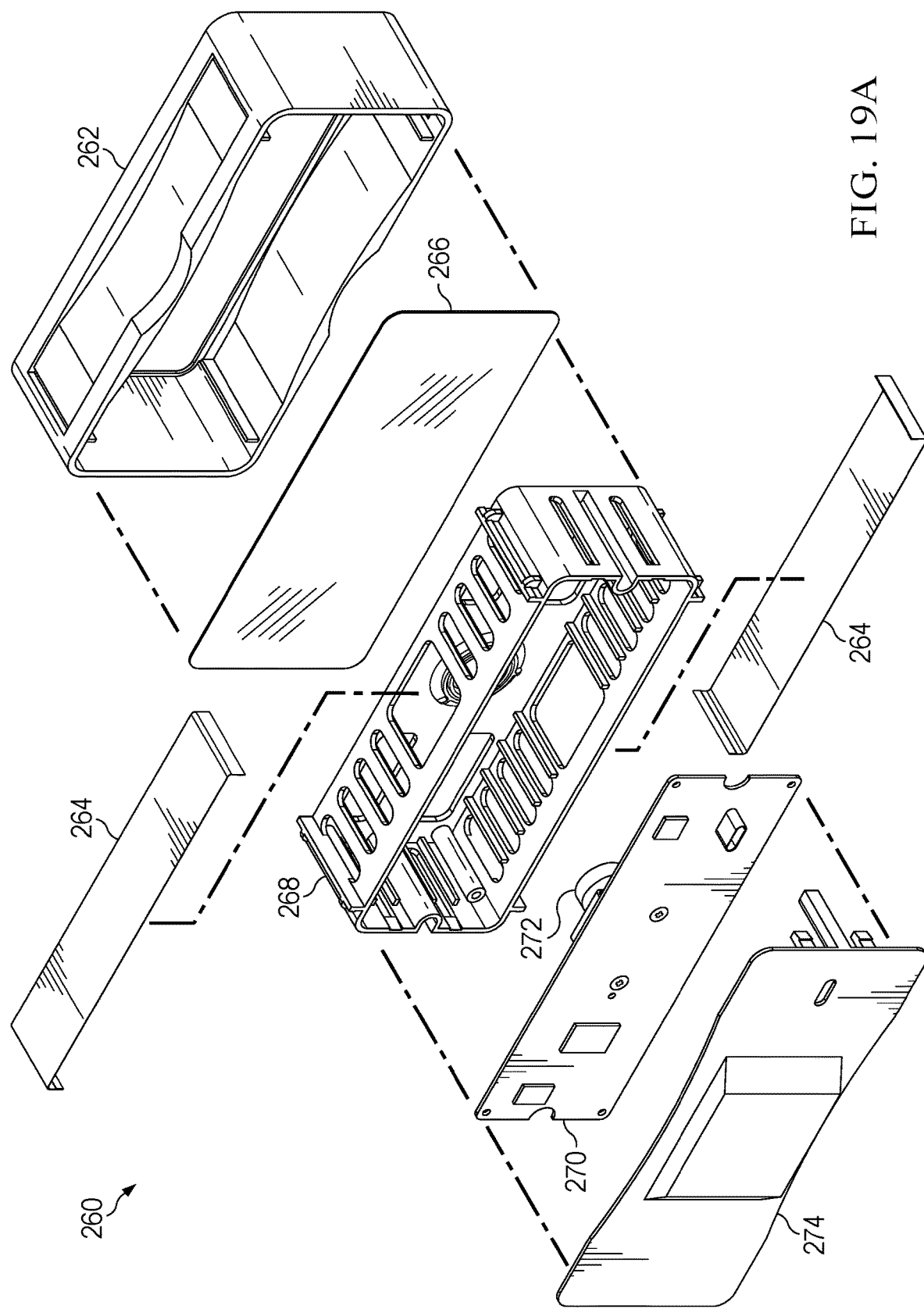

Referring now to FIGS. 19 and 19A, exploded front and rear perspective views of a web camera 260 are depicted that assembles from components without the use of screw and adhesives. Camera 260 is assembled in an aluminum extruded housing 262 having front and rear openings that accept the internal components. An inner frame 268 is injection molded plastic to fit within extruded aluminum housing 262 and includes guide members extending out from each corner that engage with guides formed in housing 262 on the inner surface. Plastic inner frame 268 slides into the rear opening of housing 262 to have the guide members engaged with the guides to hold the inner frame laterally in position. A printed circuit board 270 has an image sensor 272 mounted at a front central location aligned to have a field of view through inner frame 268 front opening. A rear cover 274 includes plural members of different lengths extending inward to housing 262 to engage with printed circuit board 270 and inner frame 268. A glass front cover 266 fits in housing 262 from the rear to abut against a stop formed in the housing front inner circumference. When the components are assembled, a planar spring lock 264 couples to housing 262 at an upper and lower side to hold the components in place and seal glass front cover 266 in place.

To disassemble the components for recycling or reuse, the planar spring lock 264 is released, as is described below in greater detail, and the components slide out of housing 262.

Figure 20:
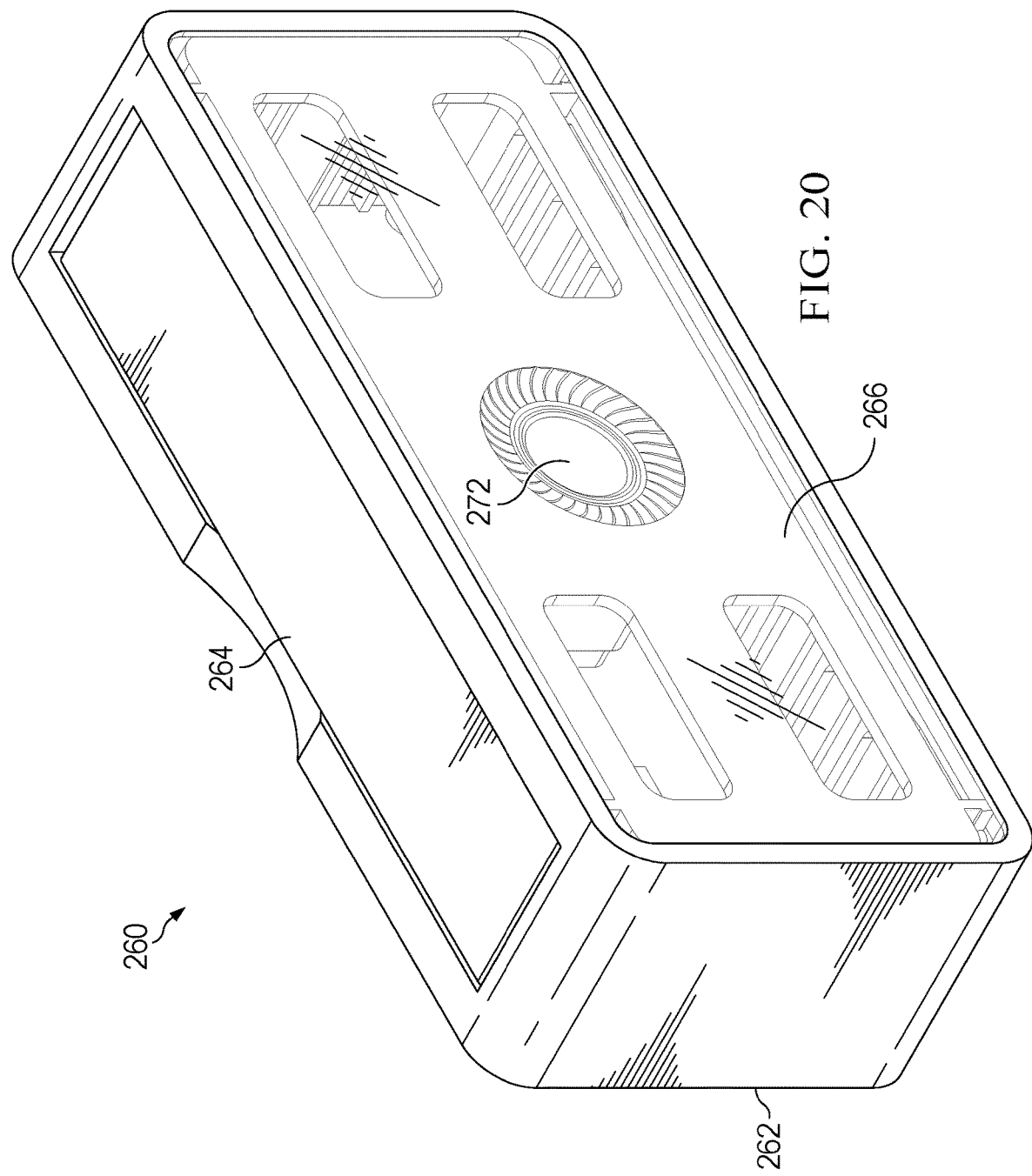
FIGS. 20 and 20A-C depict assembly and disassembly of the web camera by interaction with a planar spring lock.
Figure 20A:
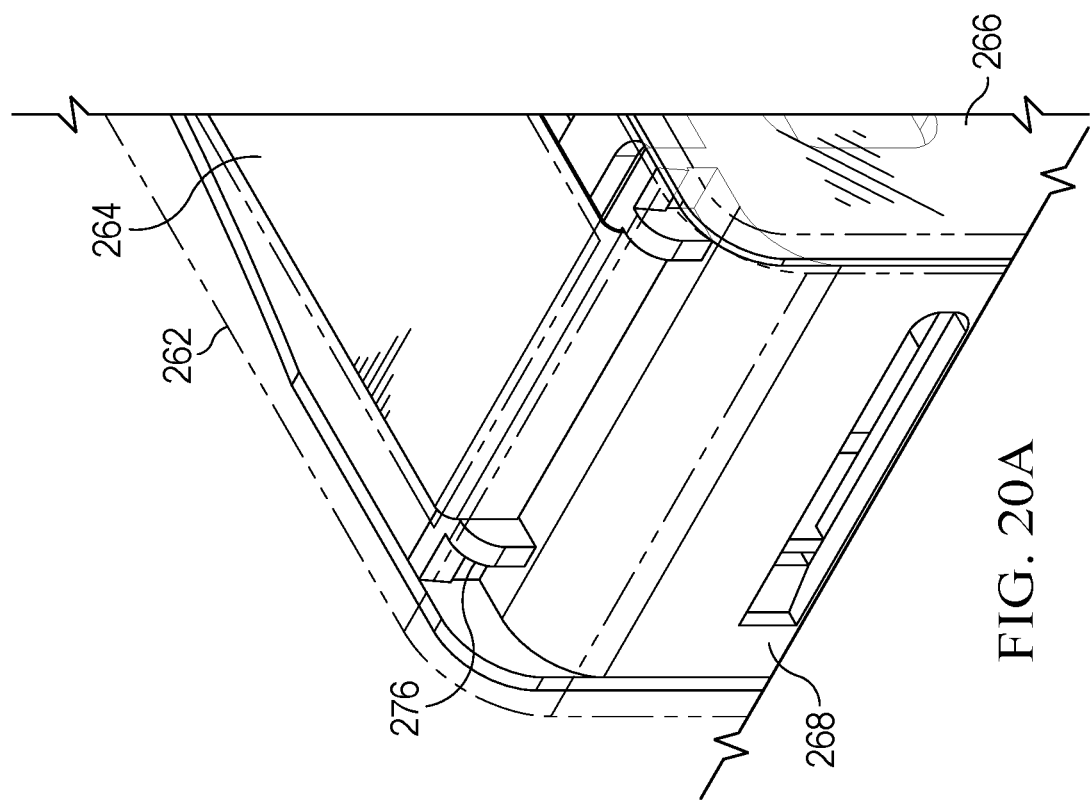
Figure 20B:
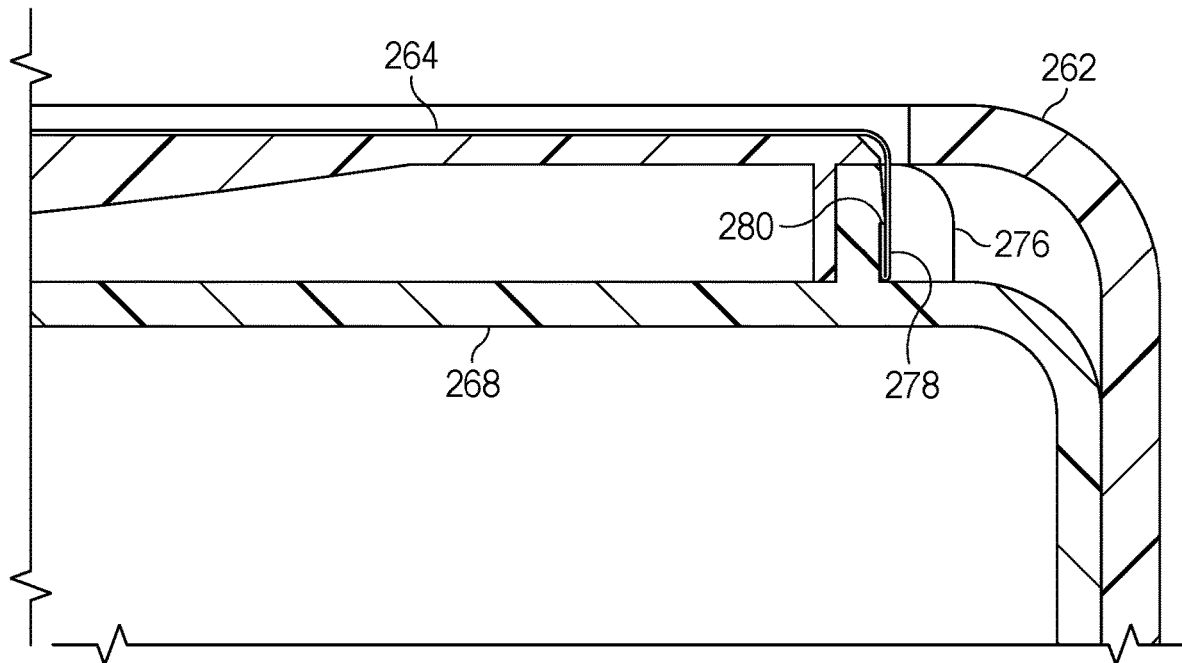
Figure 20C:
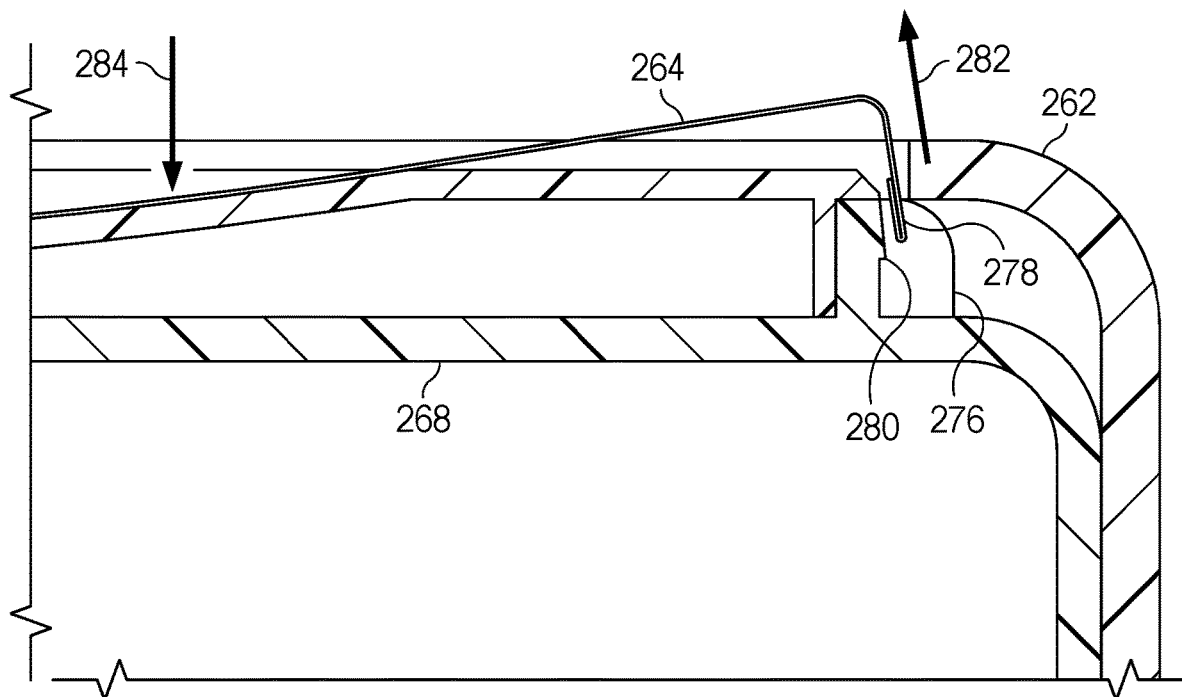

Referring now to FIGS. 20 and 20A-C, assembly and disassembly of the web camera by interaction with a planar spring lock is depicted. FIG. 20 depicts a front perspective view of camera 260 in an assembled state having the planar spring lock 264 coupled to housing 262 and having image sensor 272 exposed at the inner frame opening. In the assembled state, planar spring lock 264 biases to a planar configuration over top of a recess formed in housing 262. As illustrated by the detail cutaway view of FIG. 20A, a flange formed by a bend at each end of planar spring lock 264 inserts into a slot opening of housing 262 to engage against inner frame 268 at the guide members 276 so that the flange fixes inner frame 268 in position relative to housing 262. FIG. 20B depicts a cross-sectional view of interaction between planar spring lock 264 and inner frame 268 to hold the components in housing 262. Planar spring lock 264 is folded at the end of the flange to create a catch 278 that couples under a lip 280 formed in guide member 276 of inner frame 268. The upward bias of planar spring lock 264 maintains an elevated position of the planar surface above a recess in housing 262 and an inward force against inner frame 268 to keep catch 278 pressed under lip 280. FIG. 20C depicts that an inward press on planar spring lock 264 into the recess formed in housing 262 so that bending of planar spring lock 264 lifts the flange catch 278 out from under lip 280 of guide member 276 as indicated by arrow 284. Once planar spring lock 264 releases and lifts out of the slot of housing 262, inner frame 268 is free to slide out of housing 262 to disassemble the camera for reuse or recycling.

Figure 21:
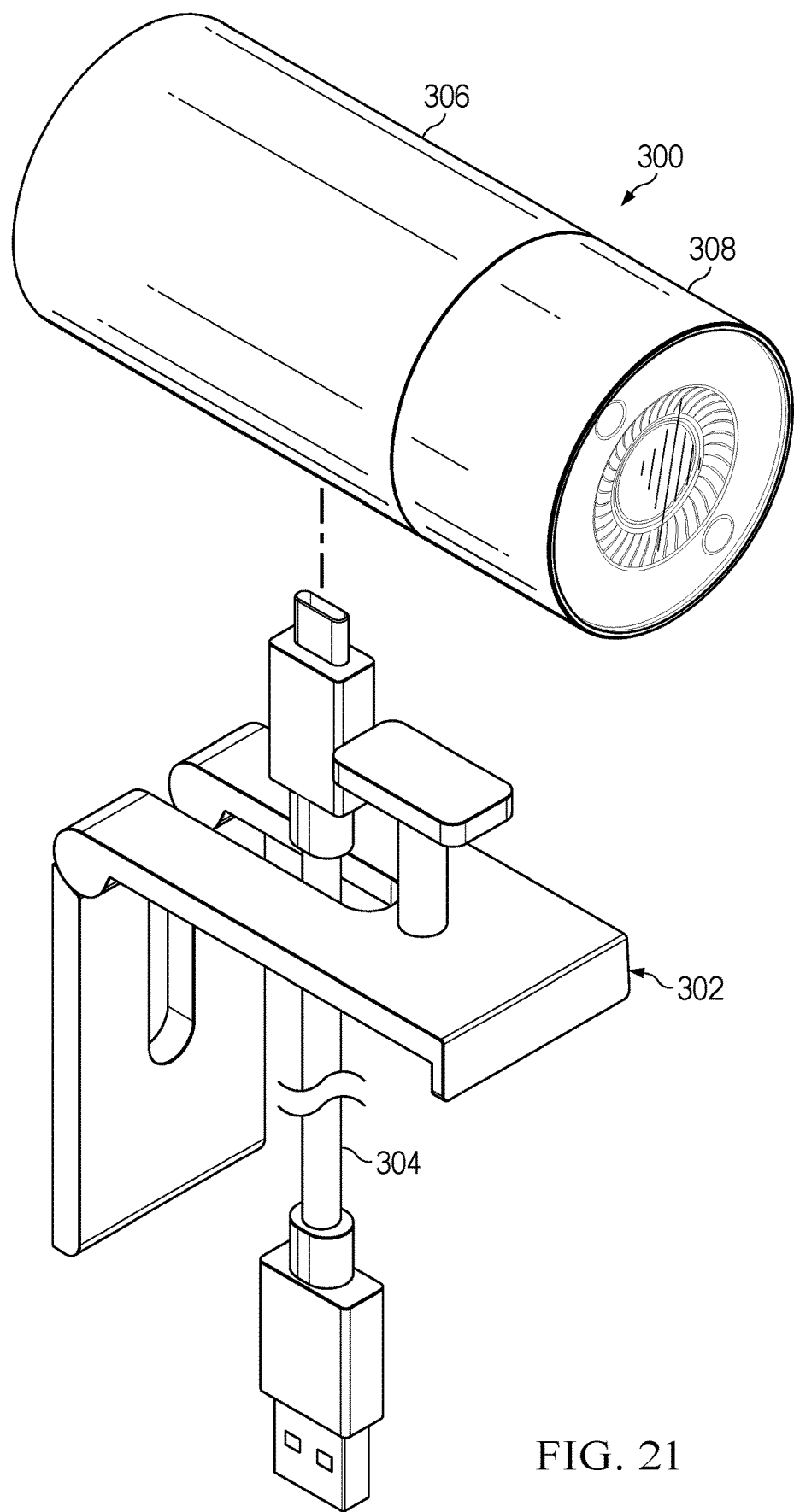
FIGS. 21 and 21A through 21C, an example of a camera is depicted that breaks a housing into separate sections to enhance camera repair, reuse and recycling.

Referring now to FIGS. 21 and 21A through 21C, an example of a camera is depicted that breaks a housing into separate sections to enhance camera repair, reuse and recycling. FIG. 21 depicts a front perspective view of camera 300 having a housing divided between a front housing portion 308 that contains an image sensor and a rear housing portion 306 that contains processing, battery and communication resources. In the example embodiment, camera 300 is supported by a stand 302 and communicates through a USB cable 304 that plugs into rear housing portion 306. In alternative embodiments, camera 300 may interface through wireless signal communication, such as WiFi and BLUETOOTH. Dividing camera 300 into separate front and rear housing portions provides the advantage of having functionally similar resources disposed in each housing portion. For instance, front housing portion 308 contains image sensor hardware while rear housing portion 306 contains support functions like power and communications. During repair, a housing portion with malfunctioning components is swapped with a replacement housing portion. Recycling and reuse are also simplified by the division of functions between the housing portions.

Figure 21A:
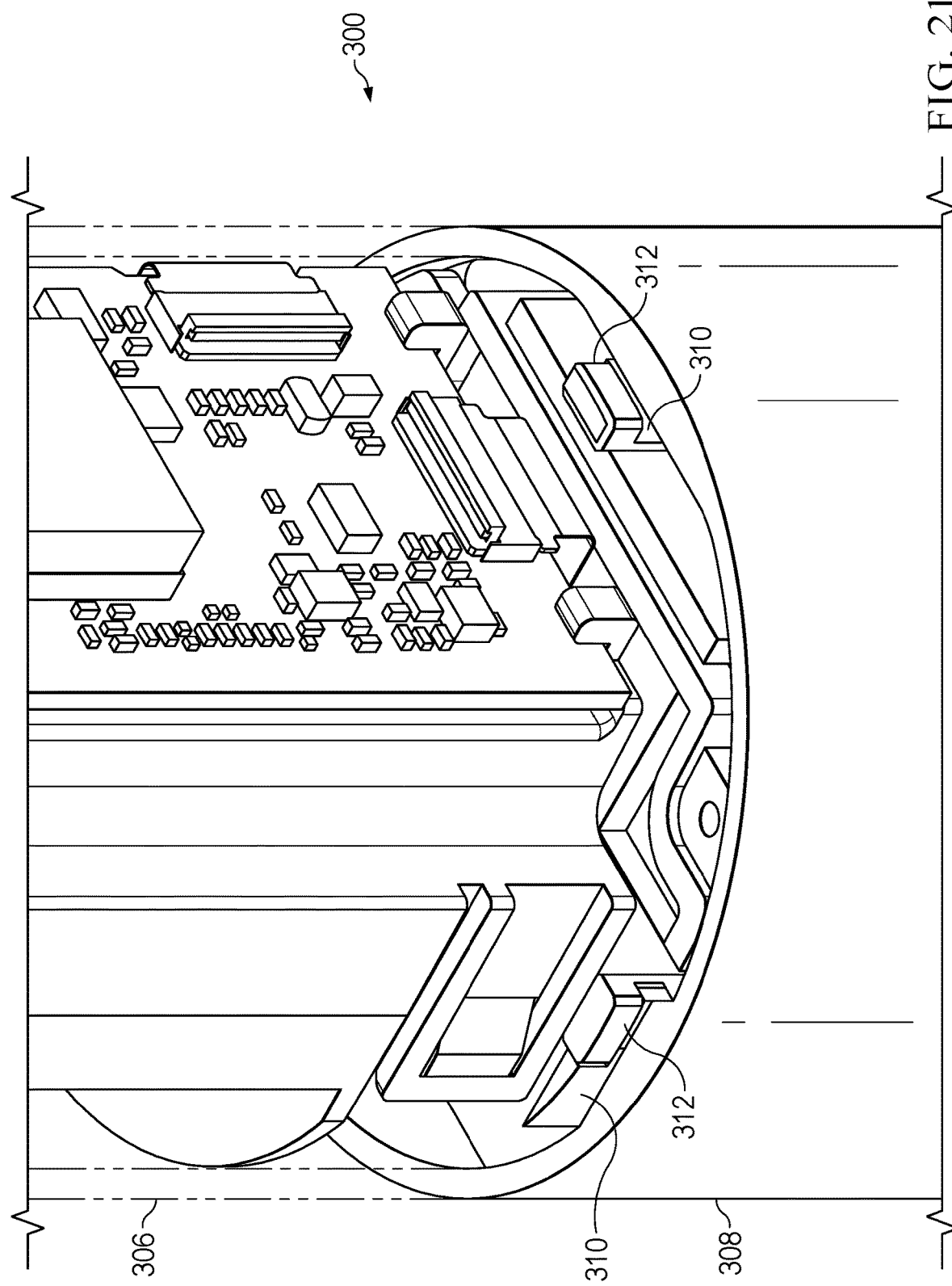
Figure 21B:
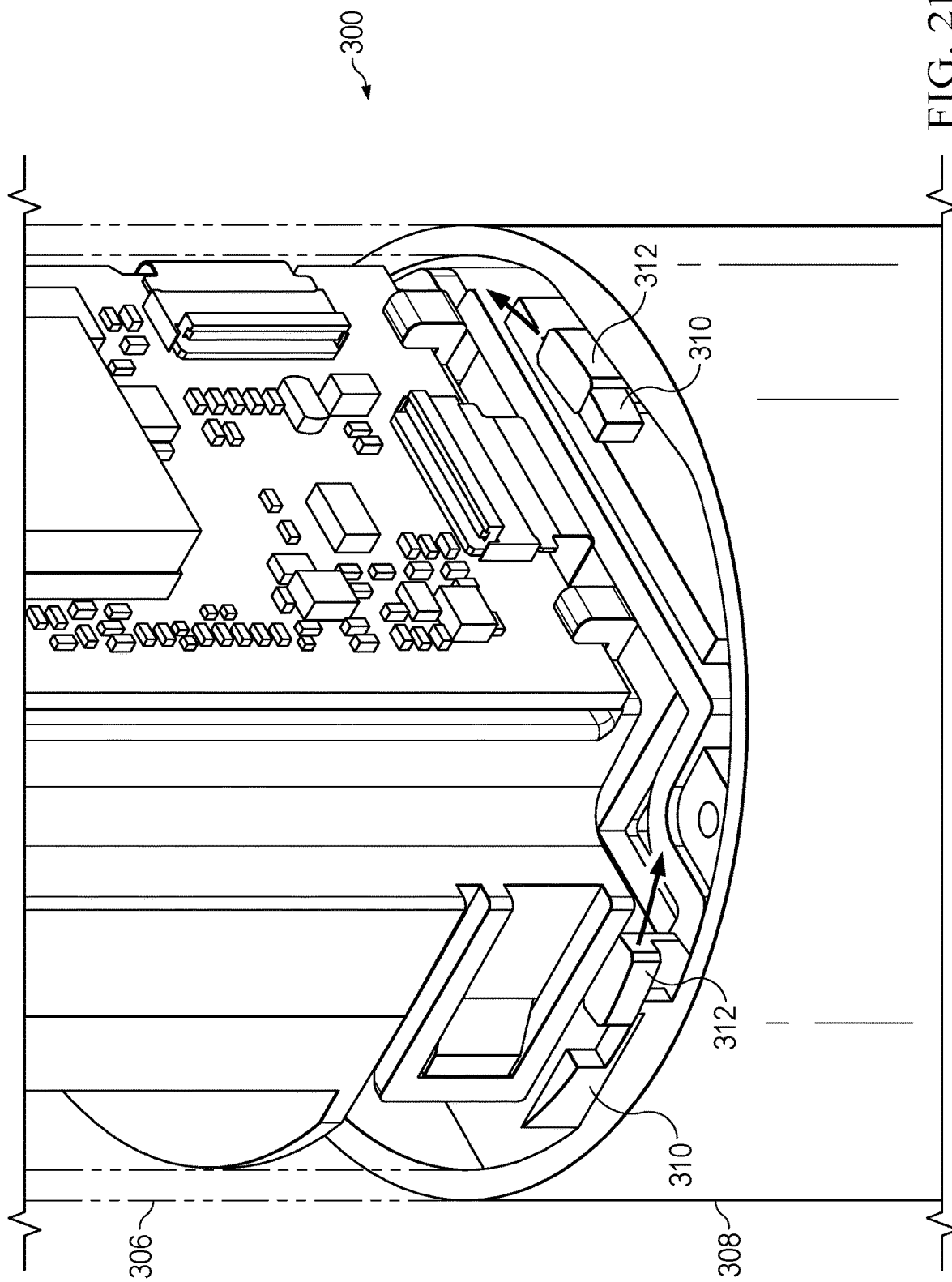

In the example embodiment, front housing portion 308 and rear housing portion 306 are formed by extruded aluminum to have front and rear openings on each side of a tube. In alternative embodiments, other materials may be used, such as plastics. The front and rear housing portions rotationally couple to each other with opposing members disposed on the inner circumference that engage with each other. FIG. 21A depicts an example embodiment having hooks 312 of front housing portion 308 that extend outward and under a lip 310 of rear housing portion 306. FIG. 21B depicts a rotation of front housing portion 308 relative to rear housing portion 306 to misalign hooks 310 from lips 308 so that the housing portions release from each other.

Figure 21C:
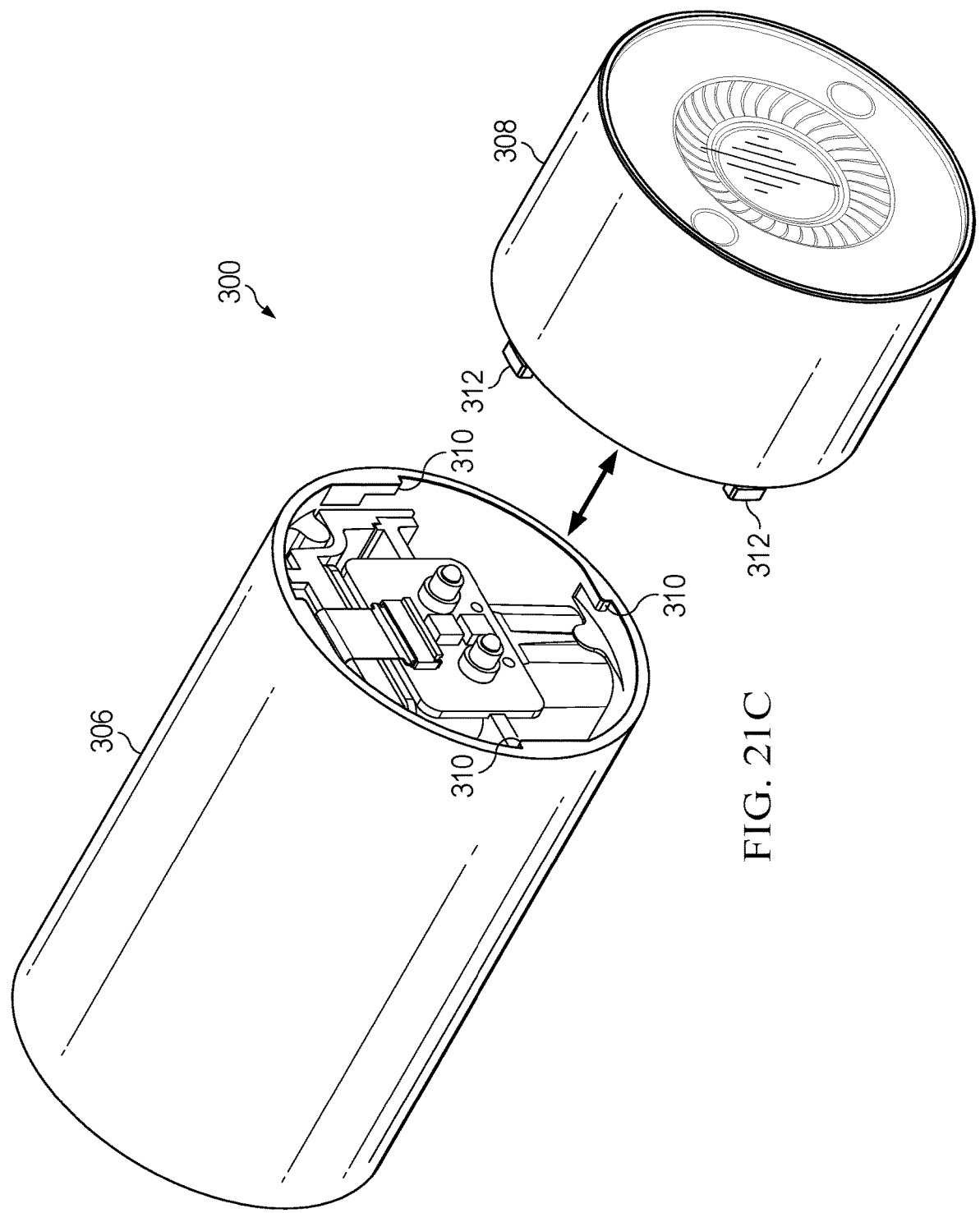

FIG. 21C depicts the front and rear housing portions separated from each other after rotation to release hooks 310 from lips 308. As is described in greater detail below, no screws, adhesives or wired connectors are used to assemble the front and rear housing portions to each other.

Figure 22:
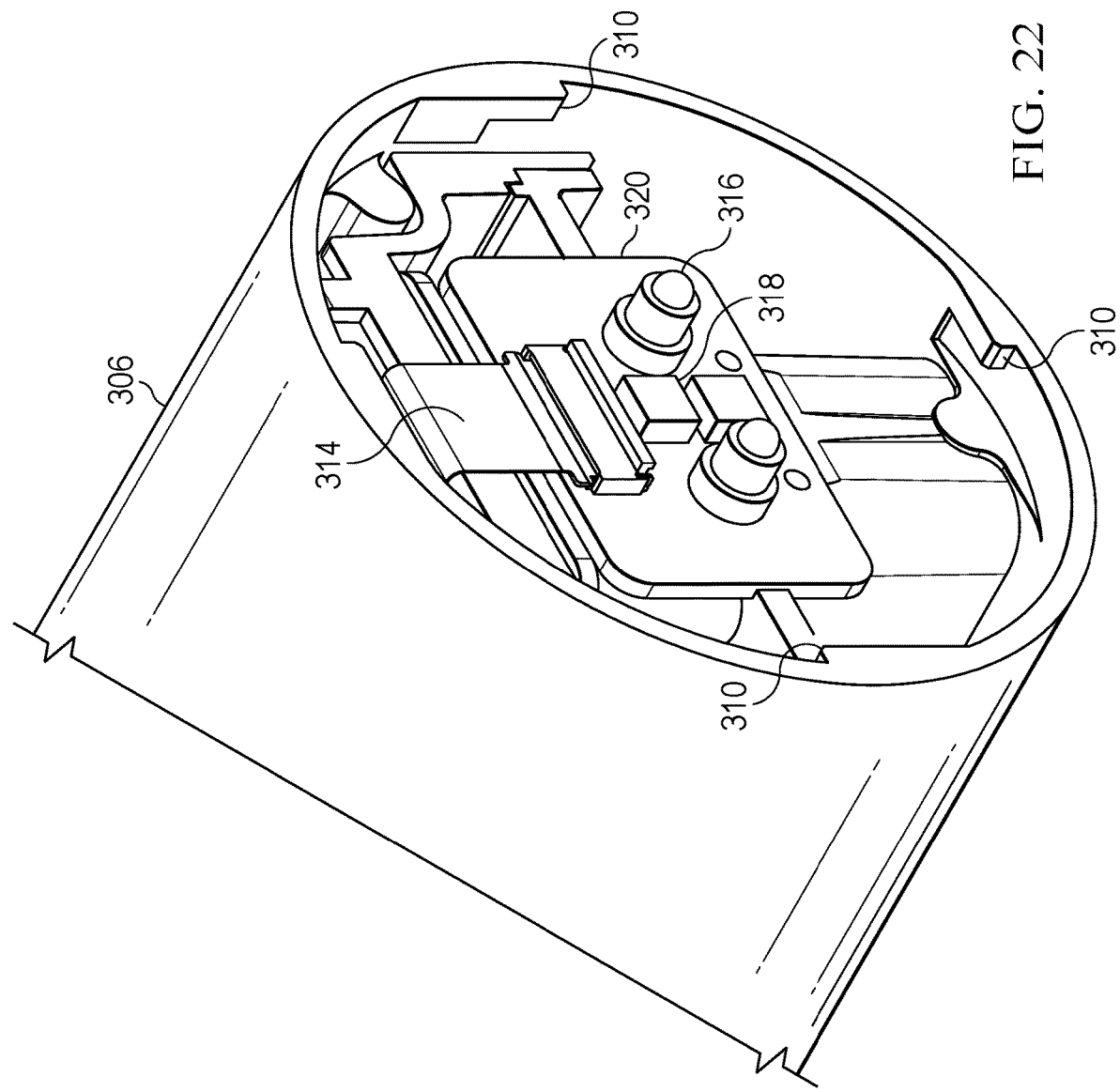
FIGS. 22 and 22A through 22C depicts an example of assembly and disassembly of a rear housing portion having camera processing resource and communications.

Referring now to FIGS. 22 and 22A through 22C, an example camera depicts assembly and disassembly of a rear housing portion having camera processing resource and communications. FIG. 22 depicts a front perspective view of rear housing portion 306 to illustrate components exposed to the front housing portion when assembled. Lip 310 is exposed to accept hooks from the front housing portion with a rotation of the housing portions relative to each other to couple the housing portions together. A flexible cable 314 interfaces with processing and power resources within rear housing portion 306 and a front printed circuit board 320 that supports a contactless connector 318 and power pogo pins 316. When rear housing portion 306 rotationally couples to a front housing portion, the position of lips 310 aligns contactless connector 318 with a contactless connector of the image sensor in the front housing portion, such as to provide a range suitable for 60 GHz communication as described above. Similarly, rotation to the locked position aligns pogo pins 316 with contact pads of the front housing portion to provide a power and ground interface. Although pogo pins provide a good example of a biasing device to establish a power interface, in alternative embodiments, other types of spring biased contact devices may be used. In the example embodiment, the spring biased power contacts and the contactless connectors simplify the assembly and disassembly process.

Figure 22A:
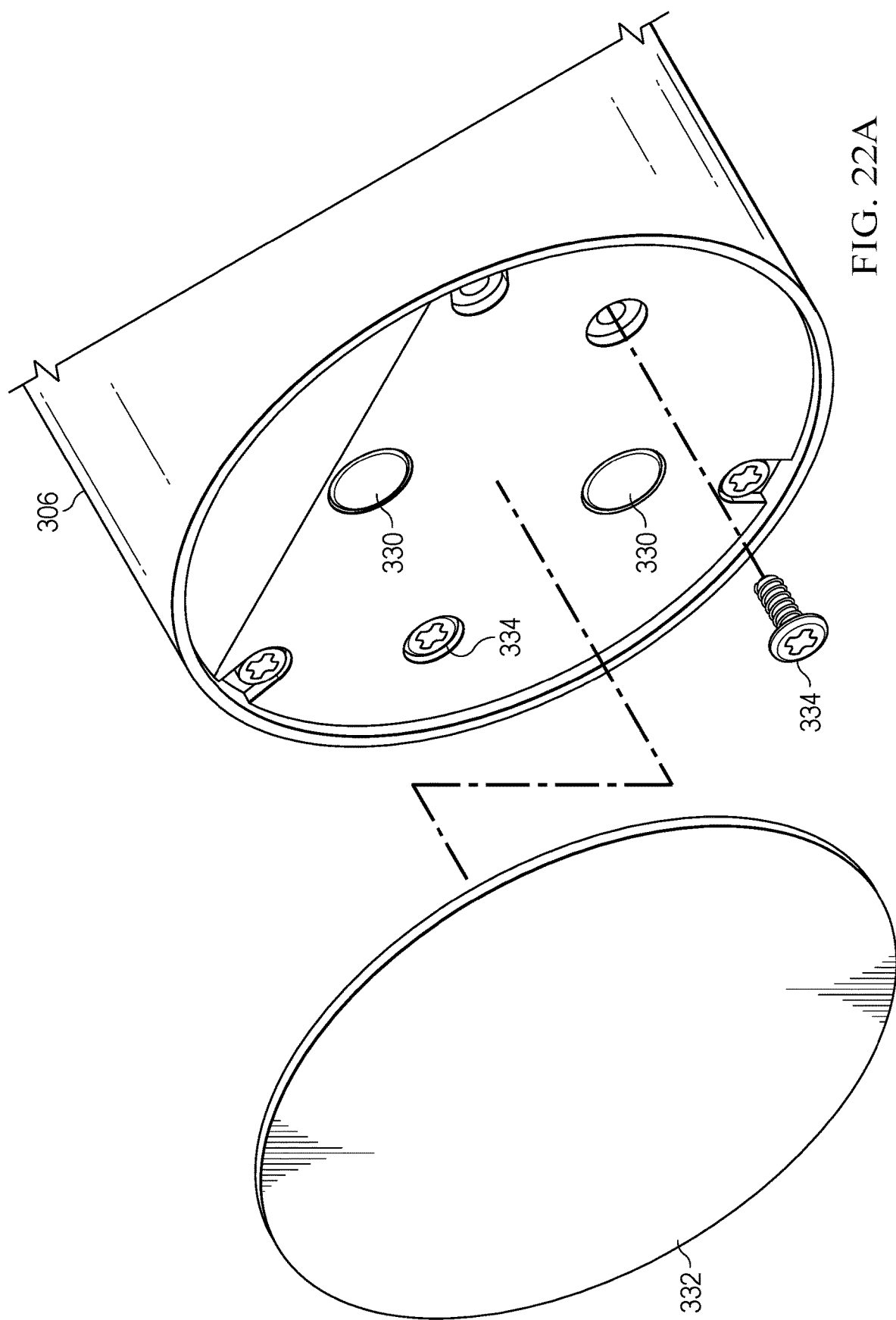
Figure 22B:
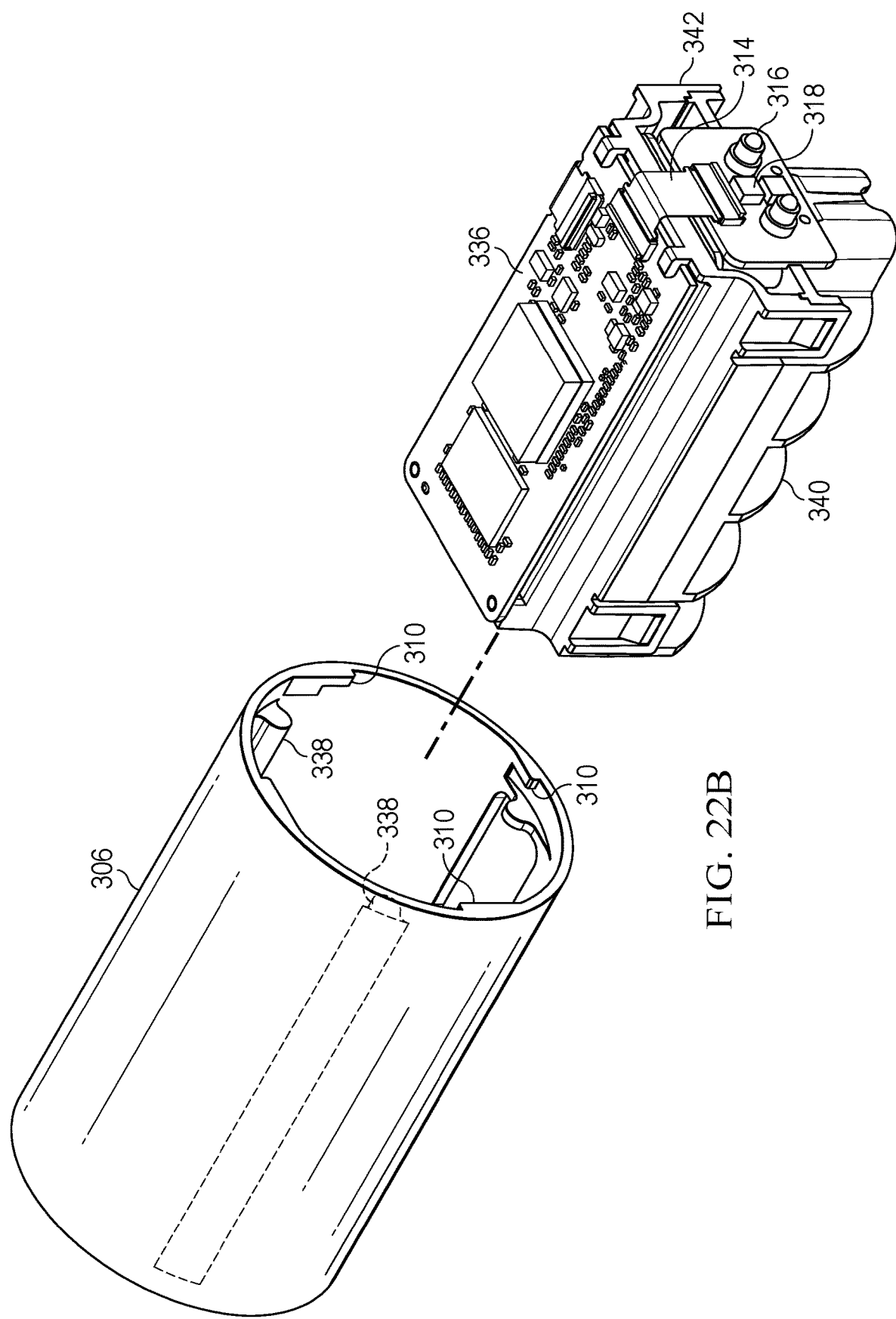
Figure 22C:
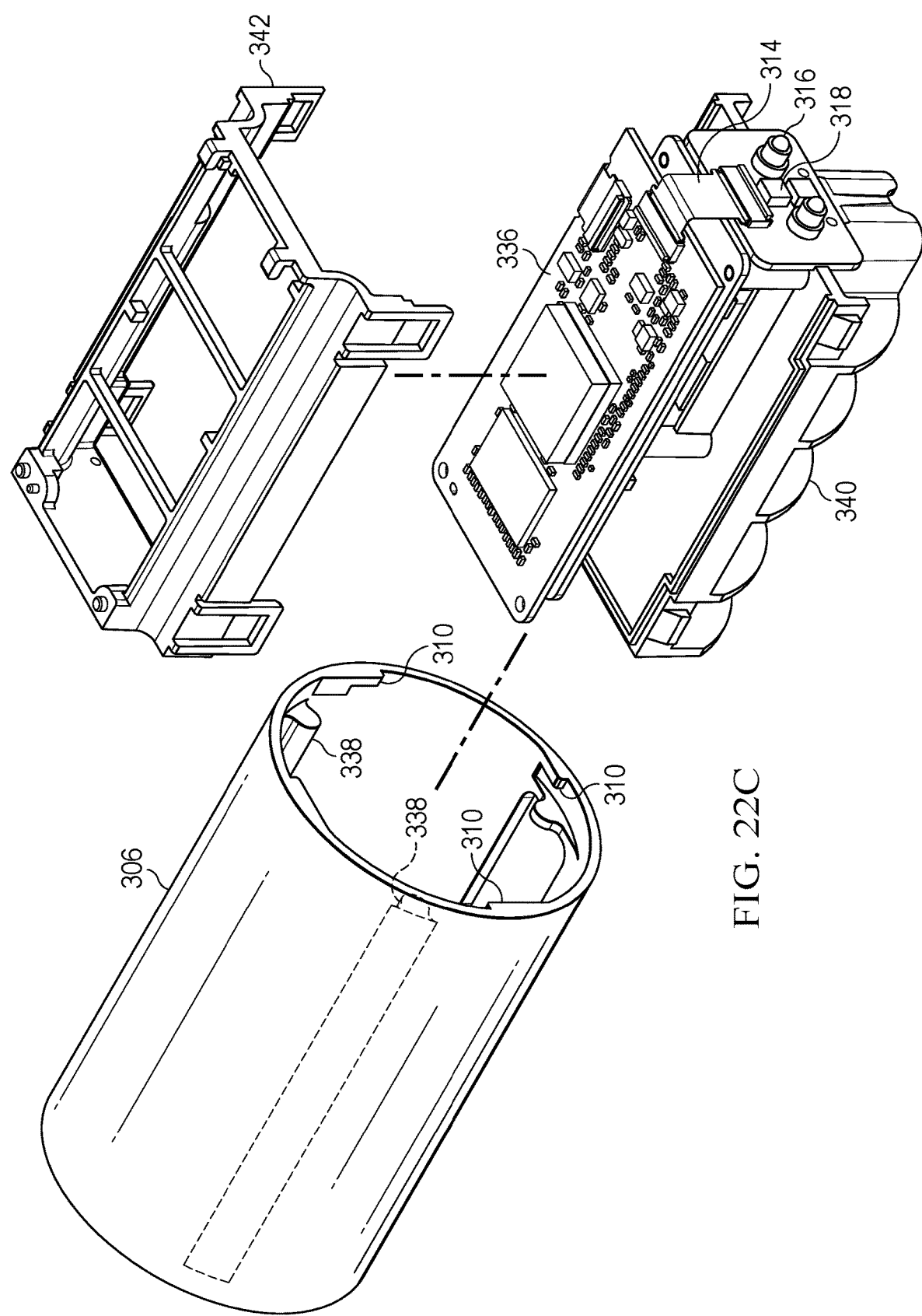

FIGS. 22A through 22C depict an example of disassembly of components from within the rear housing portion, such as for performing repair, reuse and recycling. FIG. 22A depicts that a steel plate 332 couples to the rear side of rear housing 306 with magnets 330 and is removed by a prying interaction to expose two screws 334. FIG. 22B illustrates that, once the screws are removed, a subassembly built with a top frame 342 and a bottom frame 340 slides out of rear housing 306 to expose an upper printed circuit board 336 held in place by snaps formed in top frame 342. Guides 338 extending from the inner circumference of rear housing 306 interact with the upper frame to provide the desired insertion orientation. FIG. 22C depicts a separation to top frame 342 from bottom frame 340 that exposes an inner printed circuit board 336. Printed circuit boards 336 supported power, communication and processing resource operations for components in both of the front and rear housing portions and can include the bio-based substrate as described above. The modular construction of the components within rear housing portion 306 aids in repair, reuse and recycling of individual components through ready access of the components within the housing interior. Flexible cable 314, pogo pins 316 and contactless connectors 318 enable ready breakdown and reassembly of the camera based upon a functional division between support components in the rear housing portion and visual image components in the front housing portion. In the example embodiment, a pair of screws 334 are used to hold the subassembly of top frame 342 and bottom frame 340 in place within rear housing 306; however, in alternative embodiments the subassembly may be coupled in place with alternative devices, such as clips that couple to the subassembly and features of the rear housing portion through the front opening.

Figure 23:
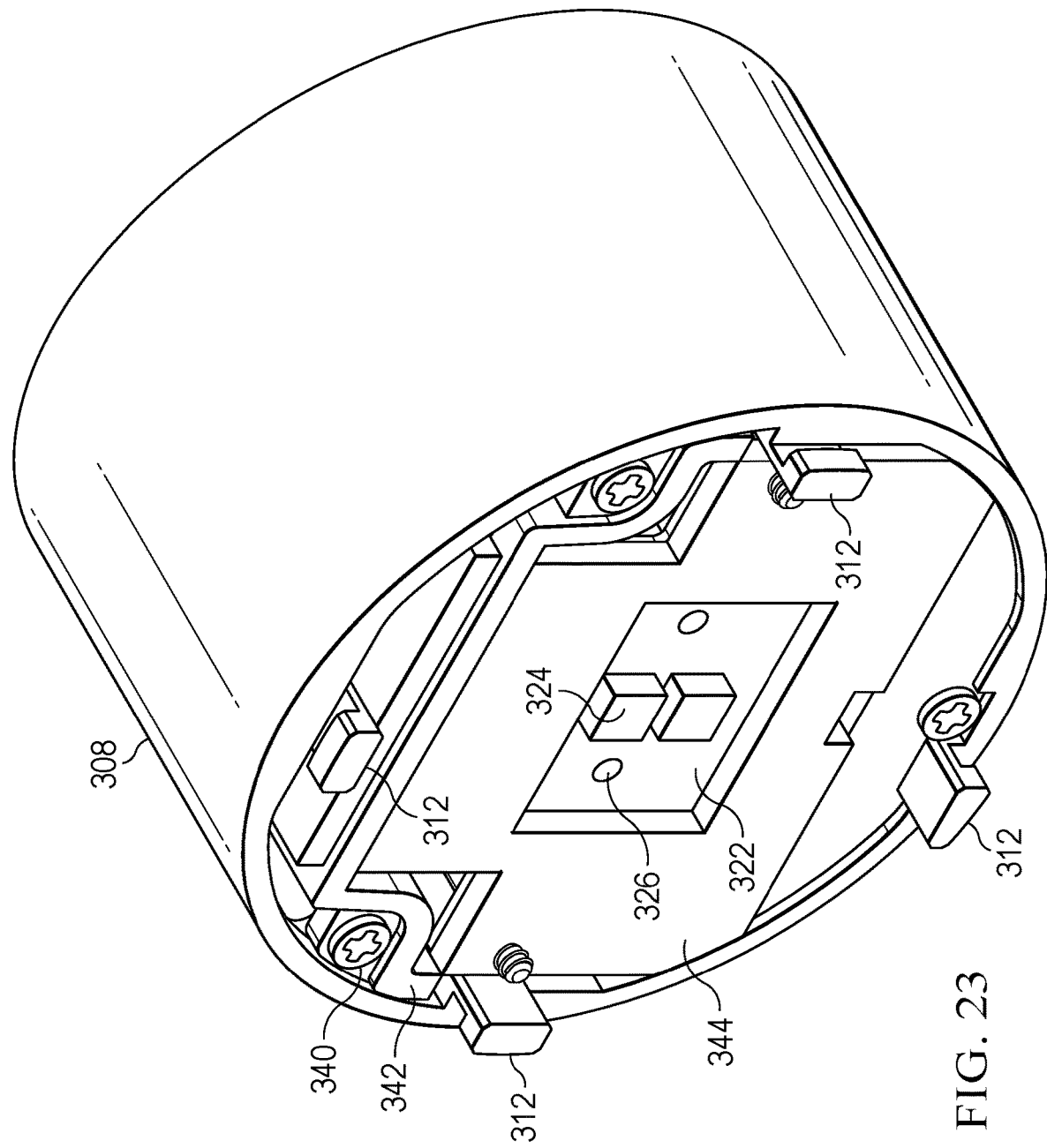
Figure 23B:
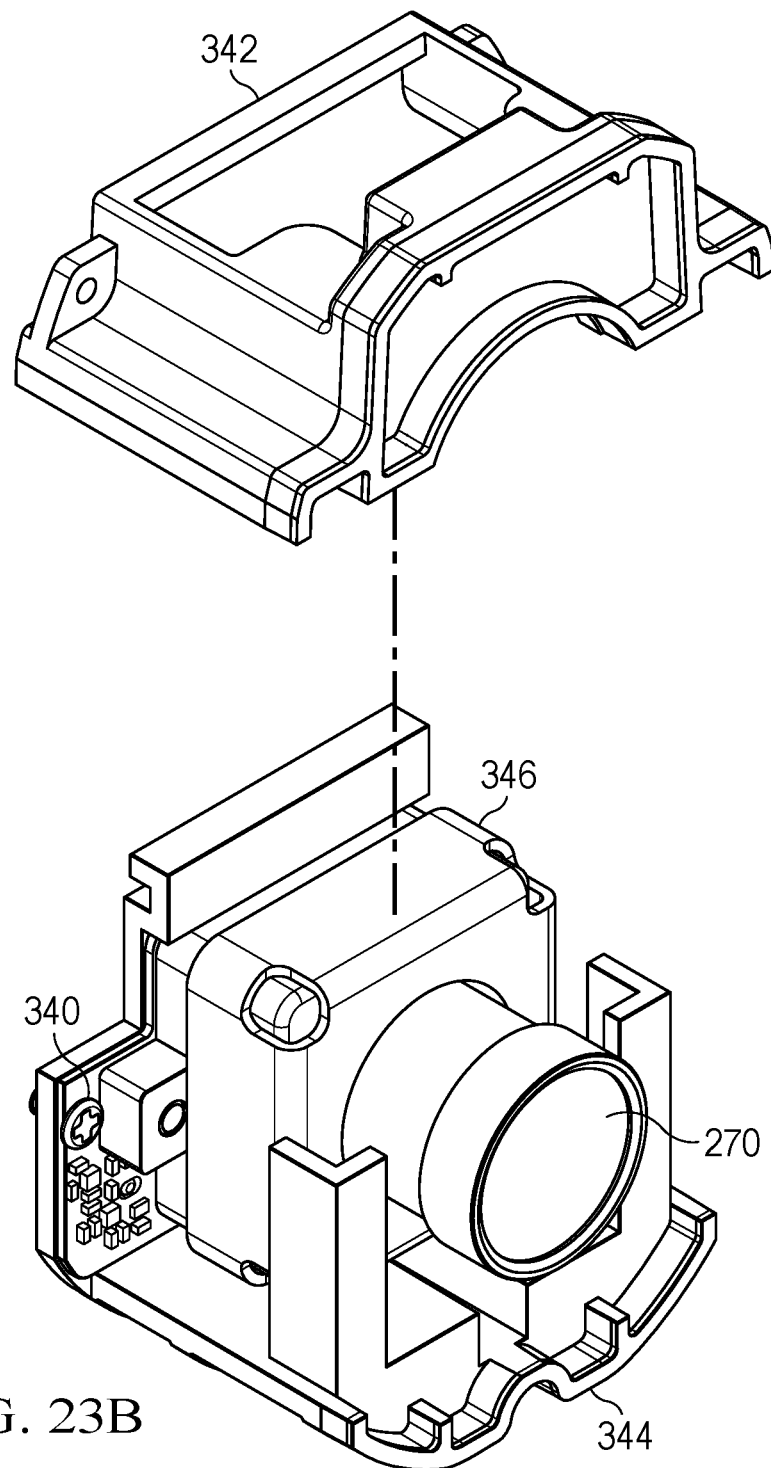

Referring now to FIGS. 23 and 23A through 23B, an example camera depicts assembly and disassembly of a front housing portion having camera visual image sensor resources. FIG. 23 depicts a rear perspective view of front housing portion 308 with hooks 312 that extend out to couple to lips of the rear housing portion. Three screws 340 couple a subassembly to an interior of front housing portion 308. A printed circuit board 322 at the rear side of front housing portion 308 holds a contactless connector 324 that communicates visual image information to the contactless connector of the rear housing portion and a set of power contact pads 326 that align with the pogo pins of the rear housing portion. When hooks 312 couple front housing portion 308 to the rear housing portion by a rotational coupling, the pogo pins interface with power contact pads 326 to provide a ground and power interface with the printed circuit board 344 of the rear housing portion. As with the rear housing portion, front housing portion 308 may use alternative fastening strategies in the place of screws 340, such as clips that couple to features of front housing portion 308.

FIG. 23A depicts removal of a subassembly from the interior of front housing portion 308 that includes support for a visual image sensor that captures visual images for communication through contactless connectors 324 to the rear housing portion. Once the subassembly is released from front housing portion 308 by removal of the screws, the subassembly slides out of the rear opening of the front housing portion. FIG. 23B depicts a separation of the top frame 342 from the bottom frame to release the visual image sensor 346, which in the example embodiment includes an image sensor board and lens assembly. The breakdown of the camera into the front and rear housing portions provides improved repair, reuse and recycling of internal components with less waste at end of life. Further, construction of components in discrete or modular fashion to share recyclable materials, such as extruded aluminum and injection molded plastics, helps to simplify the process of breaking down products at end of life to direct recyclable portions to appropriate locations in a cost effective manner.

Although the present invention has been described in detail, it should be understood that various changes, substitutions and alterations can be made hereto without departing from the spirit and scope of the invention as defined by the appended claims.

What is claimed is:

1. A method for assembly of an information handling system, the method comprising:
    extruding an aluminum main housing having an upper surface, a lower surface, a front opening and a rear opening;
    coupling a motherboard having a processor and memory to a main housing tray;
    inserting the main housing tray into the aluminum main housing;
    coupling a front cover over the aluminum main housing front opening;
    coupling a rear cover over the aluminum main housing rear opening;
    extruding an aluminum lid housing having an outer surface, an open inner face, a top opening and a bottom opening;
    inserting a display panel into the aluminum lid housing aligned to present visual images at the open inner face;
    coupling a top cover to the aluminum lid housing top opening to capture the display panel visible at the open inner face; and
    coupling the lid housing to the main housing.

2. The method of claim 1 further comprising:
cutting key openings in the aluminum housing upper surface; and
inserting a keyboard into the aluminum main housing, the keyboard having keys exposed through the key openings, the keyboard supported at a bottom side by the main housing tray, the motherboard coupled to a bottom side of the main housing tray.

3. The method of claim 1 further comprising:
inserting a hinge into the aluminum main housing to align an opening of the hinge with an opening of the aluminum main housing;
inserting first and second elements of a coupling device in the openings of the hinge and aluminum main housing to engage under a lip of the aluminum main housing; and
inserting a third element of the coupling device between the first and second elements to maintain the first and second elements under the lip.

4. The method of claim 3 wherein:
the first and second elements comprise magnets having like poles aligned to repel each other apart; and
the third element comprises a magnet that inserts to have opposing poles aligned with the first and second element poles.

5. The method of claim 1 further comprising:
disposing a magnet in the aluminum main housing interior;
forming the main housing tray with ferromagnetic material to have a recess when aligned with the magnet; and
inserting the main housing tray to align the recess and the magnet.

6. The method of claim 5 further comprising inserting a coupling device through the aluminum main housing and the main housing tray to maintain the main housing tray in position relative to the aluminum main housing.

7. A method for manufacture of an information handling system comprising:
extruding aluminum to form an elongated tube having a front opening, a rear opening and an upper surface;
cutting key openings in the upper surface;
coupling a keyboard module to a tray having at least a ferromagnetic material and a recess, the keyboard module having keys;
disposing a magnet in the aluminum tube; and
inserting the tray into the elongated tube interior to align the keyboard module keys with the key openings when the recess and magnet align.

8. The method of claim 7 further comprising:
inserting a coupling device through an opening of the elongated tube and an opening of the tray and an opening of a hinge; and
engaging the coupling device under a lip of the elongated tube to couple the tray and hinge in position within the elongated tube.

9. The method of claim 8 further comprising:
cutting a touchpad opening in the housing upper surface; and
coupling a touchpad to the tray upper surface to align with the touchpad opening when the coupling device inserts through the elongated tube and tray.

10. The method of claim 9 further comprising:
extruding aluminum to form a lid housing portion; and
coupling the lid housing portion to the hinge to rotate relative to the elongated tube.

11. A method for assembly of an information handling system, the method comprising:
extruding an aluminum main housing having an upper surface, a lower surface, a front opening and a rear opening;
disposing a magnet in the aluminum main housing interior;
forming a main housing tray with ferromagnetic material to have a recess when aligned with the magnet;
coupling a motherboard having a processor and memory to the main housing tray;
inserting the main housing tray into the aluminum main housing to align the recess and the magnet;
coupling a front cover over the aluminum main housing front opening; and
coupling a rear cover over the aluminum main housing rear opening.

12. The method of claim 11 further comprising inserting a coupling device through the aluminum main housing and the main housing tray to maintain the main housing tray in position relative to the aluminum main housing.

13. The method of claim 11 further comprising:
cutting key openings in the aluminum housing upper surface; and
inserting a keyboard into the aluminum main housing, the keyboard having keys exposed through the key openings, the keyboard supported at a bottom side by the main housing tray, the motherboard coupled to a bottom side of the main housing tray.

* * * * *